(12) United States Patent
Kim

(10) Patent No.: US 9,711,734 B2
(45) Date of Patent: Jul. 18, 2017

(54) ORGANIC LIGHT-EMITTING DEVICE

(71) Applicant: SAMSUNG DISPLAY CO., LTD., Yongin, Gyeonggi-Do (KR)

(72) Inventor: Minkyung Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 264 days.

(21) Appl. No.: 14/694,789

(22) Filed: Apr. 23, 2015

(65) Prior Publication Data
US 2016/0133852 A1 May 12, 2016

(30) Foreign Application Priority Data

Nov. 7, 2014 (KR) .......................... 10-2014-0154730

(51) Int. Cl.
H01L 51/54 (2006.01)
H01L 51/00 (2006.01)
H01L 51/50 (2006.01)

(52) U.S. Cl.
CPC ...... H01L 51/0072 (2013.01); H01L 51/0058 (2013.01); H01L 51/0071 (2013.01);
(Continued)

(58) Field of Classification Search
CPC ............. H01L 51/0071; H01L 51/0077; H01L 51/0058; H01L 51/0069
See application file for complete search history.

(56) References Cited

U.S. PATENT DOCUMENTS

| 2008/0124572 A1 | 5/2008 | Mizuki et al. |
| 2012/0138912 A1 | 6/2012 | Inoue et al. |
| 2012/0223295 A1 | 9/2012 | Inoue et al. |

FOREIGN PATENT DOCUMENTS

| JP | 2014-40423 A | 3/2014 |
| KR | 10-2011-0076376 A | 7/2011 |

(Continued)

OTHER PUBLICATIONS

Machine translation of description of KR 10-2014-0023589 A.*
Machine translation of description of KR 10-2011-0076376 A.*

*Primary Examiner* — Vu A Nguyen
(74) *Attorney, Agent, or Firm* — Lee & Morse, P.C.

(57) ABSTRACT

An organic light-emitting device including a first electrode; a second electrode facing the first electrode; and an organic layer between the first electrode and the second electrode, the organic layer including an emission layer, wherein the organic layer includes a first compound represented by Formula 1, below, and a second compound represented by Formula 2, below, <Formula 1>

(Continued)

-continued

<Formula 2>

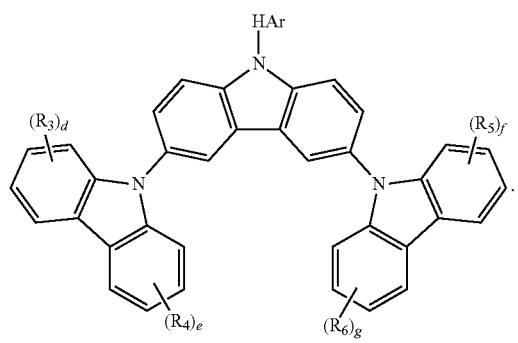

(52) U.S. Cl.
CPC ...... *H01L 51/0085* (2013.01); *H01L 51/5016* (2013.01); *H01L 51/5028* (2013.01); *H01L 2251/5384* (2013.01)

(56) References Cited

FOREIGN PATENT DOCUMENTS

KR  10-2012-0135325 A  12/2012
KR  10-2014-0000259 A  1/2014
KR  10-2014-0023589 A  2/2014

20 Claims, 1 Drawing Sheet

\* cited by examiner

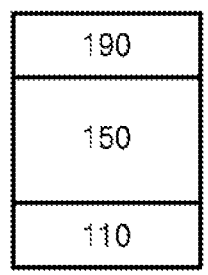

ORGANIC LIGHT-EMITTING DEVICE

CROSS-REFERENCE TO RELATED APPLICATION

Korean Patent Application No. 10-2014-0154730, filed on Nov. 7, 2014, in the Korean Intellectual Property Office, and entitled: "Organic Light-Emitting Device," is incorporated by reference herein in its entirety.

BACKGROUND

1. Field

Embodiments relate to an organic light-emitting device.

2. Description of the Related Art

Organic light-emitting devices are self-emission devices that have wide viewing angles, high contrast ratios, short response times, and excellent luminance, driving voltage, and response speed characteristics, and produce multicolored images.

The organic light-emitting devices may include an anode, a hole transport region, an emission layer, an electron transport region, and a cathode, which are sequentially stacked. Holes provided from the anode may move toward the emission layer through the hole transport region, and electrons provided from the cathode may move toward the emission layer through the electron transport region. Carriers, such as the holes and the electrons, may be recombined in the emission layer to produce excitons. These excitons may change from an excited state to a ground state, thereby generating light.

SUMMARY

Embodiments are directed to an organic light-emitting device.

The embodiments may be realized by providing an organic light-emitting device including a first electrode; a second electrode facing the first electrode; and an organic layer between the first electrode and the second electrode, the organic layer including an emission layer, wherein the organic layer includes a first compound represented by Formula 1, below, and a second compound represented by Formula 2, below, <Formula 1>

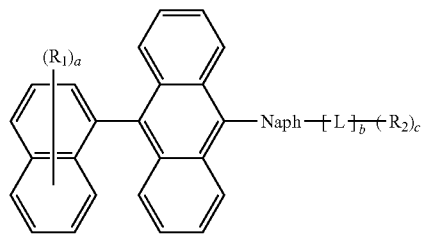

<Formula 2>

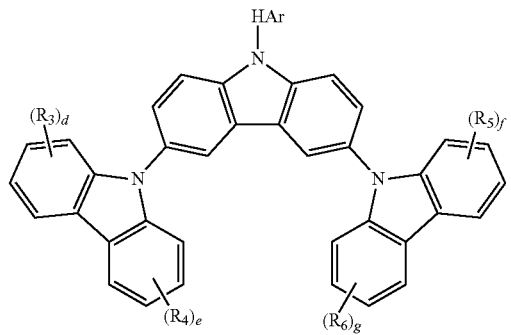

wherein, in Formulae 1 and 2, Naph is a naphthylene group, L is a $C_6$-$C_{40}$ arylene group or a $C_1$-$C_{40}$ heteroarylene group, HAr is a group represented by one of Formulae 3 and 4 below, <Formula 3>

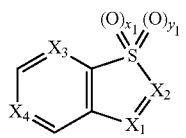

<Formula 4>

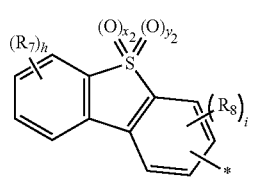

wherein, $X_1$ and $X_2$ are each independently N or C—*, and at least one of $X_1$ and $X_2$ is C—*, $X_3$ and $X_4$ are each independently N or CH, $x_1$ and $y_1$ are each independently 0 or 1, $x_2$ and $y_2$ are each independently 0 or 1, $R_1$ to $R_8$ are each independently selected from a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{40}$ aryl group, a substituted or unsubstituted $C_1$-$C_{40}$ heteroaryl group, a substituted or unsubstituted $C_5$-$C_{40}$ aryloxy group, a substituted or unsubstituted $C_5$-$C_{40}$ arylthio group, a substituted or unsubstituted $C_6$-$C_{40}$ monovalent non-aromatic condensed polycyclic group, a substituted or unsubstituted $C_6$-$C_{40}$ monovalent non-aromatic heterocondensed polycyclic group, —N($Q_1$)($Q_2$), —P(=O)($Q_3$)($Q_4$), —Si($Q_5$)($Q_6$)($Q_7$), and —Ge($Q_5$)($Q_6$)($Q_7$), in which $Q_1$ to $Q_4$ are each independently a hydrogen atom or a $C_6$-$C_{40}$ aryl group, and $Q_5$, $Q_6$, and $Q_7$ are each independently a hydrogen atom, a $C_1$-$C_{20}$ alkyl group, or a $C_6$-$C_{40}$ aryl group; at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{40}$ aryl group, the substituted $C_1$-$C_{40}$ heteroaryl group, the substituted $C_5$-$C_{40}$ aryloxy group, the substituted $C_5$-$C_{40}$ arylthio group, the substituted $C_6$-$C_{40}$ monovalent non-aromatic condensed polycyclic group, and the substituted $C_6$-$C_{40}$ monovalent non-aromatic heterocondensed polycyclic group is selected from a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{40}$ aryl group, a $C_1$-$C_{40}$ heteroaryl group, a $C_5$-$C_{40}$ aryloxy group, a $C_5$-$C_{40}$ arylthio group, a monovalent $C_6$-$C_{40}$ non-aromatic condensed polycyclic group, a monovalent $C_6$-$C_{40}$ non-aromatic heterocondensed polycyclic group, and —Si($Q_{11}$)($Q_{12}$)($Q_{13}$), in which $Q_{11}$ to $Q_{13}$ are each independently a hydrogen atom, a $C_1$-$C_{20}$ alkyl group, or a $C_6$-$C_{40}$ aryl group, a is an integer of 0 to 7, b is an integer of 0 to 2, c is an integer of 1 to 3, d to h are each independently an integer of 0 to 4, i is an integer of 0 to 3, and * represents a binding site to a neighboring atom.

L in Formula 1 may be selected from a phenylene group, a naphthylene group, a phenanthrenylene group, and an anthrylene group; and a phenylene group, a naphthyl group, a phenanthrenyl group, and an anthryl group, each substituted with at least one of a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, $C_1$-$C_{10}$ alkoxy group, a phenyl group, a naphthyl group, a phenanthrenyl group, an anthryl group, and —Si($Q_{21}$)($Q_{22}$)($Q_{23}$), in which $Q_{21}$ to $Q_{23}$ are each independently a hydrogen atom, a $C_1$-$C_{20}$ alkyl group, or a $C_6$-$C_{40}$ aryl group.

L in Formula 1 may be a group represented by Formula 4A below:

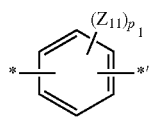

4A wherein, in Formula 4A, * and *' may represent binding sites to neighboring atoms, $p_1$ may be an integer of 0 to 4, and $Z_{11}$ may be at least one selected from a deuterium atom, a halogen atom, a methyl group, an ethyl group, a propyl group, a phenyl group, a naphthyl group, a phenanthrenyl group, an anthryl group, and —Si($Q_{21}$)($Q_{22}$)($Q_{23}$), in which $Q_{21}$ to $Q_{23}$ are each independently a hydrogen atom, a $C_1$-$C_{20}$ alkyl group, or a $C_6$-$C_{40}$ aryl group; and a methyl group, an ethyl group, a propyl group, a phenyl group, a naphthyl group, a phenanthrenyl group, an anthryl group, and —Si($Q_{21}$)($Q_{22}$)($Q_{23}$), each substituted with at least one of a deuterium atom and a halogen atom.

L in Formula 1 may be a group represented by any one of Formulae 5A to 5E below, in which * and *' represent binding sites to neighboring atoms:

5A

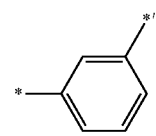

5B

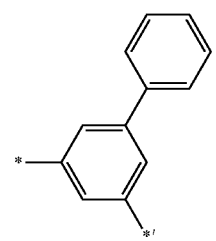

5C

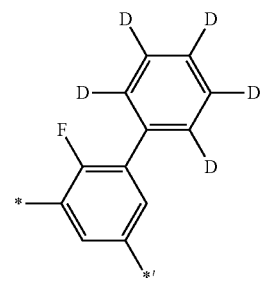

5D

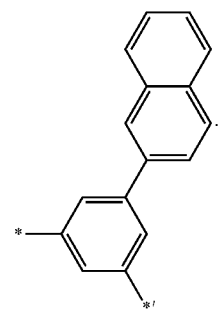

5E

HAr in Formula 2 may be a group represented by any one of Formulae 6A to 6E below:

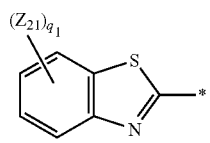

6A

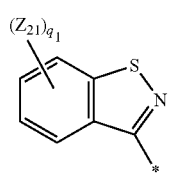

6B

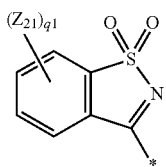

6C

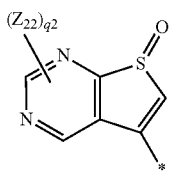

6D

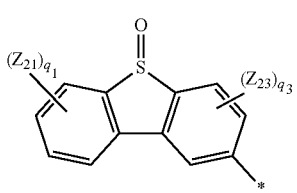

6E wherein, in Formulae 6A to 6E, $Z_{21}$ to $Z_{23}$ may each independently be selected from a deuterium atom, a halogen atom, a $C_1$-$C_4$ alkyl group, a $C_6$-$C_{20}$ aryl group, a $C_1$-$C_{20}$ heteroaryl group, and —Si($Q_{31}$)($Q_{32}$)($Q_{33}$), in which $Q_{31}$ to $Q_{33}$ are each independently a hydrogen atom, a $C_1$-$C_{20}$ alkyl group, or a $C_6$-$C_{20}$ aryl group, q1 may be an integer of 0 to 4, q2 may be an integer of 1 or 2, q3 may be an integer of 0 to 3, and * represents a binding site to a neighboring atom.

HAr in Formula 2 may be a group represented by any one of Formulae 7A to 7E below, in which * represents a binding site to a neighboring atom:

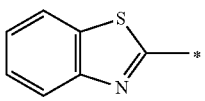

7A

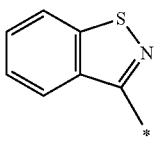

7B

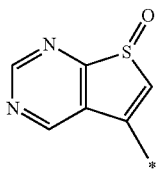

7C

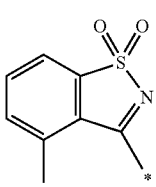

7D

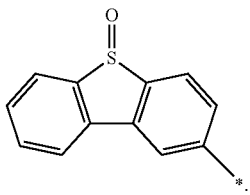

7E $R_1$ to $R_8$ may each independently be selected from a deuterium atom, a halogen atom, a hydroxyl group, a cyano group, a carboxylic acid or a salt thereof, a sulfonic acid or a salt thereof, a phosphoric acid or a salt thereof, a methyl group, an ethyl group, a propyl group, a butyl group, a pentyl group, a hexyl group, a heptyl group, an octyl group, a nonyl group, a decyl group, a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, —N($Q_1$)($Q_2$), —P(=O)($Q_3$)($Q_4$), —Si($Q_5$)($Q_6$)($Q_7$), and —Ge($Q_5$)($Q_6$)($Q_7$), in which $Q_1$ to $Q_4$ are each independently a hydrogen atom or a $C_6$-$C_{40}$ aryl group, and $Q_5$, $Q_6$, and $Q_7$ are each independently a hydrogen atom, a $C_1$-$C_{20}$ alkyl group, or a $C_6$-$C_{40}$ aryl group; a methyl group, an ethyl group, a propyl group, a butyl group, a pentyl group, a hexyl group, a heptyl group, an octyl group, a nonyl group, and a decyl group, each substituted with at least one of a deuterium atom, a halogen atom, a hydroxyl group, a cyano group, a carboxylic acid or a salt thereof, a sulfonic acid or a salt thereof, a phosphoric acid or a salt thereof, —Si($Q_{11}$)($Q_{12}$)($Q_{13}$), and —Ge($Q_{11}$)($Q_{12}$)($Q_{13}$), in which $Q_{11}$ to $Q_{13}$ are each independently a hydrogen atom, a $C_1$-$C_{20}$ alkyl group, or a $C_6$-$C_{40}$ aryl group; and a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, and a hexacenyl group, each substituted with at least one of a deuterium atom, a halogen atom, a hydroxyl group, a cyano group, a carboxylic acid or a salt thereof, a sulfonic acid or a salt thereof, a phosphoric acid or a salt thereof, a $C_1$-$C_{10}$ alkyl group, a $C_2$-$C_{10}$ alkenyl group, a $C_2$-$C_{10}$ alkynyl group, a $C_1$-$C_{10}$ alkoxy group, —Si($Q_{11}$)($Q_{12}$)($Q_{13}$), and —Ge($Q_{11}$)($Q_{12}$)($Q_{13}$), in which $Q_{11}$ to $Q_{13}$ are each independently a hydrogen atom, a $C_1$-$C_{10}$ alkyl group, or a $C_6$-$C_{20}$ aryl group.

$R_1$ to $R_8$ may each independently be selected from a deuterium atom, a halogen atom, —Si($Q_5$)($Q_6$)($Q_7$), and —Ge($Q_5$)($Q_6$)($Q_7$), in which $Q_1$ to $Q_7$ are each independently a hydrogen atom, a $C_1$-$C_4$ alkyl group, or a $C_6$-$C_{10}$ aryl group, or $R_1$ to $R_8$ may each independently be a group represented by any one of Formulae 8A to 8C below:

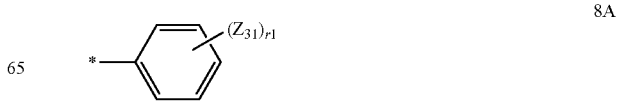

8A

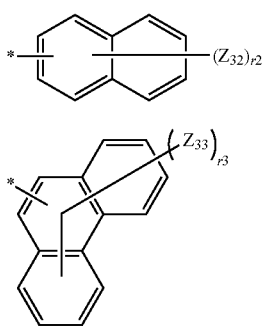

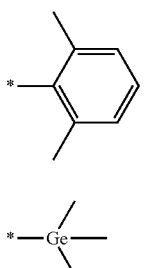

wherein, in Formulae 8A to 8C, $Z_{31}$ to $Z_{33}$ may each independently be selected from a deuterium atom, a halogen atom, a $C_1$-$C_{20}$ alkyl group, a $C_6$-$C_{40}$ aryl group, a $C_6$-$C_{40}$ monovalent non-aromatic condensed polycyclic group, —Si$(Q_5)(Q_6)(Q_7)$, and —Ge$(Q_5)(Q_6)(Q_7)$; a $C_1$-$C_{20}$ alkyl group substituted with at least one of a deuterium atom and a halogen atom; and a $C_6$-$C_{40}$ aryl group and a $C_6$-$C_{40}$ monovalent non-aromatic condensed polycyclic group, each substituted with at least one of a deuterium atom, a halogen atom, a $C_1$-$C_{20}$ alkyl group, and a $C_6$-$C_{20}$ aryl group; r1 may be an integer of 0 to 5, r2 may be an integer of 0 to 7, r3 may be an integer of 0 to 10, and * represents a binding site to a neighboring atom.

$R_1$ to $R_8$ may each independently be selected from a deuterium atom and a halogen atom, or $R_1$ to $R_8$ may each independently be a group represented by any one of Formulae 9A to 9J below:

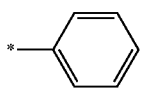

9A

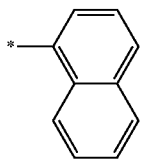

9B

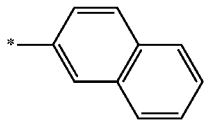

9C

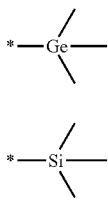

9D

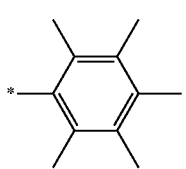

9E

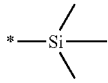

9F

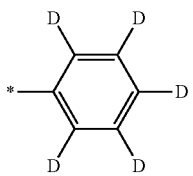

9G

9H

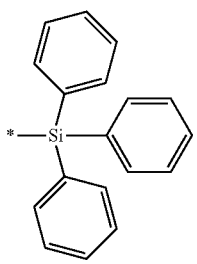

9I

9J wherein, in Formulae 9A to 9J, * represents a binding site to a neighboring atom.

c may be 1, a and b may each independently be 0 or 1, and d, e, f, g, h, and i may each be 0.

$R_1$ and $R_2$ may each independently be selected from a deuterium atom, a halogen atom, a methyl group, a phenyl group, a naphthyl group, a phenanthrenyl group, —Si$(Q_5)$$(Q_6)(Q_7)$, and —Ge$(Q_5)(Q_6)(Q_7)$, in which $Q_1$ to $Q_4$ are each independently a hydrogen atom, a methyl group, or a phenyl group; and a phenyl group, a naphthyl group, and a pentalenyl group, each substituted with at least one of a deuterium atom, a halogen atom, and a methyl group; d, e, f, g, h, and i may each be 0, L may be selected from a phenylene group; or a phenylene group and a naphthylene group, each substituted with at least one selected from a deuterium atom, a halogen atom, and a phenyl group.

HAr may be a group represented by Formula 3.

HAr may be a group represented by Formula 4, $x_2$ may be 1, and $y_1$ may be 0.

The first compound represented by Formula 1 may be one of Compounds 1-1 to 1-36 below:

1-1
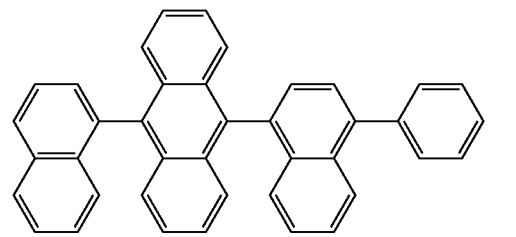
1-2
1-3
1-4
1-5
1-6
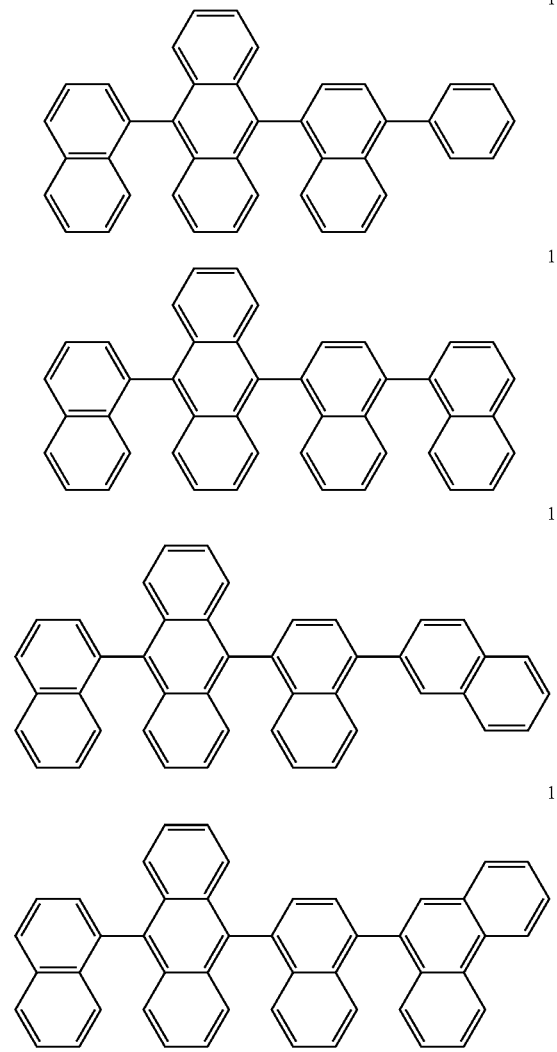
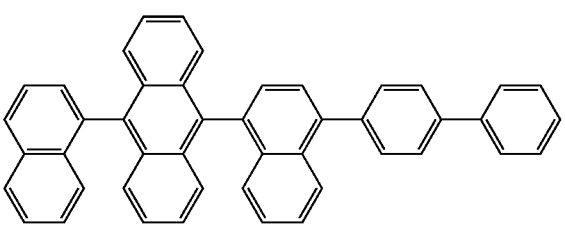
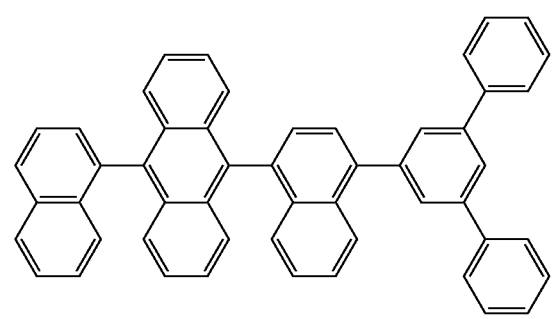
1-7
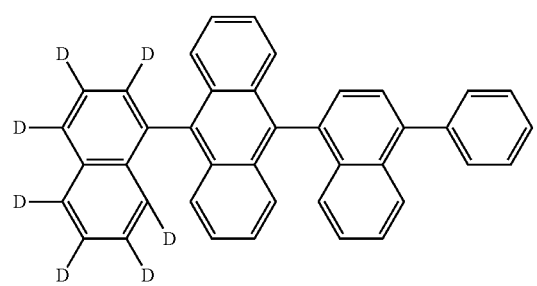
1-8
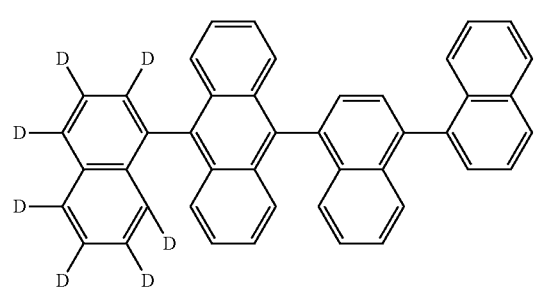
1-9
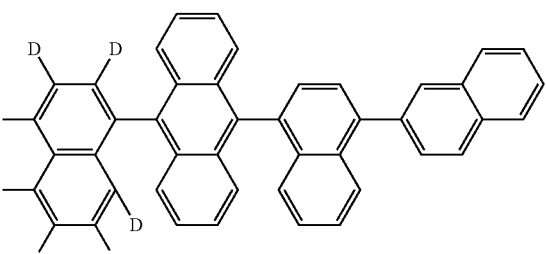
1-10
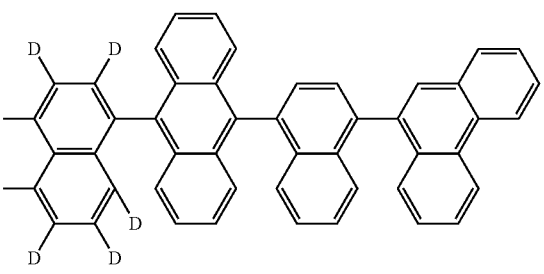
1-11
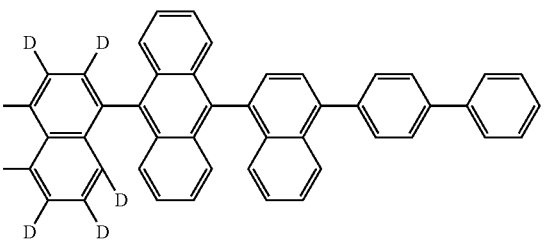

1-12
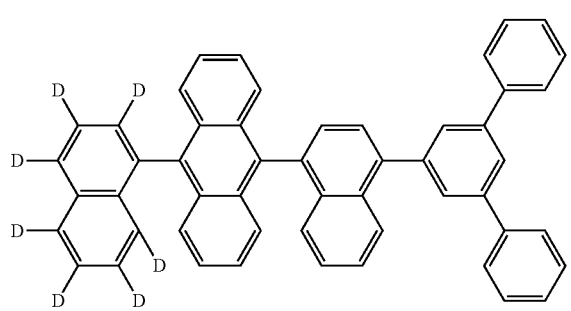
1-13
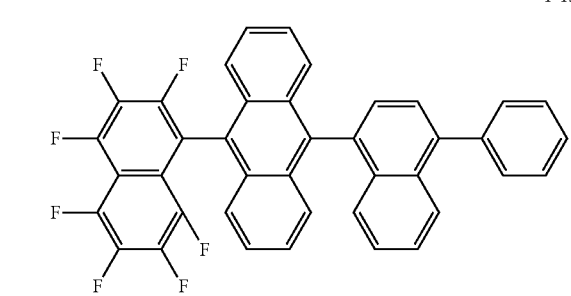
1-14
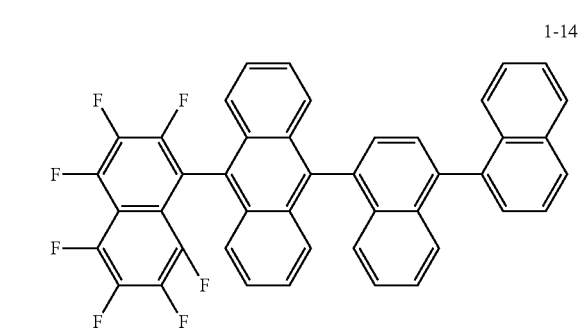
1-15
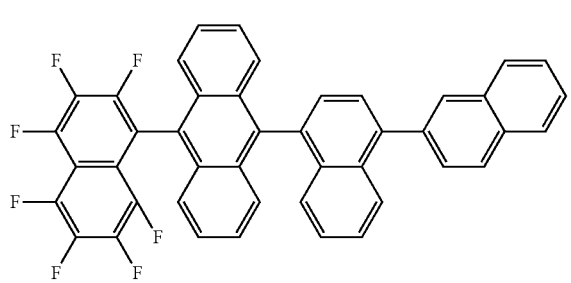
1-16
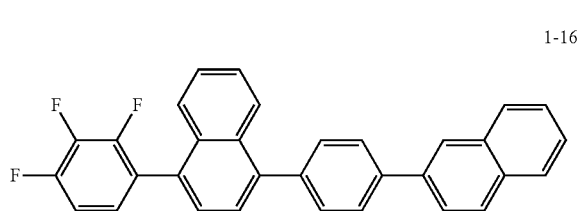
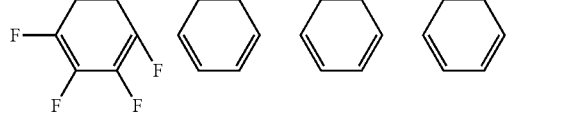
1-17
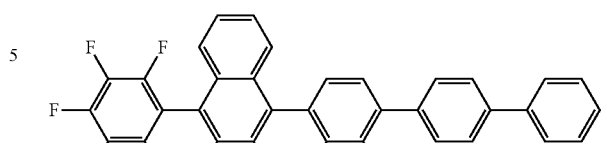
1-18
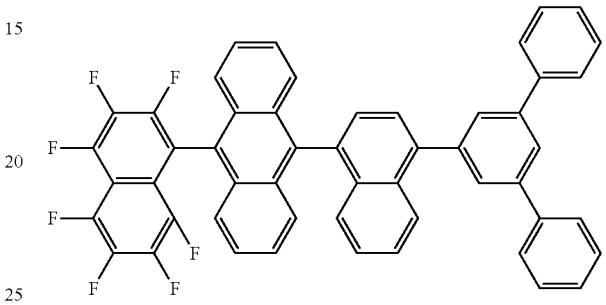
1-19
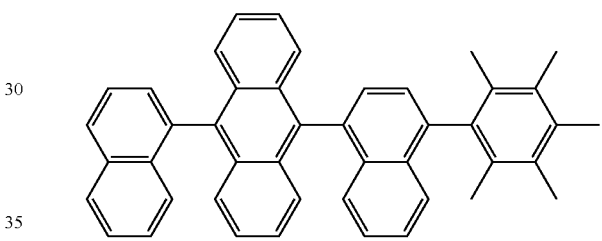
1-20
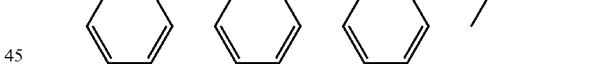
1-21
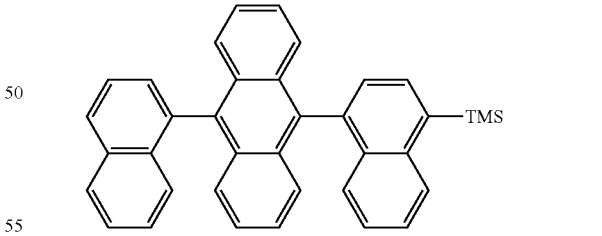
1-22
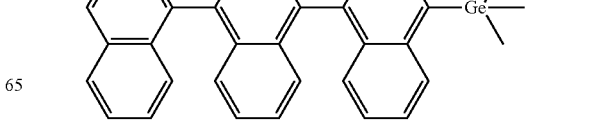

1-23
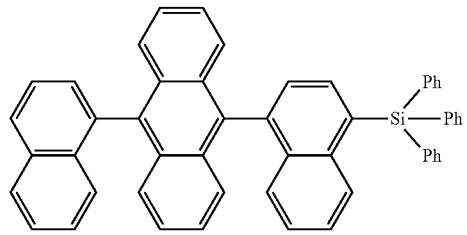
1-24
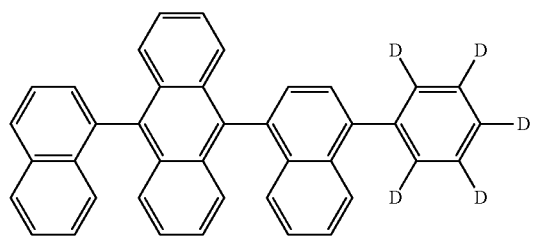
1-25
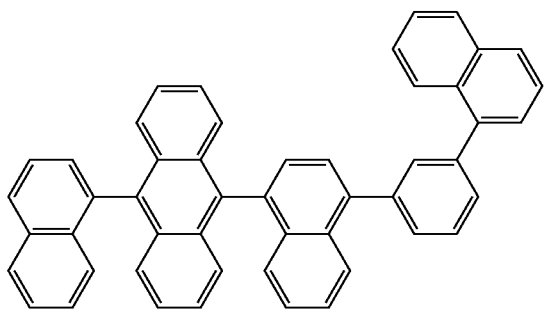
1-26
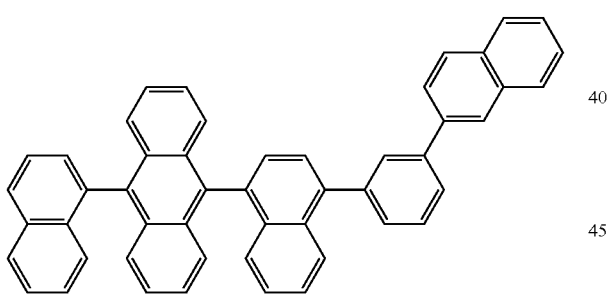
1-27
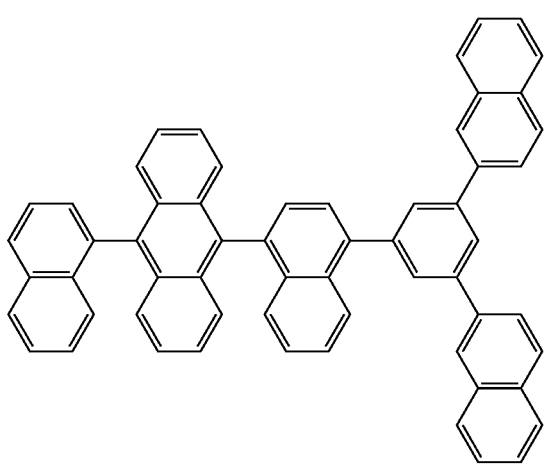
1-28
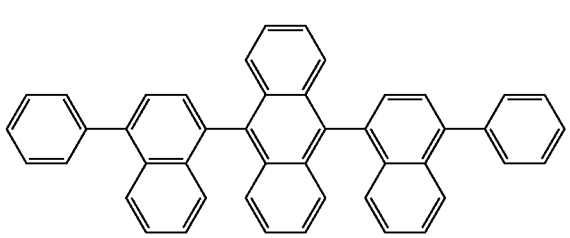
1-29
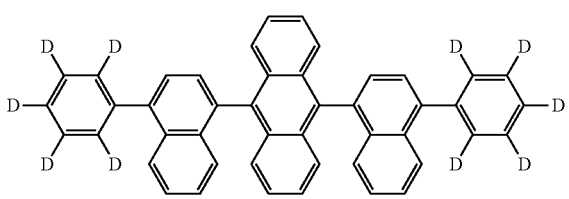
1-30
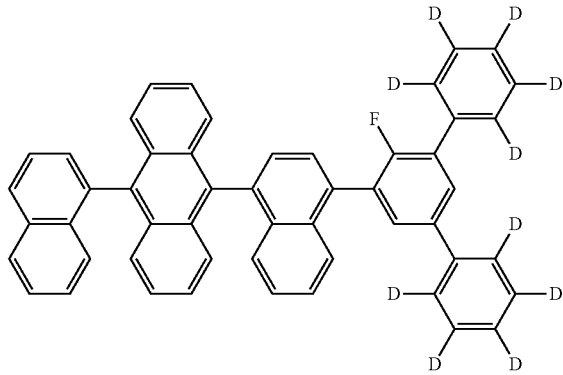
1-31
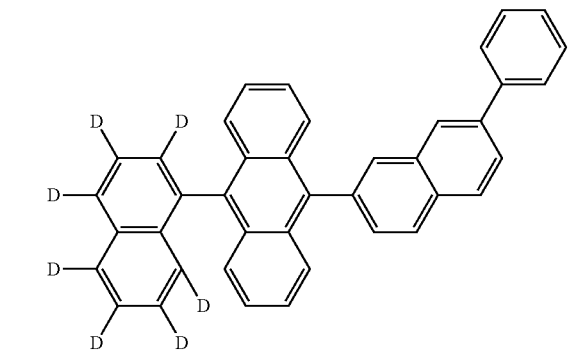
1-32
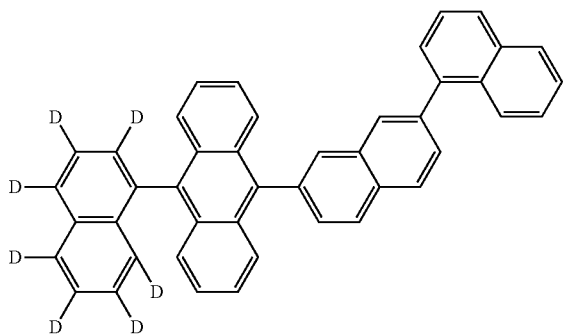

-continued
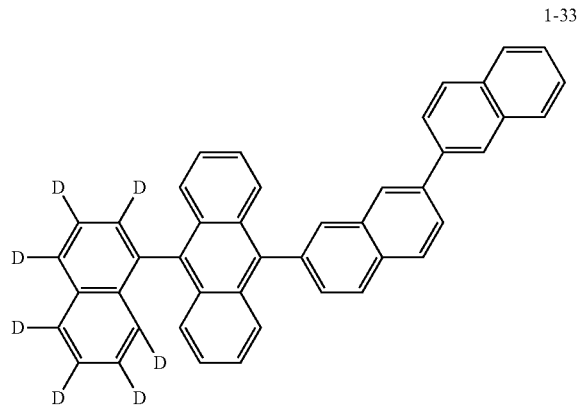
1-33
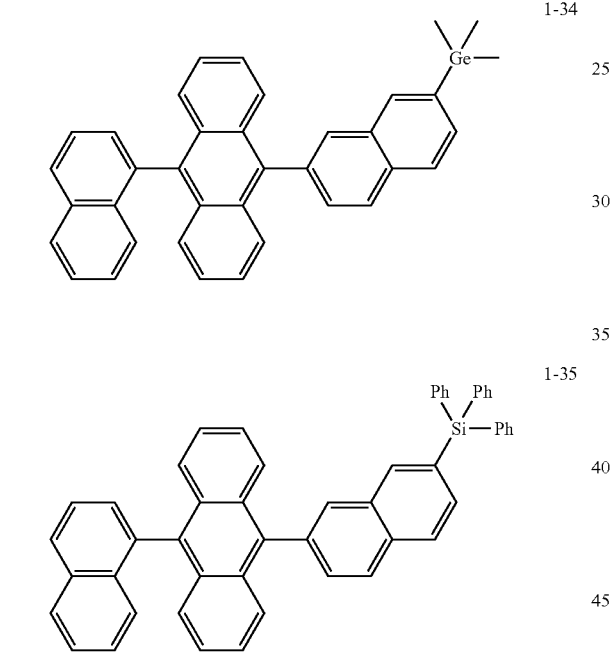
1-34
1-35
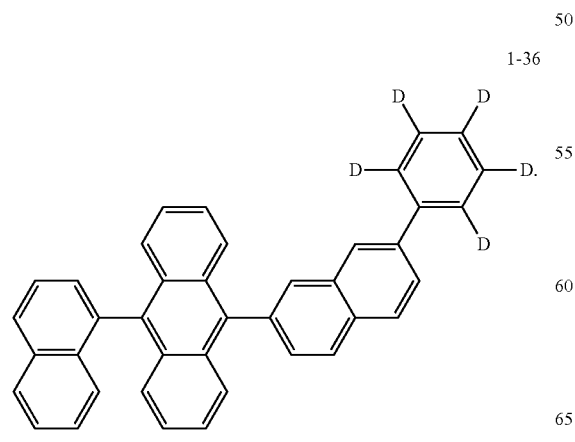
1-36
The second compound represented by Formula 2 may be one of Compounds 2-1 to 2-5 below:
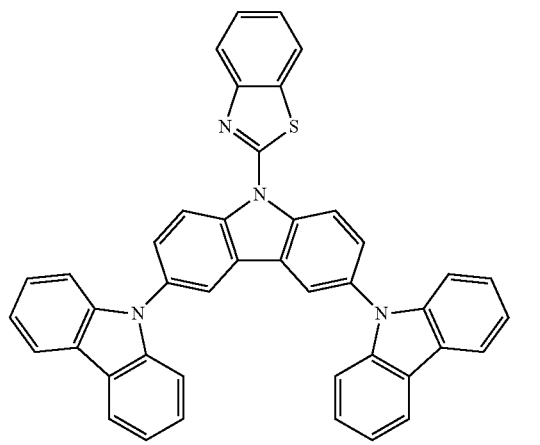
2-1
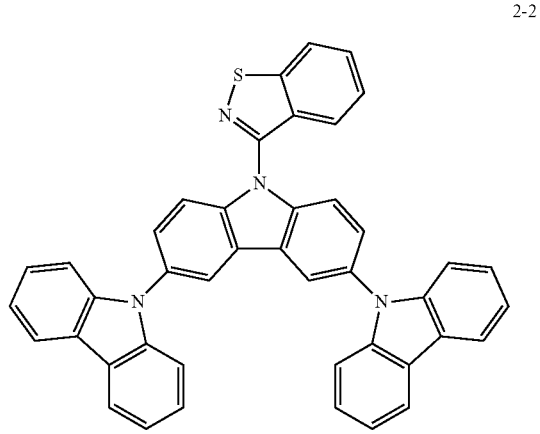
2-2
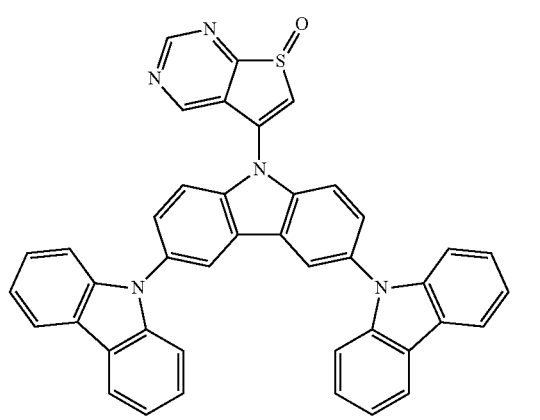
2-3

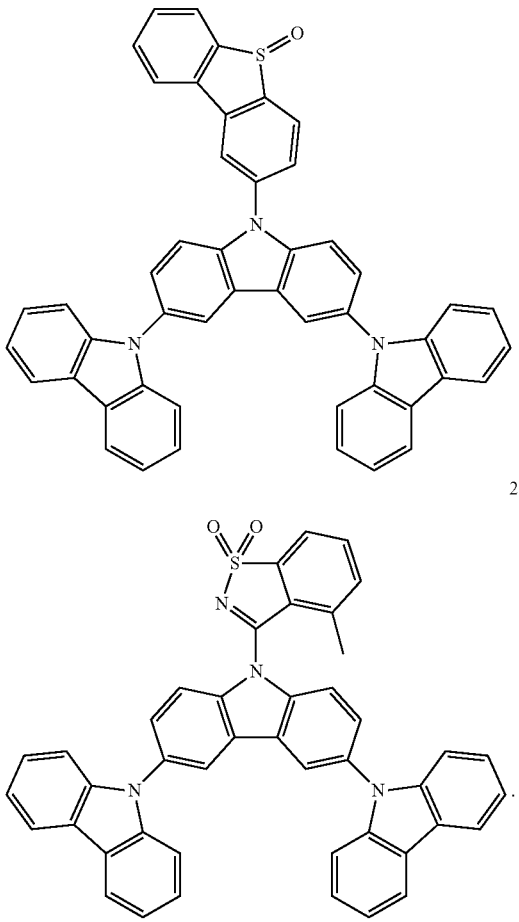

The first compound and the second compound may be included in the emission layer.

A weight ratio of the first compound to the second compound may be about 20:80 to about 80:20.

The emission layer may further include a dopant, the dopant including an organometallic compound that includes iridium (Ir), platinum (Pt), osmium (Os), titanium (Ti), zirconium (Zr), hafnium (Hf), europium (Eu), terbium (Tb), thulium (Tm), rhodium (Rh), or copper (Cu).

The organic light-emitting device may further include a hole transport region between the first electrode and the emission layer.

The organic light-emitting device may further include an electron transport region between the second electrode and the emission layer.

BRIEF DESCRIPTION OF THE DRAWING

Features will be apparent to those of skill in the art by describing in detail exemplary embodiments with reference to the attached drawings in which:

the FIGURE illustrates a schematic cross-sectional view of a structure of an organic light-emitting device according to an exemplary embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

the FIGURE illustrates a schematic cross-sectional view of a structure of an organic light-emitting device 10 according to an exemplary embodiment.

Referring to the FIGURE, the organic light-emitting device 10 may include a first electrode 110, an organic layer 150, and a second electrode 190.

A substrate may be additionally disposed beneath the first electrode 110 or on the second electrode 190. The substrate may be a glass substrate or a transparent plastic substrate, each of which has excellent mechanical strength, thermal stability, transparency, surface smoothness, ease of handling, and water proofness.

The first electrode 110 may be formed by, e.g., depositing or sputtering a material for forming the first electrode on the substrate. When the first electrode 110 is an anode, the material for forming the first electrode may be selected from materials with a high work function to facilitate hole injection. The first electrode 110 may be a transmissive electrode, a semi-transmissive electrode, or a transparent electrode. The material for forming the first electrode may have characteristics of excellent transparency and conductivity, and examples thereof may include indium tin oxide (ITO), indium zinc oxide (IZO), tin oxide ($SnO_2$), and zinc oxide (ZnO). In an implementation, the material for forming the first electrode may be at least one selected from magnesium (Mg), aluminum (Al), aluminum-lithium (Al—Li), calcium (Ca), magnesium-indium (Mg—In), and magnesium-silver (Mg—Ag) to form a semi-transmissive electrode or a reflective electrode as the first electrode 110. The first electrode 110 may have a single-layer structure or a multi-layer structure consisting two or more different layers. For example, the first electrode 110 may have a three-layered structure of ITO/Ag/ITO.

The organic layer 150 may be disposed on the first electrode 110. The organic layer 150 may include an emission layer. The organic layer 150 may further include an electron transport region between the emission layer and the second electrode 190, in addition to a hole transport region between the first electrode 110 and the emission layer.

The hole transport region may include at least one of a hole injection layer (HIL), a hole transport layer (HTL), a buffer layer, and an electron blocking layer (EBL), and the electron transport region may include at least one of a hole blocking layer (HBL), an electron transport layer (ETL), and an electron injection layer (EIL).

The hole transport region may have a single-layer structure including a single material, a single-layer structure including a plurality of different materials, or a multi-layer structure including a plurality of different materials.

For example, the hole transport region may have a single-layer structure including a plurality of different materials, or may have a structure of HIL/HTL, a structure of HIL/HTL/buffer layer, a structure of HIL/buffer layer, a structure of HTL/buffer layer, a structure of HIL/HTL/EBL, or a structure of HTL/EBL, each of which layers are sequentially stacked in the stated order from the first electrode 110.

When the hole transport region includes an HIL, the HIL may be formed on the first electrode 110 by using various methods, e.g., vacuum deposition, spin coating, casting, Langmuir-Blodgett (LB) deposition, ink-jet printing, laser-printing, or laser induced thermal imaging (LITI).

When the HIL is formed by vacuum deposition, deposition conditions may vary according to a compound used to form the HIL and a structure of the HIL, e.g., the deposition conditions include a deposition temperature in a range of about 100° C. to about 500° C., a vacuum pressure in a range of about $10^{-8}$ torr to about $10^{-3}$ torr, and/or a deposition rate in a range of about 0.01 Å/sec to about 100 Å/sec.

When the HIL is formed by spin coating, spin coating conditions may vary according to a compound used to form the HIL and a structure of the HIL, e.g., the spin coating conditions include a coating speed in a range of about 2,000 rpm to about 5,000 rpm, and/or a temperature at which a heat treatment is performed may be in a range of about 80° C. to about 200° C.

When the hole transport region includes an HTL, the HTL may be formed on the first electrode 110 or on the HIL by using various methods, e.g., vacuum deposition, spin coating, casting, LB deposition, ink-jet printing, laser-printing, or LITI. When the HTL is formed by vacuum deposition and spin coating, deposition and coating conditions for forming the HTL may be determined by referring to the deposition and coating conditions for forming the HIL.

The hole transport region may include at least one selected from m-MTDATA, TDATA, 2-TNATA, NPB, β-NPB, TPD, Spiro-TPD, Spiro-NPB, TAPC, HMTPD, 4,4', 4"-tris(N-carbazolyl)triphenylamine) (TCTA), polyaniline/dodecylbenzenesulfonic acid:polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid:polyaniline (Pani/CSA), polyaniline/poly(4-styrenesulfonate) (PANI/PSS), a compound represented by Formula 201 below, and a compound represented by Formula 202 below:

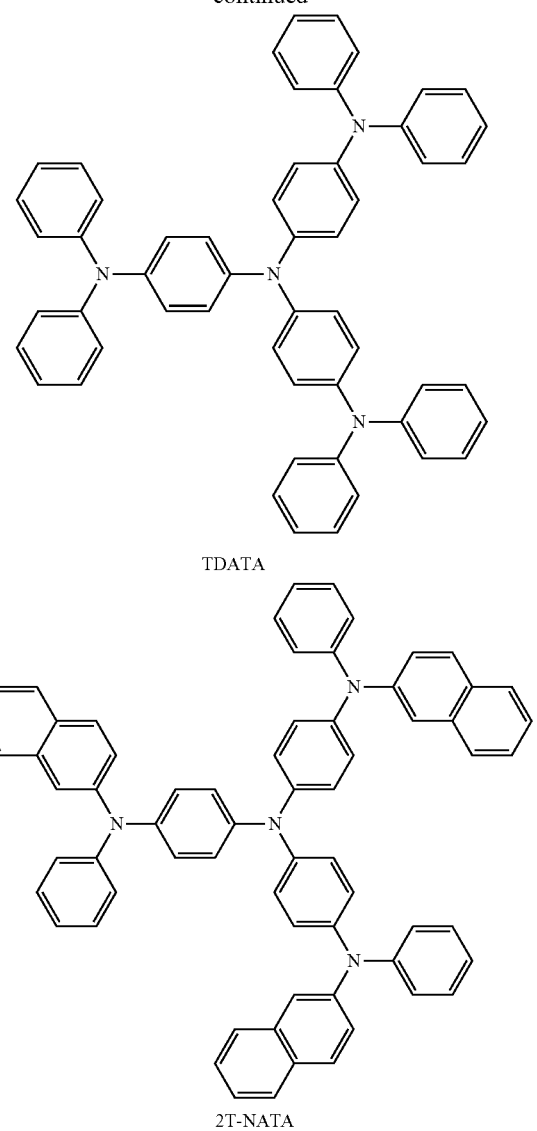

TDATA

2T-NATA

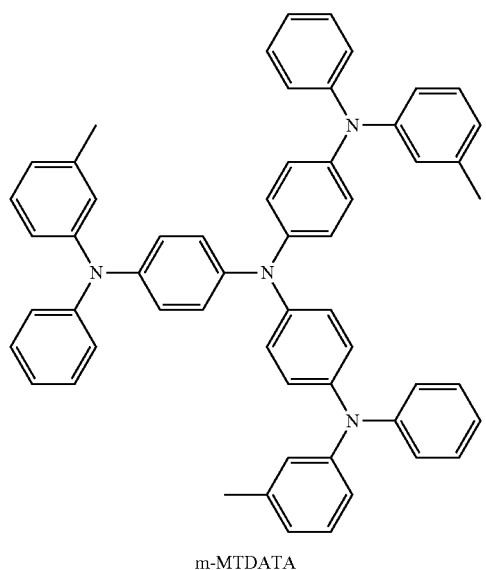

m-MTDATA

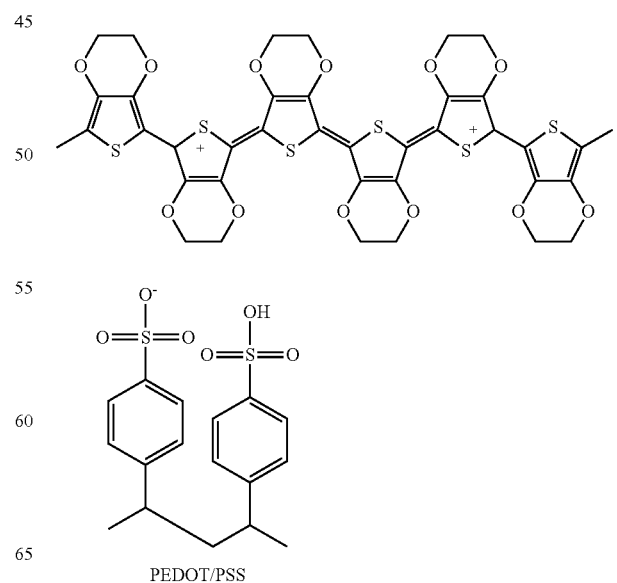

PEDOT/PSS

-continued
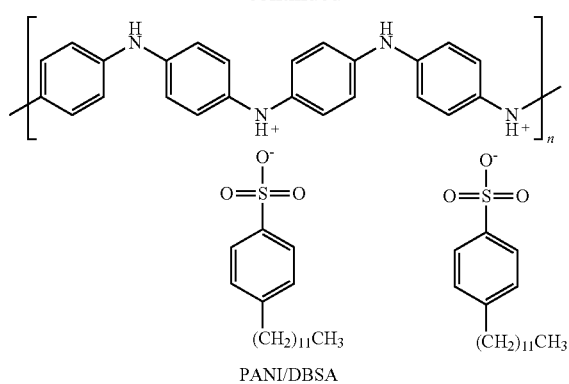
PANI/DBSA
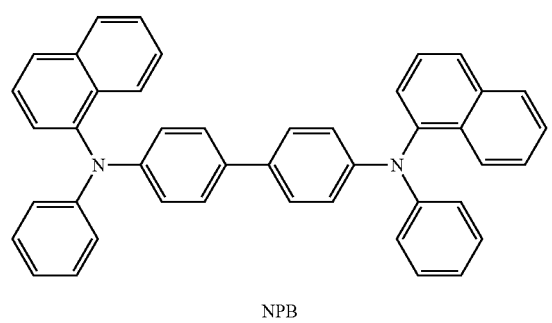
NPB
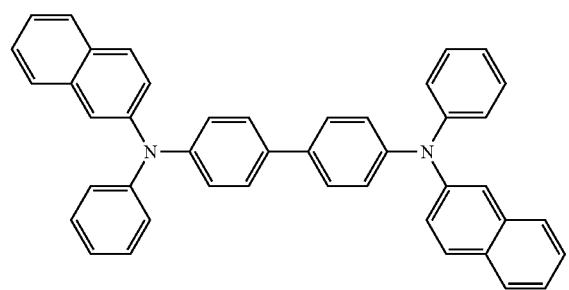
β-NPB
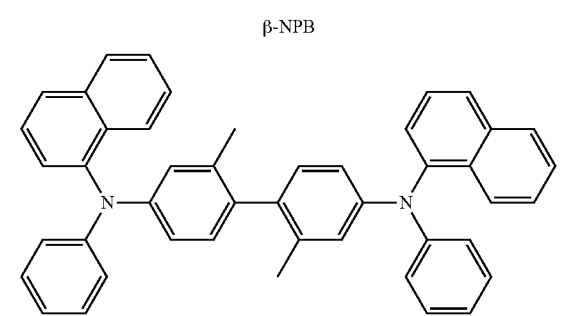
α-NPB
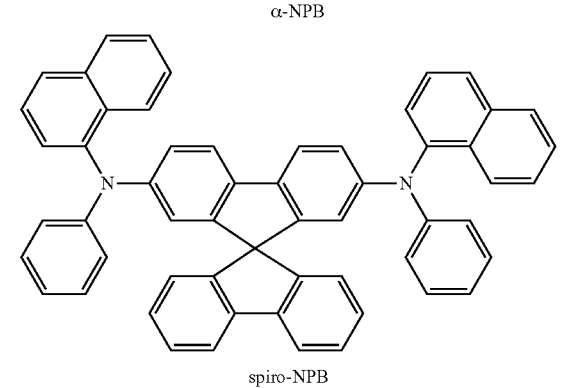
spiro-NPB
-continued
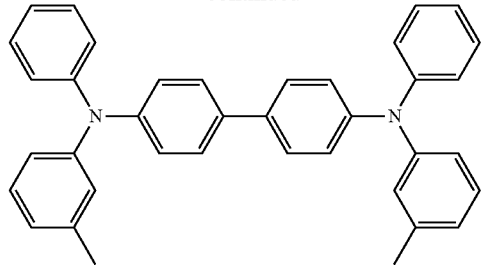
TPD
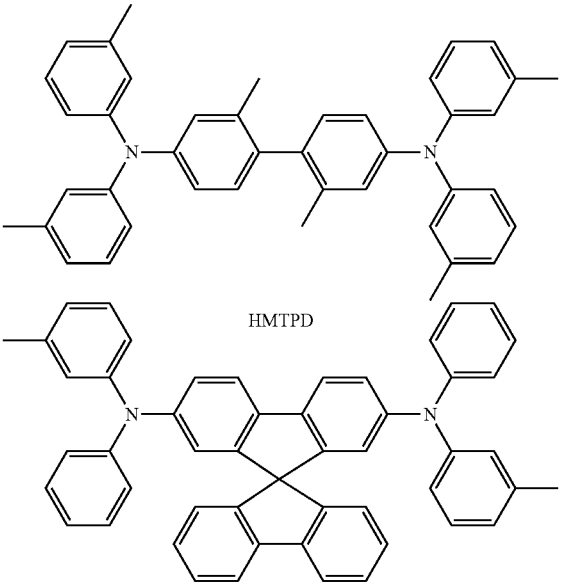
HMTPD
spiro-TPD
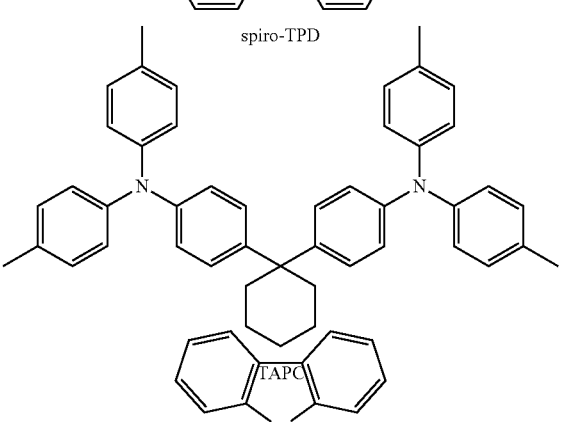
TAPC
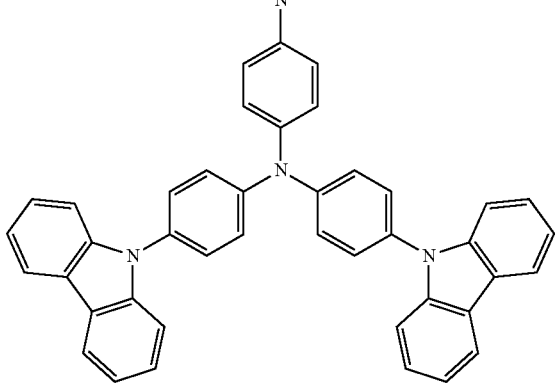
TCTA

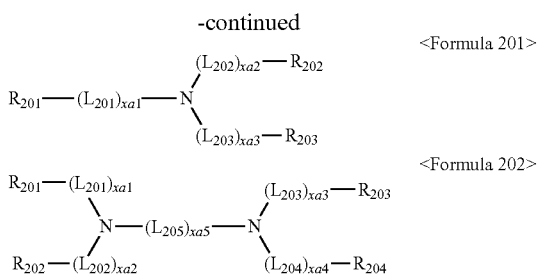

<Formula 201>
<Formula 202>

In Formulae 201 and 202, $L_{201}$ to $L_{205}$ may each independently be selected from a substituted or unsubstituted $C_3$-$C_{10}$ cycloalkylene group, a substituted or unsubstituted heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

At least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, and the substituted divalent non-aromatic condensed heteropolycyclic group may be selected from:

a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{20}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{201}$)($Q_{202}$), —Si($Q_{203}$)($Q_{204}$)($Q_{205}$), and —B($Q_{206}$)($Q_{207}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{211}$)($Q_{212}$), —Si($Q_{213}$)($Q_{214}$)($Q_{215}$), and —B($Q_{216}$)($Q_{217}$); and —N($Q_{221}$)($Q_{222}$), —Si($Q_{223}$)($Q_{224}$)($Q_{225}$), and —B($Q_{226}$)($Q_{227}$);

xa1 to xa4 may each independently be selected from 0, 1, 2, and 3;

xa5 may be selected from 1, 2, 3, 4, and 5;

$R_{201}$ to $R_{205}$ may each independently be selected from a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{231}$)($Q_{232}$), —Si($Q_{233}$)($Q_{234}$)($Q_{235}$), and —B($Q_{236}$)($Q_{237}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{241}$)($Q_{242}$), —Si($Q_{243}$)($Q_{244}$)($Q_{245}$), and —B($Q_{246}$)($Q_{247}$), wherein $Q_{201}$ to $Q_{207}$, $Q_{211}$ to $Q_{217}$, $Q_{221}$ to $Q_{227}$, $Q_{231}$ to $Q_{237}$, and $Q_{241}$ to $Q_{247}$ may each independently be selected from a hydrogen atom, a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formulae 201 and 202, $L_{201}$ to $L_{205}$ may each independently be selected from a phenylene group, a naphthylenylene group, a fluorenylene group, a spiro-fluorenylene group, a benzofluorenylene group, a dibenzofluorenylene group, a phenanthrenylene group, an anthrylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylenylene group, a fluorenylene group, a spiro-fluorenylene group, a benzofluorenylene group, a dibenzofluorenylene group, a phenanthrenylene group, an anthrylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may each independently be 0, 1, or 2;

xa5 may be 1, 2, or 3;

$R_{201}$ to $R_{205}$ may each independently be selected from a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but the embodiment is not limited thereto.

The compound represented by Formula 201 above may be represented by Formula 201A below.

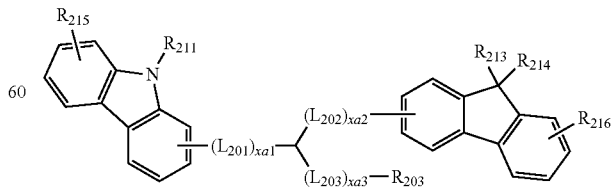

<Formula 201A>

For example, the compound represented by Formula 201 above may be represented by Formula 201A-1 below.

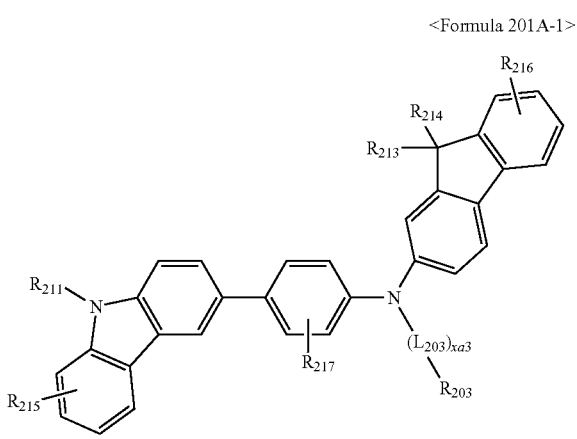

<Formula 201A-1>

The compound represented by Formula 202 above may be represented by Formula 202A below.

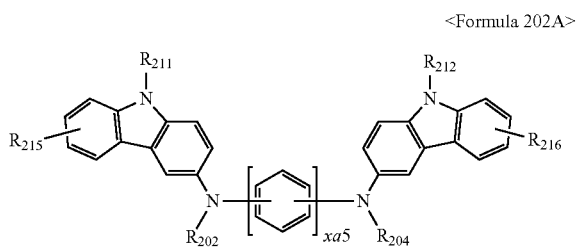

<Formula 202A>

In Formulae 201A, 201A-1, and 202A, $L_{201}$ to $L_{203}$, xa1 to xa3, xa5, and $R_{202}$ to $R_{204}$ may be understood by referring to the description provided herein, and $R_{211}$ and $R_{212}$ may be understood by referring to the description provided in connection with $R_{203}$, and $R_{213}$ to $R_{217}$ may each independently be selected from a hydrogen atom, a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formulae 201A, 201A-1, and 202A, $L_{201}$ to $L_{203}$ may each independently be from a phenylene group, a naphthylenylene group, a fluorenylene group, a spiro-fluorenylene group, a benzofluorenylene group, a dibenzofluorenylene group, a phenanthrenylene group, an anthrylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylenylene group, a fluorenylene group, a spiro-fluorenylene group, a benzofluorenylene group, a dibenzofluorenylene group, a phenanthrenylene group, an anthrylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may each independently be 0 or 1;

$R_{203}$, $R_{211}$, and $R_{212}$ may each independently be selected from a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may each independently be selected from a $C_1$-$C_{20}$ alkyl group and a $C_1$-$C_{20}$ alkoxy group;

, a $C_1$-$C_{20}$ alkyl group and a $C_1$-$C_{20}$ alkoxy group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{217}$ may each independently be selected from a hydrogen atom, a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof;

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, and a triazinyl group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be 1 or 2.

In an implementation, in Formulae 201A and 201A-1, $R_{213}$ and $R_{214}$ may be fused to each other to form a saturated or unsaturated ring.

The compound represented by Formula 201 above and the compound represented by Formula 202 above may include Compounds HT1 to HT20 below.

HT1

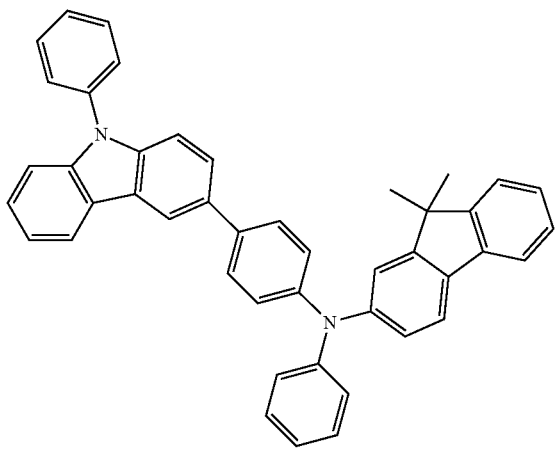

HT2

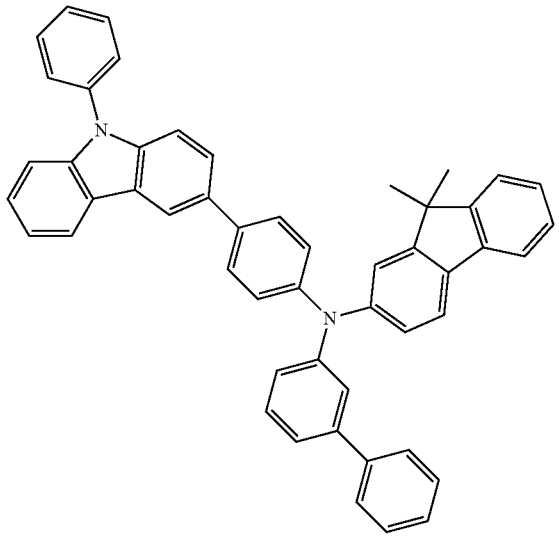

HT3
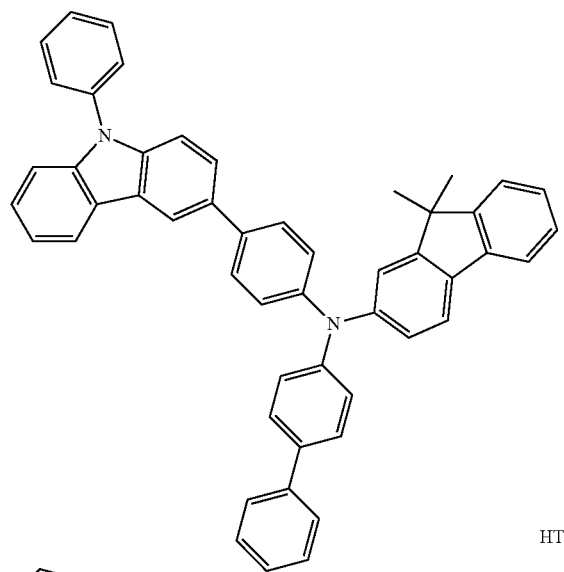
HT4
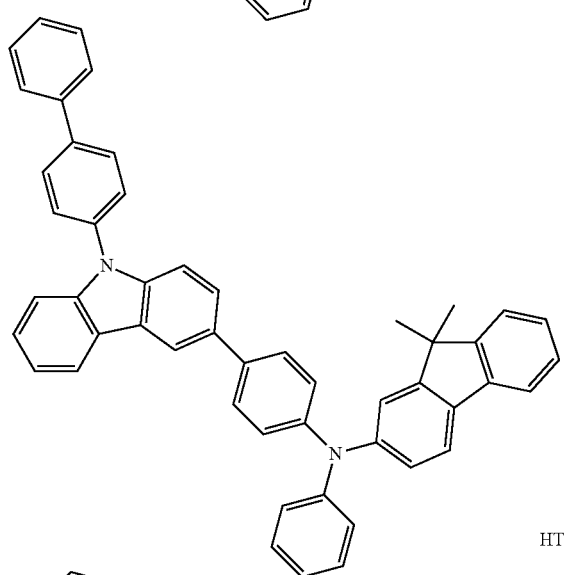
HT5
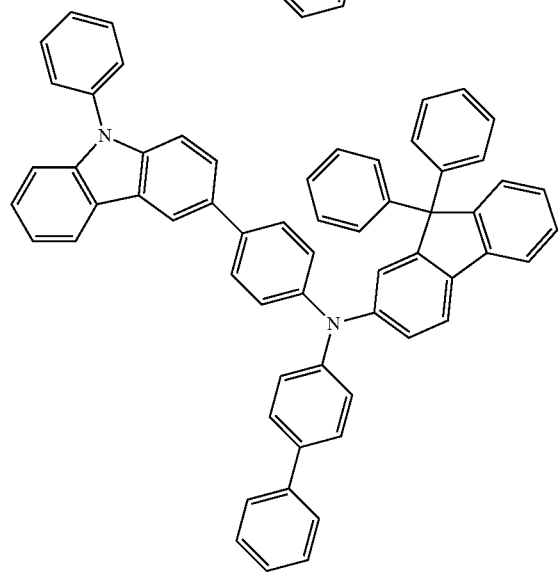
HT6
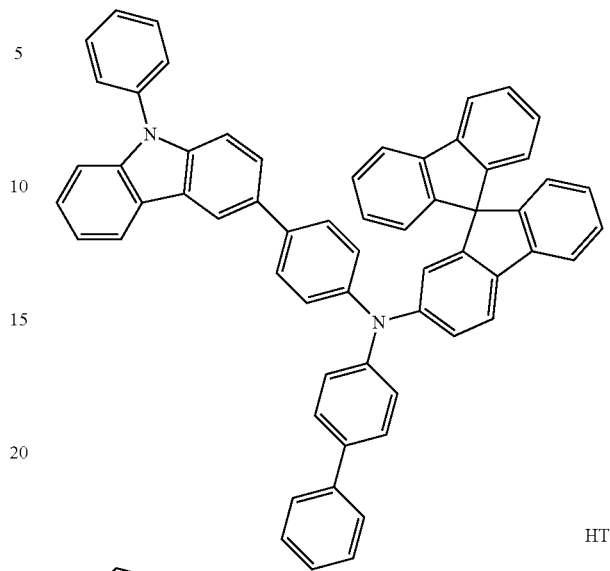
HT7
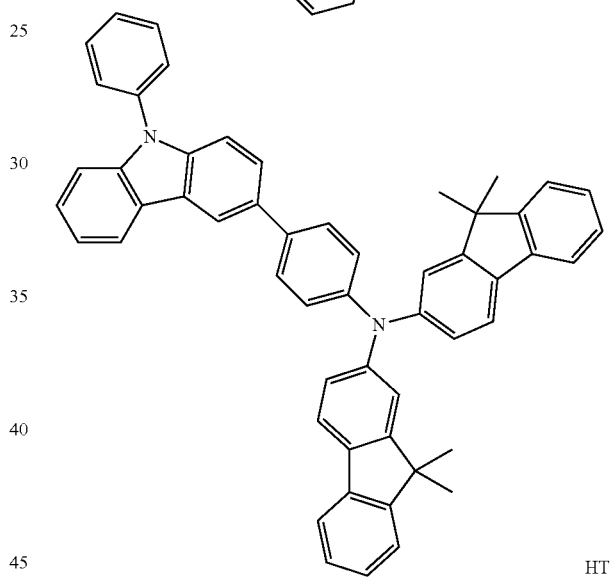
HT8
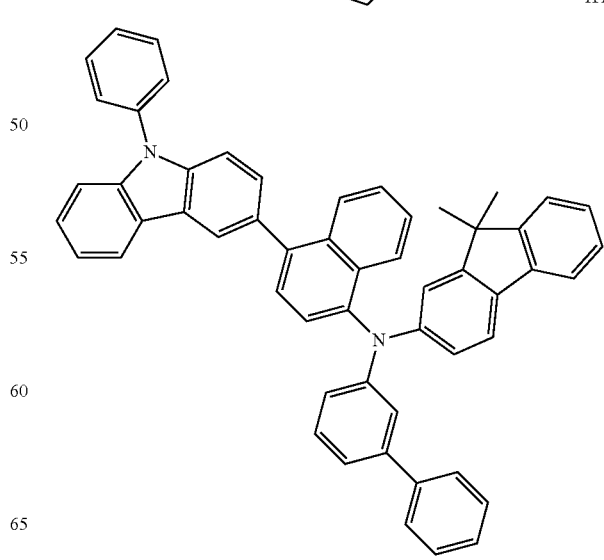

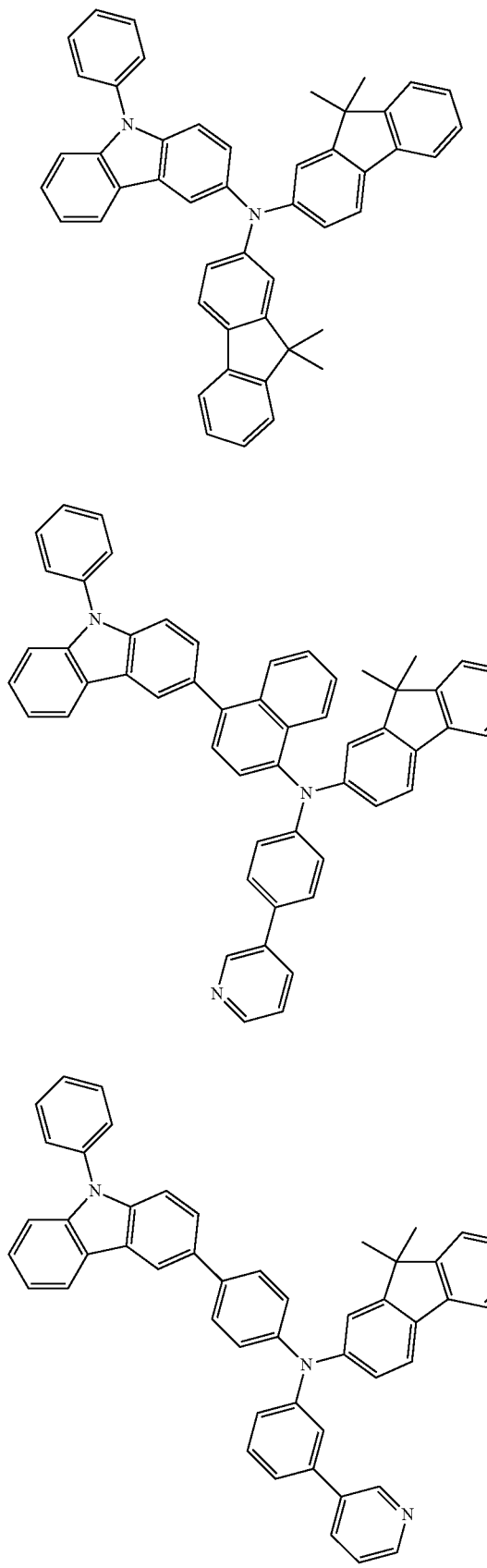
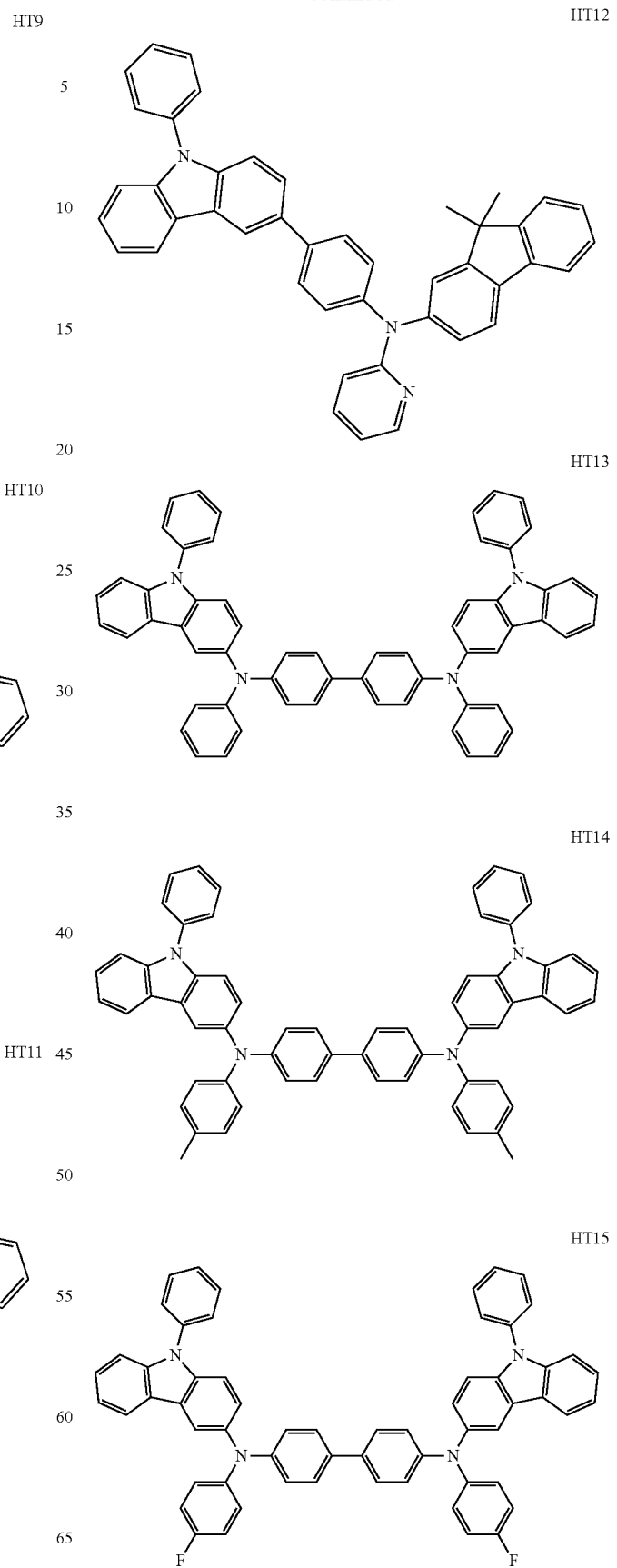

HT16

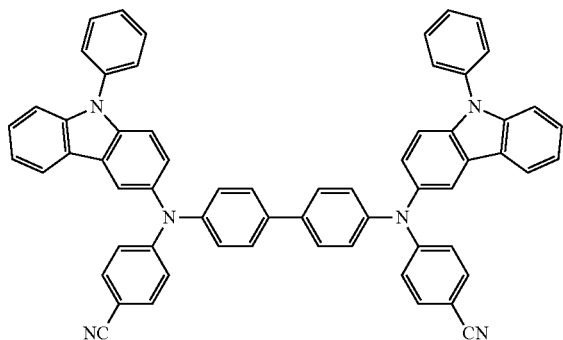

HT17

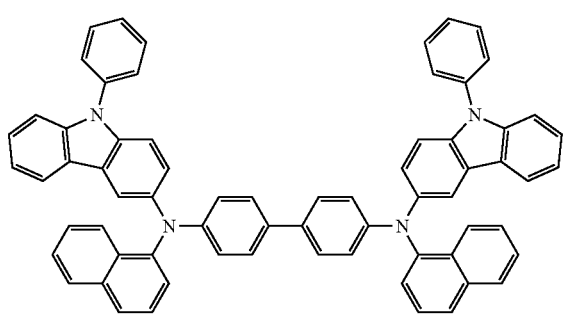

HT18

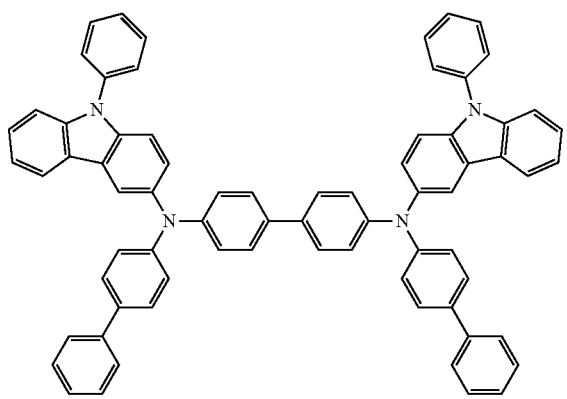

HT19

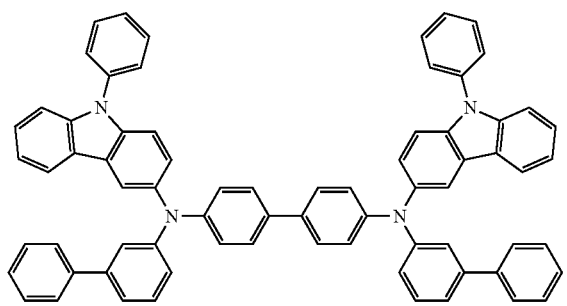

HT20

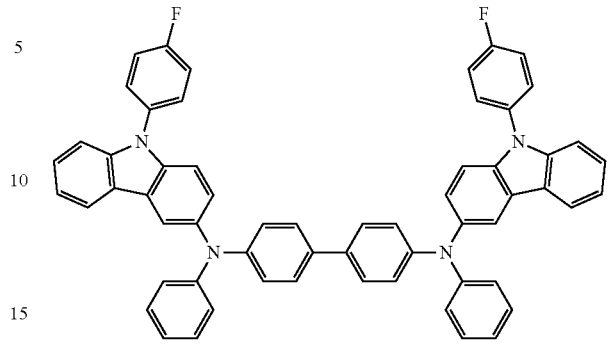

A thickness of the hole transport region may be in a range of about 100 Å to about 10,000 Å, e.g., about 100 Å to about 1,000 Å. When the hole transport region includes both an HIL and an HTL, a thickness of the HIL may be in a range of about 100 Å to about 10,000 Å, e.g., about 100 Å to about 1,000 Å, and a thickness of the HTL may be in a range of about 50 Å to about 2,000 Å, e.g., about 100 Å to about 1,500 Å. When the thicknesses of the hole transport region, the HIL, and the HTL are within these ranges, satisfactory hole transporting characteristics may be obtained without a substantial increase in driving voltage.

In addition to the materials described above, the hole transport region may further include a charge-generation material for the improvement of conductive characteristics. The charge-generation material may be homogeneously or non-homogeneously dispersed in the hole transport region.

The charge-generation material may be, e.g., a p-dopant. The p-dopant may be a quinone derivative, such as a tetracyanoquinodimethane (TCNQ) and tetrafluorotetracyanoquinodimethane (F4-TCNQ); a metal oxide, such as a tungsten oxide and a molybdenum oxide; and 1,4,5,8,9,11-hexaazatriphenylene-hexacarbonitrile (HATCN), but is not limited thereto.

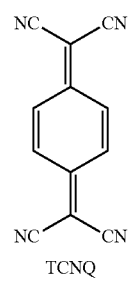

TCNQ

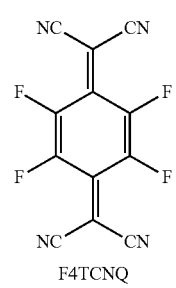

F4TCNQ

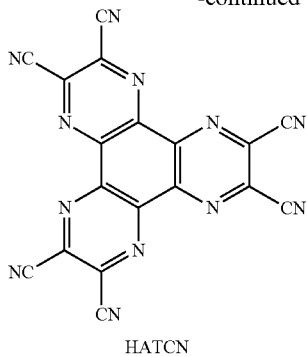

HATCN

The hole transport region may further include, in addition to the HIL, the HTL, and an emission auxiliary layer, at least one of a buffer layer and an EBL. The buffer layer may compensate for an optical resonance distance according to a wavelength of light emitted from the emission layer, and thus, a light-emission efficiency of a formed organic light-emitting device may be improved. For use as a material for forming the buffer layer, a material for forming the hole transport region may be used. The EBL may help prevent electron injection from the electron transport region. For example, an example of a material for forming the EBL may include mCP below, but is not limited thereto.

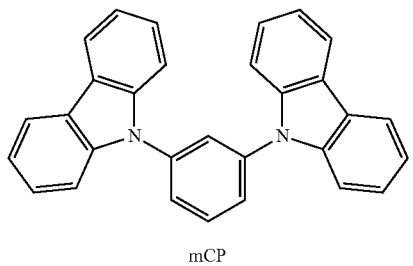 [SMILES: c1cc(-n2c3ccccc3c3ccccc32)cc(-n2c3ccccc3c3ccccc32)c1]

mCP

The emission layer may be formed on the first electrode 110 or on the hole transport region by using various methods, e.g., vacuum deposition, spin coating, casting, LB deposition, ink-jet printing, laser-printing, or LITI. When the emission layer is formed by vacuum deposition and spin coating, deposition and coating conditions for forming the emission layer may be determined by referring to the deposition and coating conditions for forming the HIL.

When the organic light-emitting device 10 is a full-color organic light-emitting device, the emission layer may be patterned into a red emission layer, a green emission layer, and a blue emission layer, according to a red subpixel, a green subpixel, and a blue subpixel, respectively. In an implementation, the emission layer may have a structure of a red emission layer, a green emission layer, and a blue emission layer, each of which layers are sequentially stacked in this stated order, or may have a structure where a red light-emitting material, a green light-emitting material, and a blue light-emitting material are mixed regardless of layer division, so that the emission layer may emit white light. When the emission layer emits white light, the device may further include a color conversion layer or a color filter.

The emission layer may include a host and a dopant.

The host may include a first compound represented by Formula 1 below and a second compound represented by Formula 2 below.

<Formula 1>

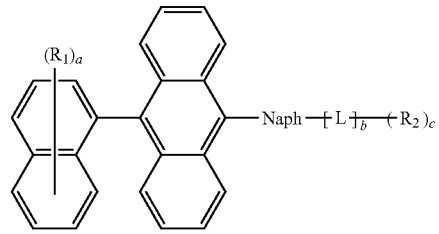

<Formula 2>

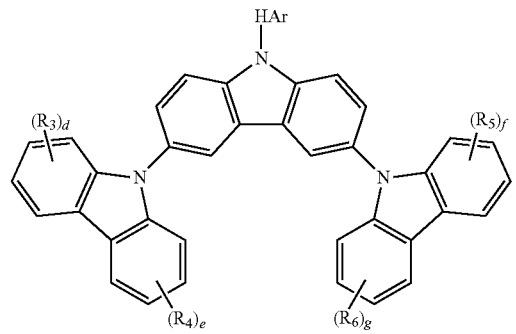

In Formulae 1 and 2,

Naph may be a naphthylene group,

L may be a $C_6$-$C_{40}$ arylene group or a $C_1$-$C_{40}$ heteroarylene group, HAr may be a group represented by one of Formulae 3 and 4 below.

<Formula 3>

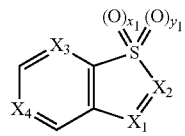

<Formula 4>

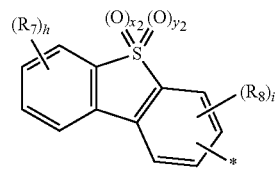

$X_1$ and $X_2$ may each independently be, e.g., N or C—*, and at least one of $X_1$ and $X_2$ may be C—*. For example, the * in C—* and in Formula 4 may represent a binding site to a nitrogen atom of the carbazole moiety of Formula 2.

$X_3$ and $X_4$ may each independently be, e.g., N or CH, $x_1$ and $y_1$ may each independently be, e.g., 0 or 1, $x_2$ and $y_2$ may each independently be, e.g., 0 or 1, $R_1$ to $R_8$ may each independently be selected from or include, e.g., a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{40}$ aryl group, a substituted or unsubstituted $C_1$-$C_{40}$ heteroaryl group, a substituted or unsubstituted $C_5$-$C_{40}$ aryloxy group, a substituted or unsubstituted $C_5$-$C_{40}$ arylthio group, a substituted or unsubstituted $C_6$-$C_{40}$ monovalent non-aromatic condensed polycyclic group, a substituted or unsubstituted $C_6$-$C_{40}$ monovalent non-aromatic heterocondensed polycyclic group, —N($Q_1$)($Q_2$), —P(=O)($Q_3$)($Q_4$), —Si($Q_5$)($Q_6$)($Q_7$), —Ge($Q_5$)($Q_6$)($Q_7$), in which $Q_1$ to $Q_4$ may each independently be a hydrogen atom, a $C_6$-$C_{40}$ aryl group, and $Q_5$, $Q_6$, and $Q_7$ may be each independently a hydrogen atom, a $C_1$-$C_{20}$ alkyl group, or a $C_6$-$C_{40}$ aryl group.

In an implementation, at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_1$-$C_{20}$ heterocycloalkyl group, the substituted $C_3$-$C_{20}$ cycloalkenyl group, the substituted $C_1$-$C_{20}$ heterocycloalkenyl group, the substituted $C_6$-$C_{40}$ aryl group, the substituted $C_1$-$C_{40}$ heteroaryl group, the substituted $C_5$-$C_{40}$ aryloxy group, the substituted $C_5$-$C_{40}$ arylthio group, the substituted $C_6$-$C_{40}$ monovalent non-aromatic condensed polycyclic group, the substituted $C_6$-$C_{40}$ monovalent non-aromatic heterocondensed polycyclic group may be selected from:

a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{40}$ aryl group, a $C_1$-$C_{40}$ heteroaryl group, a $C_5$-$C_{40}$ aryloxy group, a $C_5$-$C_{40}$ arylthio group, a $C_6$-$C_{40}$ monovalent non-aromatic condensed polycyclic group, a $C_6$-$C_{40}$ monovalent non-aromatic heterocondensed polycyclic group, and —Si($Q_{11}$)($Q_{12}$)($Q_{13}$), in which $Q_{11}$ to $Q_{13}$ may each independently be a hydrogen atom, a $C_1$-$C_{20}$ alkyl group, or a $C_6$-$C_{40}$ aryl group.

a may be, e.g., an integer of 0 to 7,
b may be, e.g., an integer of 0 to 2,
c may be, e.g., an integer of 1 to 3,
d to h may each independently be, e.g., an integer of 0 to 4,
i may be, e.g., an integer of 0 to 3, and,
* may indicate a binding site to a neighboring atom (e.g., the nitrogen in Formula 2).

In Formula 1,
L may be selected from, e.g.,
a phenylene group, a naphthylene group, a phenanthrenylene group, and an anthrylene group; and
a phenylene group, a naphthyl group, a phenanthrenyl group, and an anthryl group, each substituted with at least one of a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a phenanthrenyl group, an anthryl group, and —Si($Q_{21}$)($Q_{22}$)($Q_{23}$), in which $Q_{21}$ to $Q_{23}$ may be each independently a hydrogen atom, a $C_1$-$C_{20}$ alkyl group, or a $C_6$-$C_{40}$ aryl group.

In an implementation, L may be a group represented by Formula 4A below.

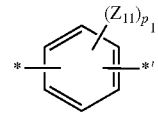

4A

In Formula 4A, $p_1$ may be, e.g., an integer of 0 to 4, and $Z_{11}$ may be selected from, e.g., a deuterium atom, a halogen atom, a methyl group, an ethyl group, a propyl group, a phenyl group, a naphthyl group, a phenanthrenyl group, an anthryl group, —Si($Q_{21}$)($Q_{22}$)($Q_{23}$), in which $Q_{21}$ to $Q_{23}$ may be each independently a hydrogen atom, a $C_1$-$C_{20}$ alkyl group, or a $C_6$-$C_{40}$ aryl group; and a methyl group, an ethyl group, a propyl group, a phenyl group, a naphthyl group, a phenanthrenyl group, an anthryl group, —Si($Q_{21}$)($Q_{22}$)($Q_{23}$), each substituted with at least one of a deuterium atom and a halogen atom.

For example, L may be a group represented by any one of Formulae 5A to 5E below.

5A

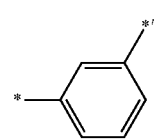

5B

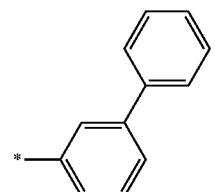

5C

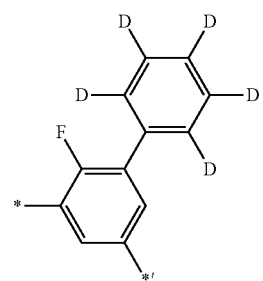

5D

-continued

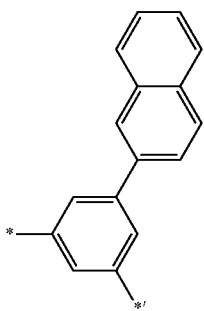
5E

In an implementation, Formula 2, HAr may be a group represented by any one of Formulae 6A to 6E below.

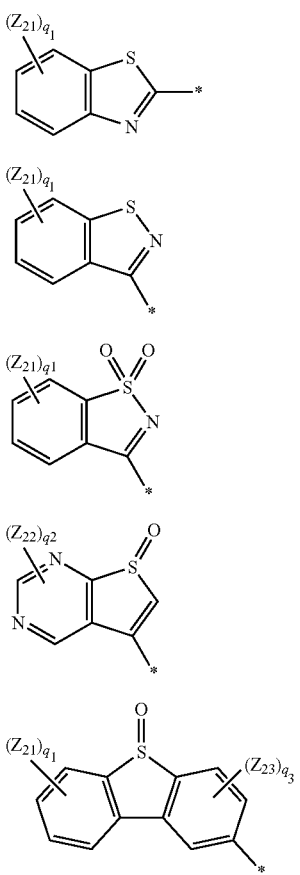

In Formulae 6A to 6E, $Z_{21}$ to $Z_{23}$ may each independently be selected from, e.g., a deuterium atom, a halogen atom, a $C_1$-$C_4$ alkyl group, a $C_6$-$C_{20}$ aryl group, a $C_1$-$C_{20}$ heteroaryl group, and —Si($Q_{31}$)($Q_{32}$)($Q_{33}$), in which $Q_{31}$ to $Q_{33}$ may each independently be a hydrogen atom, a $C_1$-$C_{20}$ alkyl group, or a $C_6$-$C_{20}$ aryl group, q1 may be, e.g., an integer of 0 to 4, q2 may be, e.g., an integer of 1 or 2, and q3 may be, e.g., an integer of 0 to 3.

In an implementation, HAr may be a group represented by any one of Formulae 7A to 7E below.

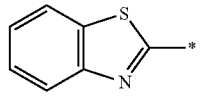
7A

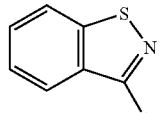
7B

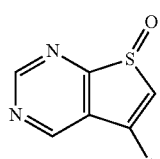
7C

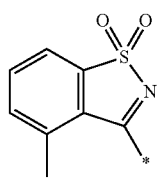
7D

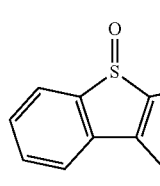
7E

In an implementation, in Formulae 1 to 4, $R_1$ to $R_8$ may each independently be selected from, e.g., a deuterium atom, a halogen atom, a hydroxyl group, a cyano group, a carboxylic acid or a salt thereof, a sulfonic acid or a salt thereof, a phosphoric acid or a salt thereof, a methyl group, an ethyl group, a propyl group, a butyl group, a pentyl group, a hexyl group, a heptyl group, an octyl group, a nonyl group, a decyl group, a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, —N($Q_1$)($Q_2$), —P(=O)($Q_3$)($Q_4$), —Si($Q_5$)($Q_6$)($Q_7$), and —Ge($Q_5$)($Q_6$)($Q_7$), in which $Q_1$ to $Q_4$ may each independently be a hydrogen atom, or a $C_6$-$C_{40}$ aryl group, and $Q_5$, $Q_6$, and $Q_7$ may be each independently a hydrogen atom, a $C_1$-$C_{20}$ alkyl group or a $C_6$-$C_{40}$ aryl group;

a methyl group, an ethyl group, a propyl group, a butyl group, a pentyl group, a hexyl group, a heptyl group, an octyl group, a nonyl group, and a decyl group, each substituted with at least one of a deuterium atom, a halogen atom, a hydroxyl group, a cyano group, a carboxylic acid or a salt thereof, a sulfonic acid or a salt thereof, a phosphoric acid or a salt thereof, —Si($Q_{11}$)($Q_{12}$)($Q_{13}$), and —Ge($Q_{11}$)($Q_{12}$)($Q_{13}$), in which $Q_{11}$ to $Q_{13}$ may each independently be a hydrogen atom, a $C_1$-$C_{20}$ alkyl group, or a $C_6$-$C_{40}$ aryl group; and a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, and a hexacenyl group, each substituted with at least one of a deuterium atom, a halogen atom, a hydroxyl group, a cyano group, a carboxylic acid or a salt thereof, a sulfonic acid or a salt thereof, a phosphoric acid or a salt thereof, a $C_1$-$C_{10}$ alkyl group, a $C_2$-$C_{10}$ alkenyl group, a $C_2$-$C_{10}$ alkynyl group, a $C_1$-$C_{10}$ alkoxy group, —Si($Q_{11}$)($Q_{12}$)($Q_{13}$), and —Ge($Q_{11}$)($Q_{12}$)($Q_{13}$), in which $Q_{11}$ to $Q_{13}$ may each independently be a hydrogen atom, a $C_1$-$C_{10}$ alkyl group, or a $C_6$-$C_{20}$ aryl group.

In an implementation, $R_1$ to $R_8$ may each independently be selected from, e.g., a deuterium atom, a halogen atom, —Si($Q_5$)($Q_6$)($Q_7$), and —Ge($Q_5$)($Q_6$)($Q_7$), in which $Q_1$ to $Q_7$ may each independently be selected from a hydrogen atom, a $C_1$-$C_4$ alkyl group, or a $C_6$-$C_{10}$ aryl group, or may each independently be, e.g., a group represented by any one of Formulae 8A to 8C below.

8A

8B

8C

In Formulae 8A to 8C, $Z_{31}$ to $Z_{33}$ may each independently be selected from, e.g., a deuterium atom, a halogen atom, a $C_1$-$C_{20}$ alkyl group, a $C_6$-$C_{40}$ aryl group, a monovalent $C_6$-$C_{40}$ non-aromatic condensed polycyclic group, —Si($Q_5$)($Q_6$)($Q_7$), and —Ge($Q_5$)($Q_6$)($Q_7$);

a $C_1$-$C_{20}$ alkyl group substituted with at least one of a deuterium atom and a halogen atom; and a $C_6$-$C_{40}$ aryl group and a monovalent $C_6$-$C_{40}$ non-aromatic condensed polycyclic group, each substituted with at least one of a deuterium atom, a halogen atom, a $C_1$-$C_{20}$ alkyl group, and a $C_6$-$C_{20}$ aryl group.

r1 may be, e.g., an integer of 0 to 5,
r2 may be, e.g., an integer of 0 to 7, and
r3 may be, e.g., an integer of 0 to 10.

In an implementation, $R_1$ to $R_8$ may each independently be selected from, e.g., a deuterium atom and a halogen atom, or may each independently be, e.g., a group represented by any one of Formulae 9A to 9J below.

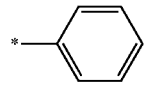

9A

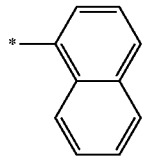

9B

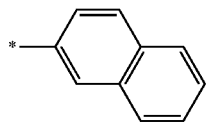

9C

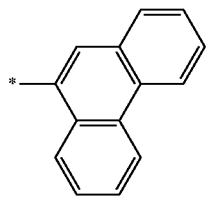

9D

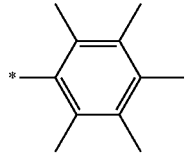

9E

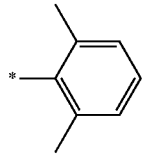

9F

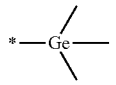

9G

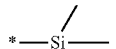

9H

9I

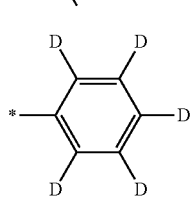

9J

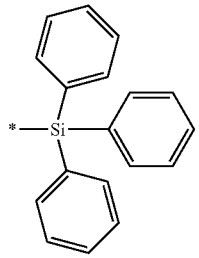

In an implementation, in Formula 1, a, b, and c may each independently be 0 or 1 (e.g., c may be 1), and in Formula 2, d, e, f, g, h, and i may each be 0.

In an implementation, $R_1$ to $R_8$ may each independently be selected from, e.g., a deuterium atom, a halogen atom, a methyl group, a phenyl group, a naphthyl group, a phenanthrenyl group, —Si(Q₅)(Q₆)(Q₇), and —Ge(Q₅)(Q₆)(Q₇), in which Q₅ to Q₇ may each independently be a hydrogen atom, a methyl group, or a phenyl group; and a phenyl group, a naphthyl group, and a pentalenyl group, each substituted with at least one of a deuterium atom, a halogen atom, and a methyl group, d, e, f, g, h, and i may be 0, In an implementation, L may be selected from, e.g., a phenylene group; and a phenylene group and a naphthylene group, each substituted with at least one of a deuterium atom, a halogen atom, a phenyl group, and a deuterium.

In an implementation, HAr may be a group represented by Formula 3 above, in which $X_1$ and $X_2$ may each independently be, e.g., N or C—* and at least one of $X_1$ and $X_2$ may be C—*, $X_3$ and $X_4$ may each independently be, e.g., N or CH, and $x_1$ and $y_1$ may each independently be, e.g., 0 or 1.

In an implementation, HAr may be, e.g., a group represented by Formula 4 above, wherein $x_2$ may be 1 and $y_1$ may be 0.

In an implementation, the first compound represented by Formula 1 above may be, e.g., any one of Compounds 1 to 36 below.

1-1

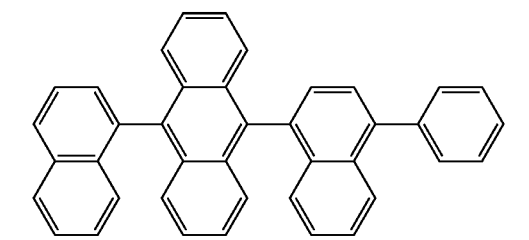

1-2

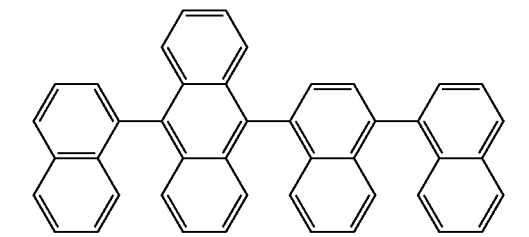

1-3

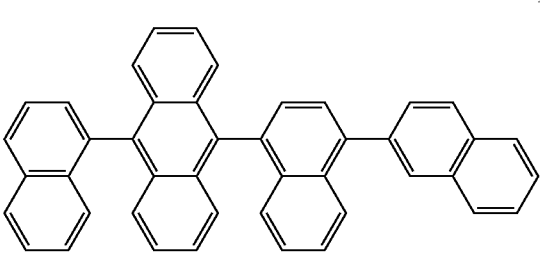

1-4

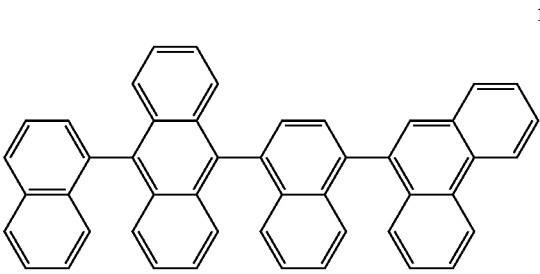

1-5

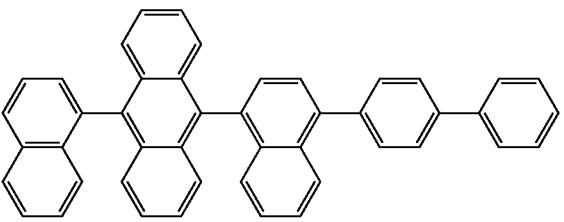

1-6

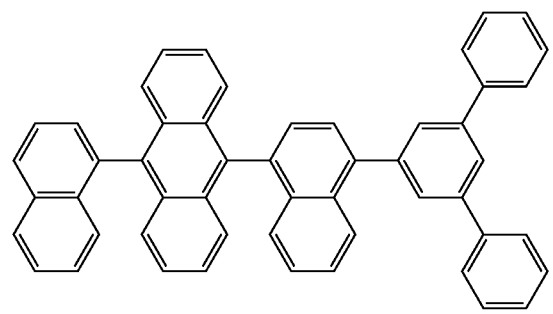

1-7

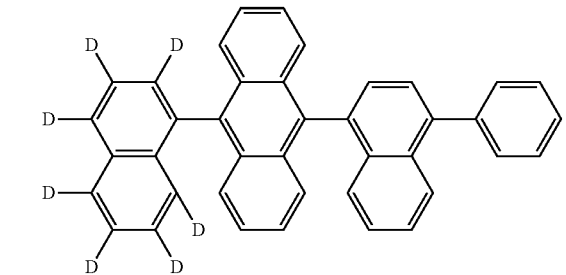

1-8

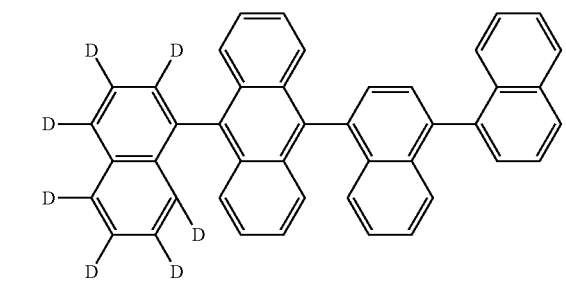

1-9

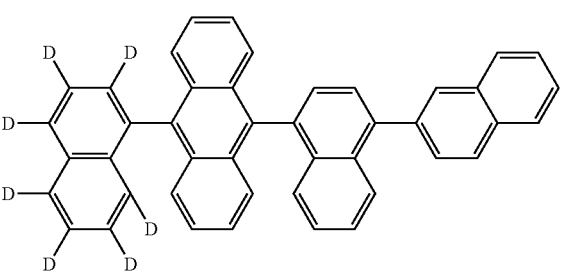

1-10
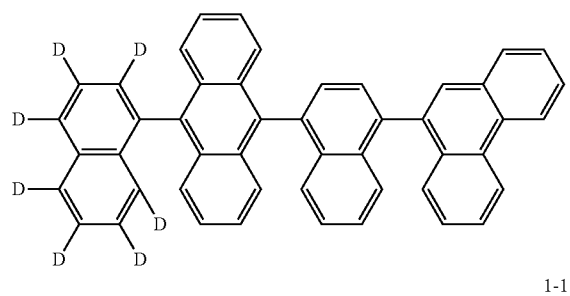
1-11
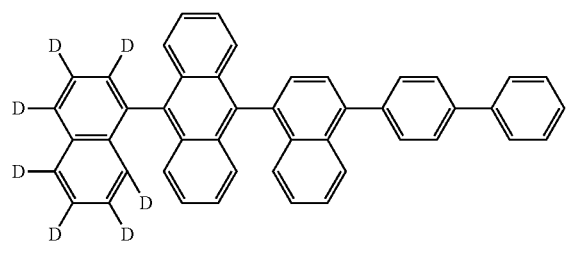
1-12
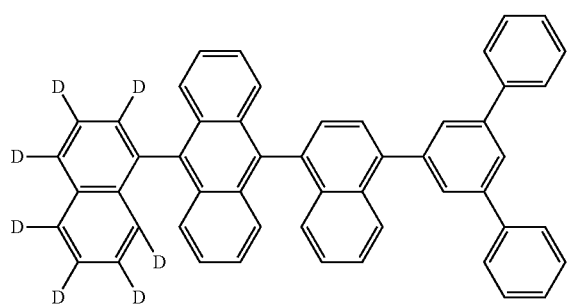
1-13
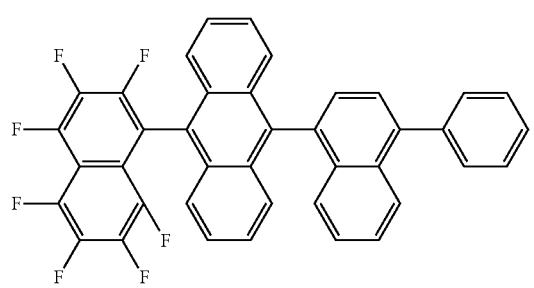
1-14
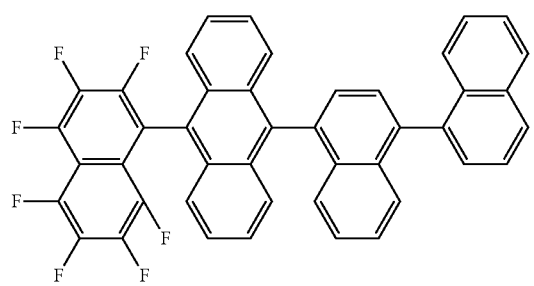
1-15
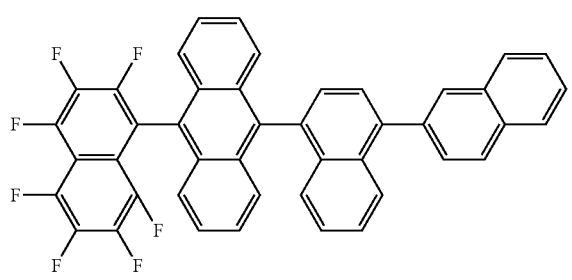
1-16
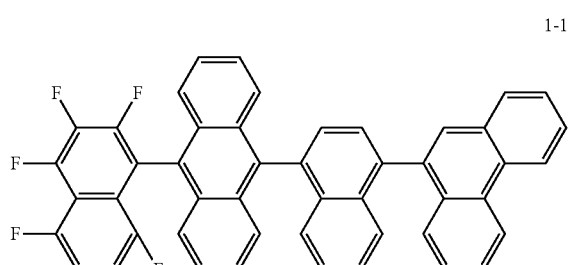
1-17
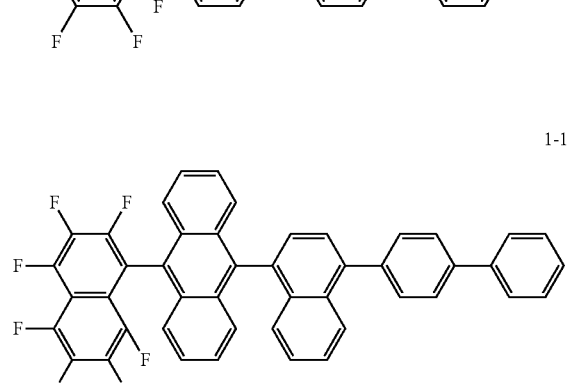
1-18
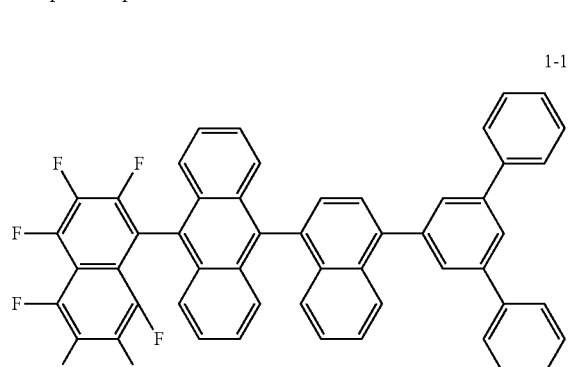
1-19
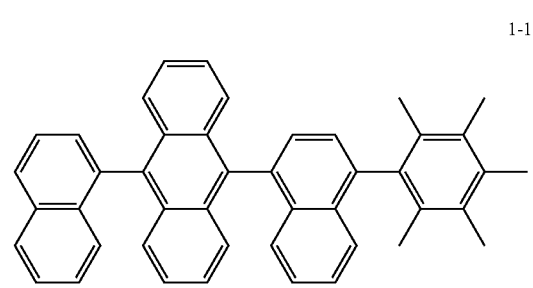

1-20
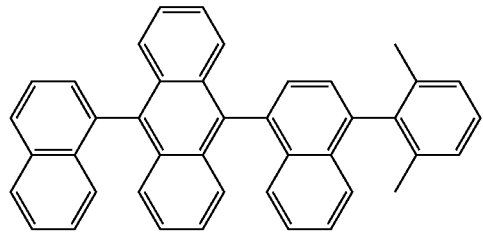
1-21
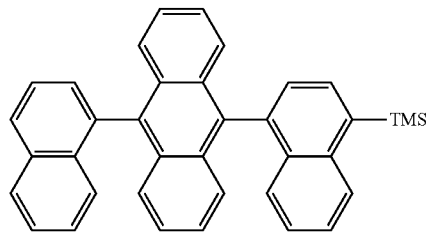
1-22
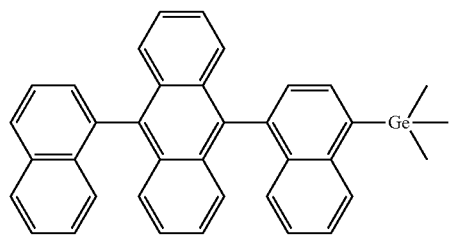
1-23
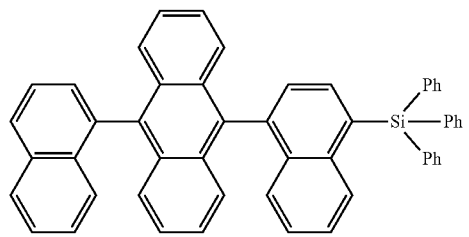
1-24
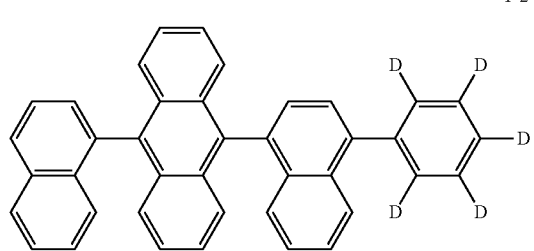
1-25
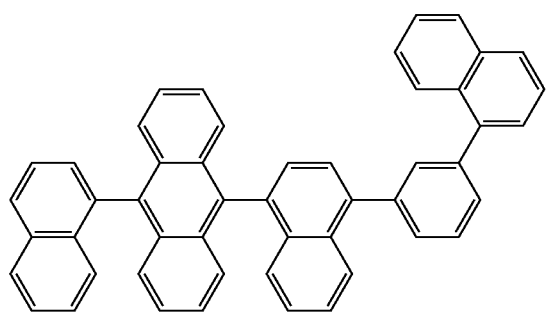
1-26
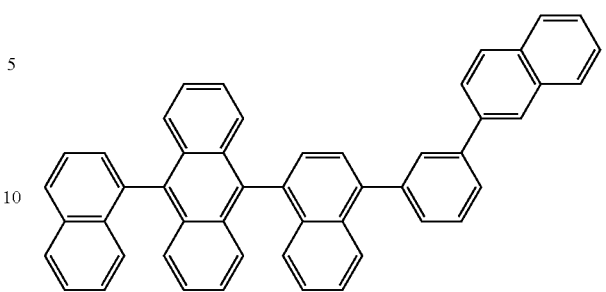
1-27
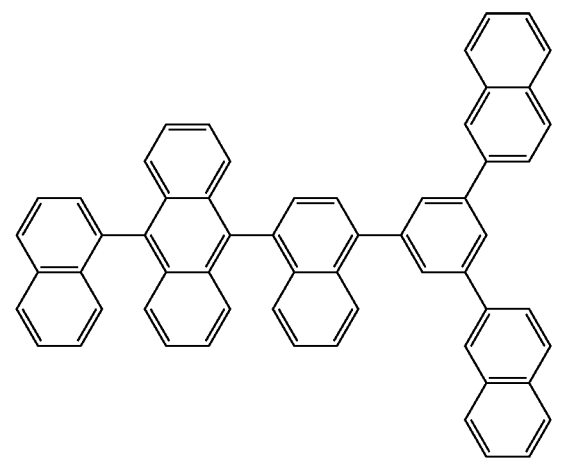
1-28
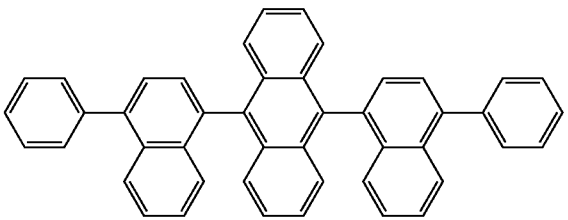
1-29
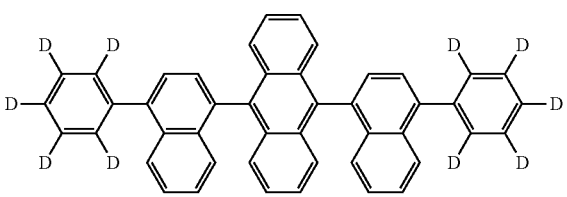
1-30
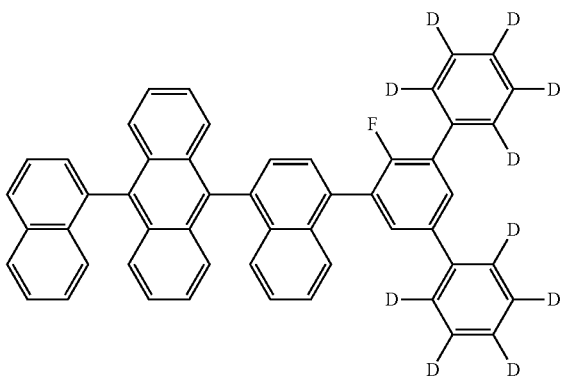

1-31
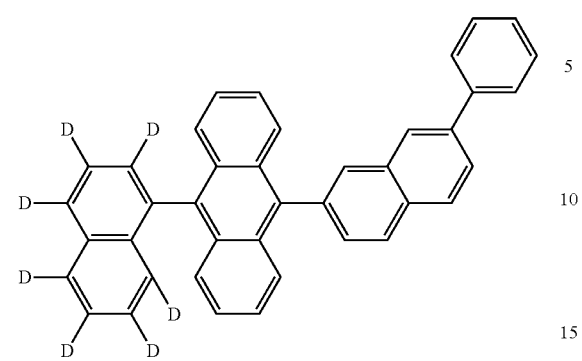
1-32
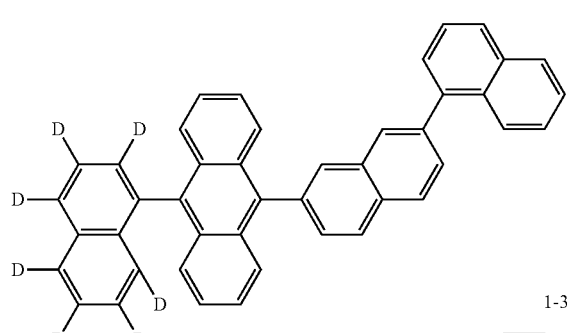
1-33
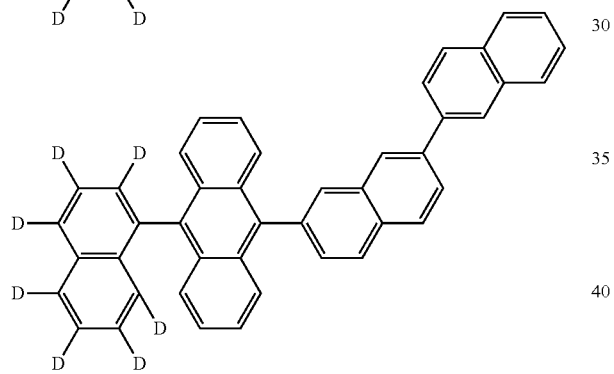
1-34
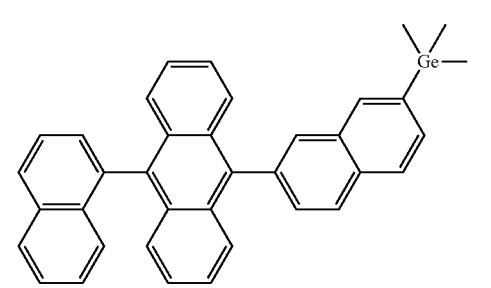
1-35
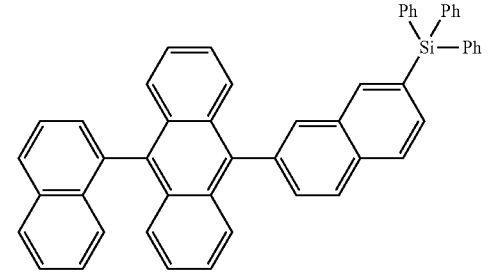
1-36
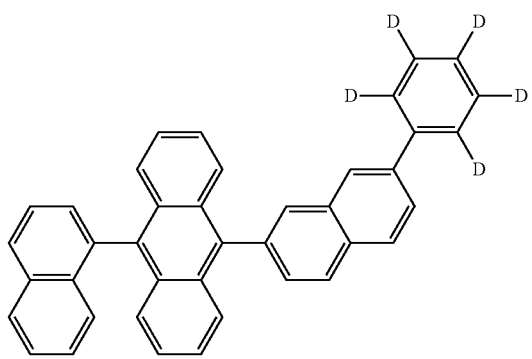
In an implementation, the second compound represented by Formula 2 above may be, e.g., any one of Compounds 2-1 to 2-5 below.
2-1
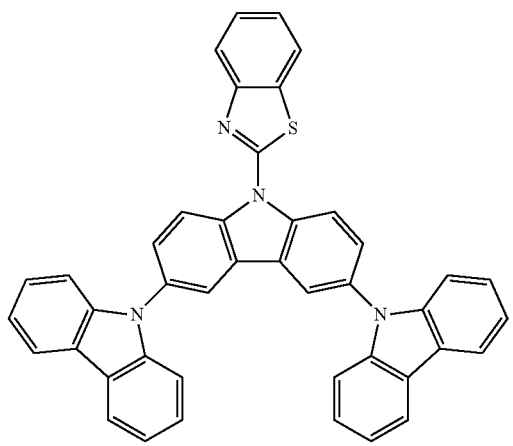
2-2
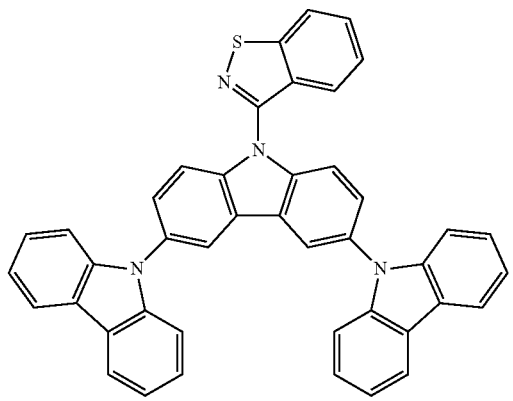

2-3

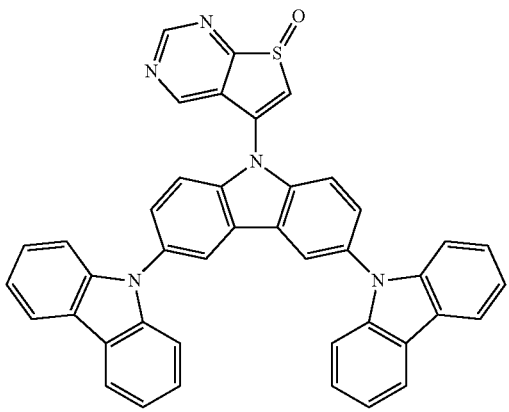

2-4

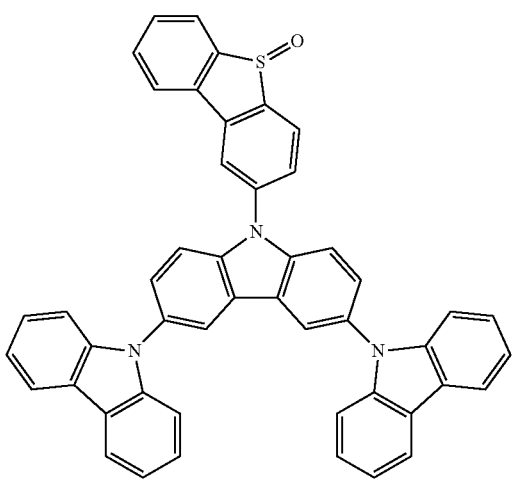

2-5

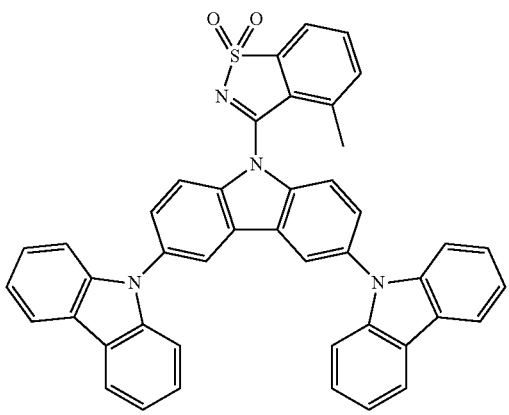

The host may include the first compound and the second compound. In an implementation, a weight ratio of the first compound to the second compound may be about 1:9 to about 9:1, e.g., about 2:8 to about 8:2. In an implementation, a weight ratio of the first compound to the second compound may be about 3:7 to about 7:3. The weight ratio may vary according to the balance of charges in the organic light-emitting device. In an implementation, the weight ratio may vary according to the mobility of charges of the HTL and the ETL or the energy level difference in the emission layer.

The second compound represented by Formula 2 above may have a triplet energy level of at least 2.75 eV, and accordingly, may have a higher triplet energy than that of CBP. In addition, the second compound may have a higher triplet energy than that of a typical dopant (2.7 eV), and thus, in the case of using the second compound as a host, the host may help reduce and/or prevent the reversal flow of the energy back to a dopant, thereby improving a light-emission efficiency of the organic light-emitting device.

In an implementation, in the case of using a mixed host of the first compound and the second compound, a balance between the electrons and the holes may be improved so that the lifespan of the organic light-emitting device may also be improved, resulting in the achievement of a high efficiency of the organic light-emitting device.

The dopant may be a phosphorescent dopant.

For example, the phosphorescent dopant may include an organometallic compound including at least one of iridium (Ir), platinum (Pt), osmium (Os), titanium (Ti), zirconium (Zr), hafnium (Hf), europium (Eu), terbium (Tb), thulium (Tm), rhodium (Rh), and Cu (copper).

In an implementation, the phosphorescent dopant may include, e.g., a compound represented by Formula 401, below.

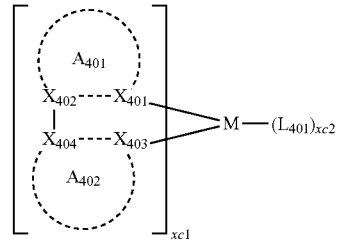

<Formula 401>

In Formula 401,

M may be selected from, e.g., Ir, Pt, Os, Ti, Zr, Hf, Eu, Tb, Tm, Rh, and Cu;

$X_{401}$ to $X_{404}$ may each independently be, e.g., nitrogen or carbon;

ring $A_{401}$ and ring $A_{402}$ may each independently be selected from or include, e.g., a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isooxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene.

In an implementation, at least one substituent of the substituted benzene, the substituted naphthalene, the substituted fluorene, the substituted spiro-fluorene, the substituted indene, the substituted pyrrole, the substituted thiophene, the substituted furan, the substituted imidazole, the substituted pyrazole, the substituted thiazole, the substituted isothiazole, the substituted oxazole, the substituted isoxazole, the substituted pyridine, the substituted pyrazine, the substituted pyrimidine, the substituted pyridazine, the substituted quinoline, the substituted isoquinoline, the substituted benzoquinoline, the substituted quinoxaline, the substituted quinazoline, the substituted carbazole, the substituted benzoimidazole, the substituted benzofuran, the substituted benzothiophene, the substituted isobenzothiophene, the substituted benzoxazole, the substituted isobenzoxazole, the substituted triazole, the substituted oxadiazole, the substituted triazine, the substituted dibenzofuran, and the substituted dibenzothiophene may be selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$);

$L_{401}$ may be, e.g., an organic ligand;

xc1 may be, e.g., 1, 2, or 3; and xc2 may be, e.g., 0, 1, 2, or 3.

$L_{401}$ may be, e.g., any one of a monovalent organic ligand, a divalent organic ligand, and a trivalent organic ligand. For example, $L_{401}$ may be selected from a halogen ligand (e.g., Cl or F), a diketone ligand (e.g., acetylacetonate, 1,3-diphenyl-1,3-propanedionate, 2,2,6,6-tetramethyl-3,5-heptanedionate, or hexafluoroacetonate), a carboxylic acid ligand (e.g., picolinate, dimethyl-3-pyrazolecarboxylate, or benzoate), a carbon monoxide ligand, an isonitrile ligand, a cyano ligand, and a phosphorus ligand (e.g., phosphine or phosphaite), but is not limited thereto.

In Formula 401, when $A_{401}$ has 2 or more substituents, the 2 or more substituents of $A_{401}$ may be linked with each other to form a saturated or unsaturated ring.

In Formula 401, when $A_{402}$ has 2 or more substituents, the 2 or more substituents of $A_{402}$ may be linked with each other to form a saturated or unsaturated ring.

In Formula 401, when xc1 is 2 or more, a plurality of ligands in Formula 401, i.e.,

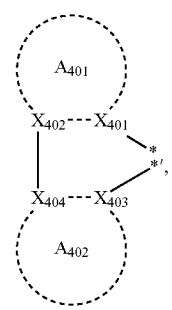

may be identical to or different to each other. In Formula 401, when xc1 is 2 or more, $A_{401}$ and $A_{402}$ respectively may be each linked directly with another $A_{401}$ and $A_{402}$ of a neighboring ligand. Alternatively, $A_{401}$ and $A_{402}$ may be each linked with each other via a linking group (e.g., a $C_1$-$C_5$ alkylene group, —N(R')-(wherein R' is a $C_1$-$C_{10}$ alkyl group or a $C_6$-$C_{20}$ aryl group)), or —C(=O)— of a neighboring ligand.

The phosphorescent dopant may include, e.g., at least one of Ir(ppy)$_2$(acac), Ir(mpyp)$_3$, and Compounds PD1 to PD76 below, (e.g., Compound PD1 is Ir(ppy)$_3$ and Compound DP2 is FIrPic):

PD1

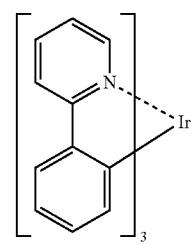

PD2
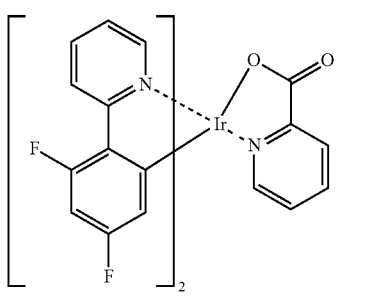
PD3
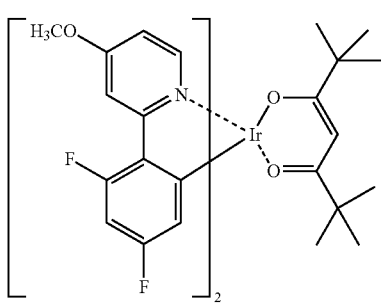
PD4
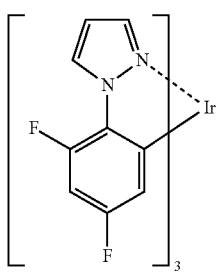
PD5
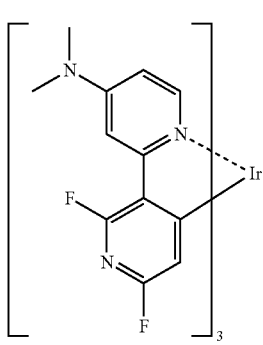
PD6
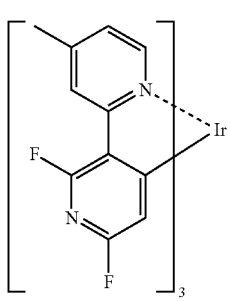
PD7
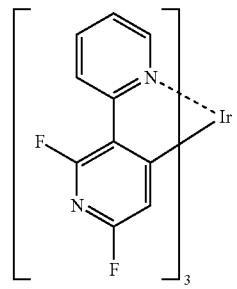
PD8
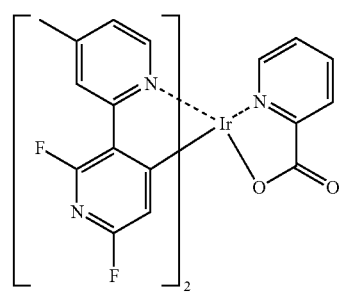
PD9
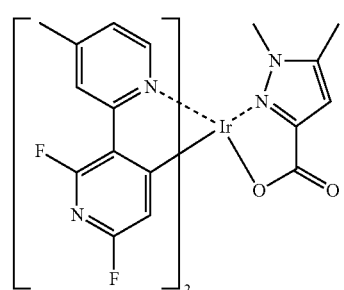
PD10
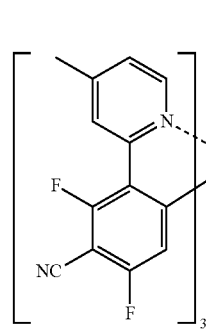
PD11
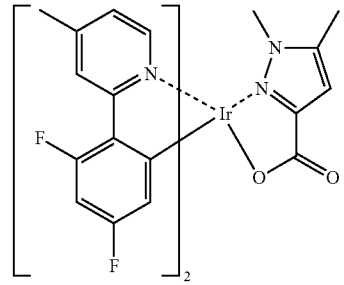

PD12 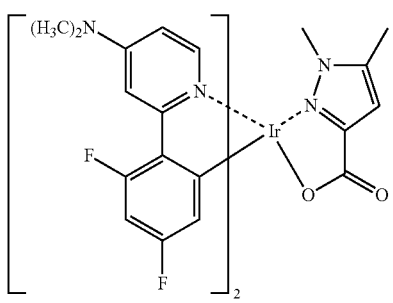
PD17 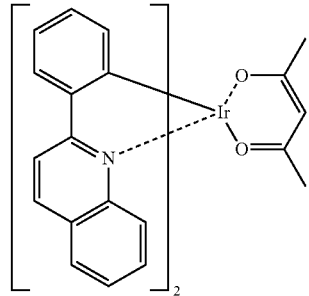
PD13 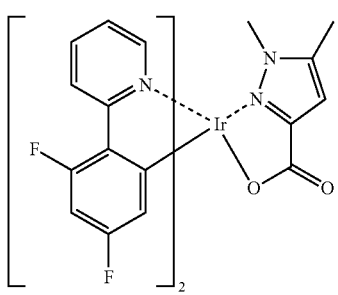
PD18 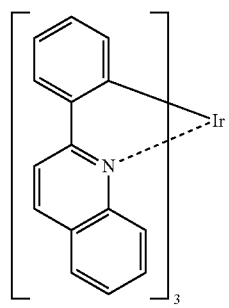
PD14 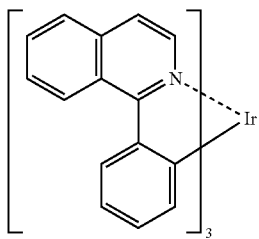
PD19 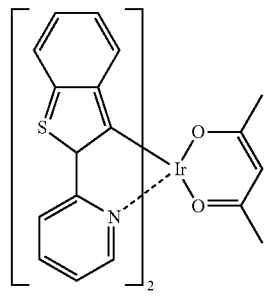
PD15 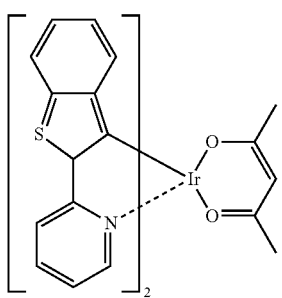
PD16
PD20 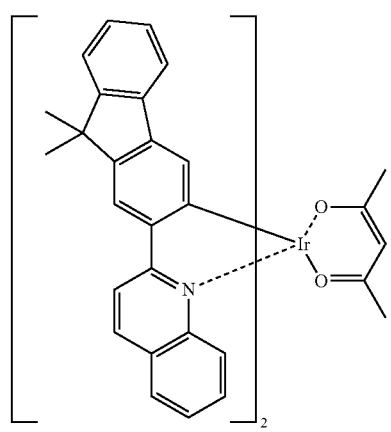

PD21
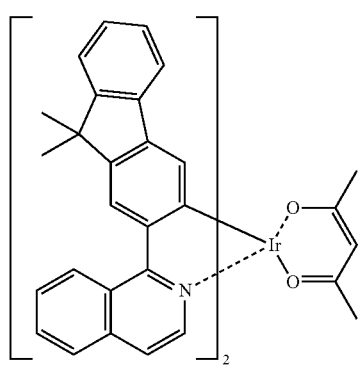
PD22
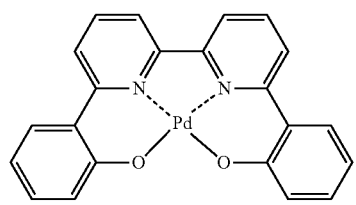
PD23
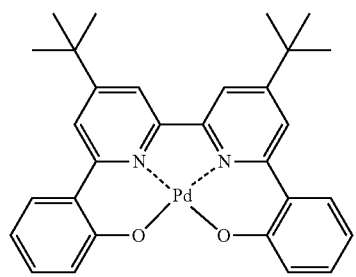
PD24
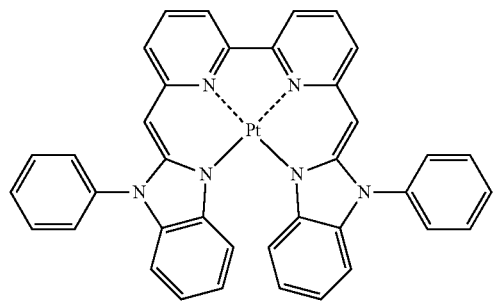
PD25
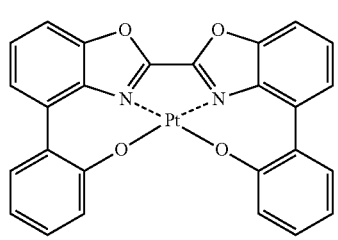
PD26
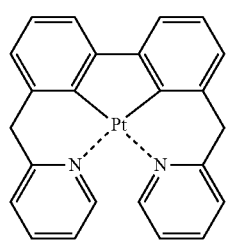
PD27
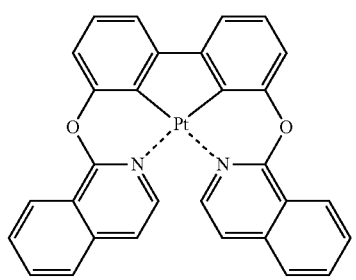
PD28
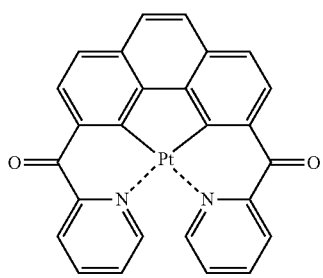
PD29
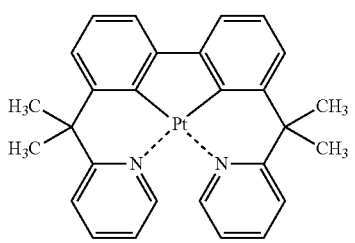
PD30
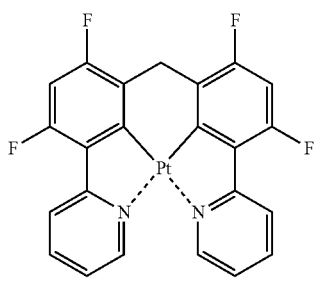
PD31
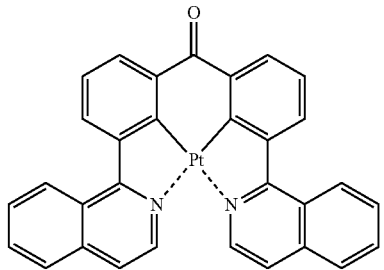
PD32
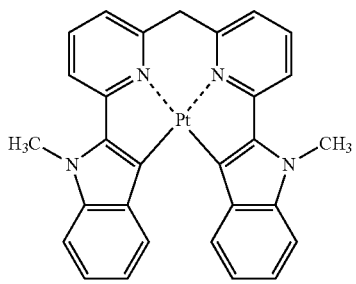

-continued
PD33
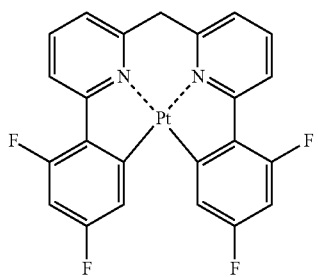
PD34
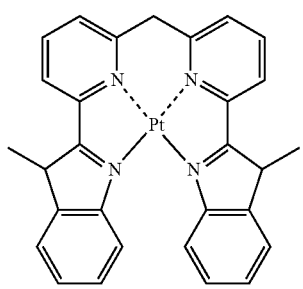
PD35
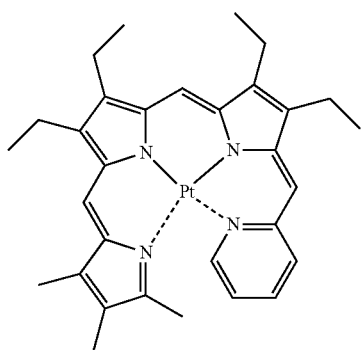
PD36
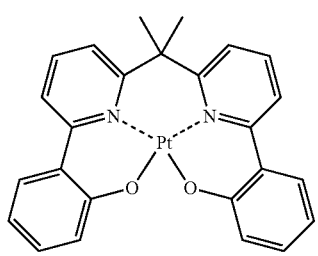
PD37
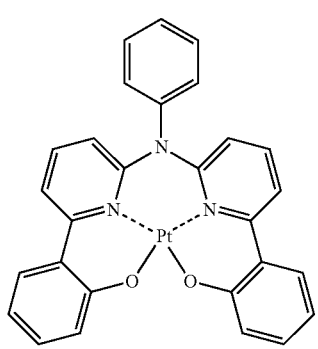
-continued
PD38
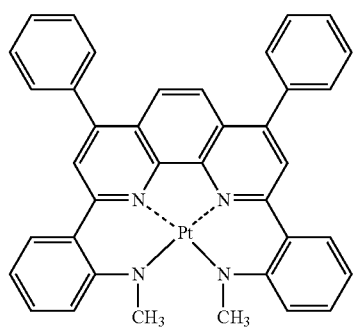
PD39
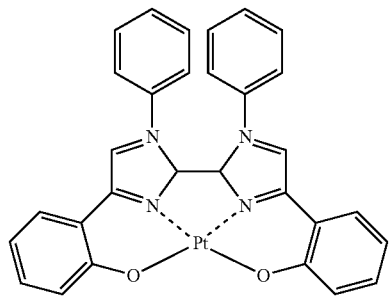
PD40
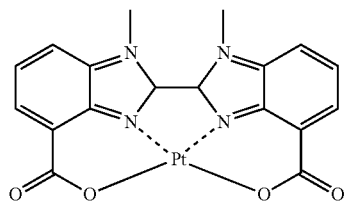
PD41
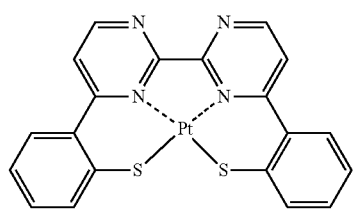
PD42
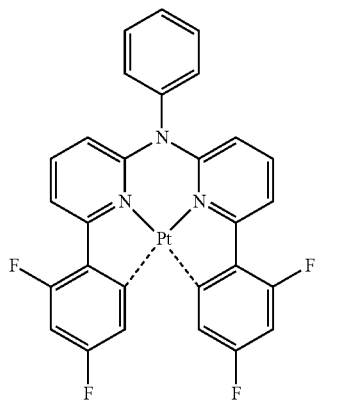

PD43 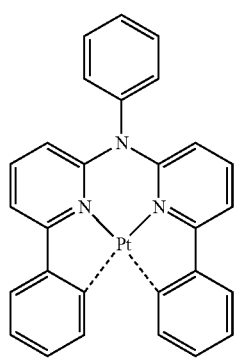
PD44 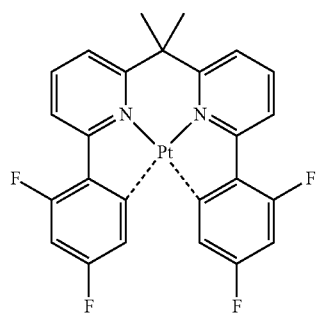
PD45 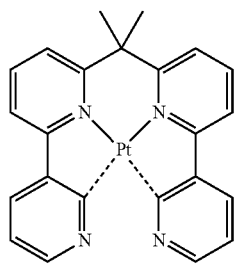
PD46 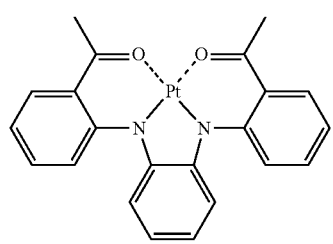
PD47 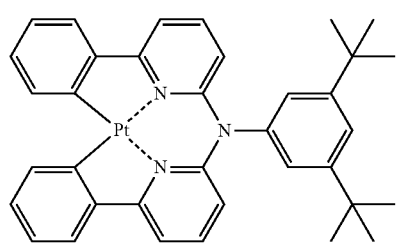
PD48 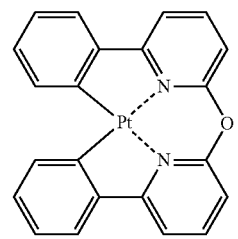
PD49 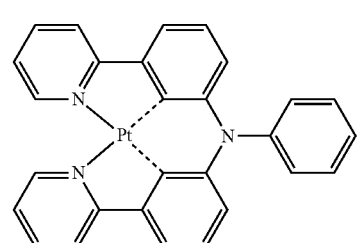
PD50 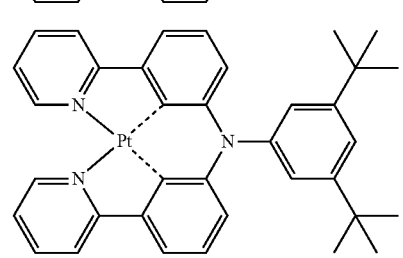
PD51 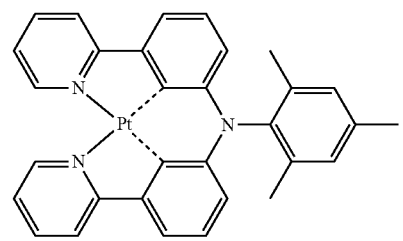
PD52 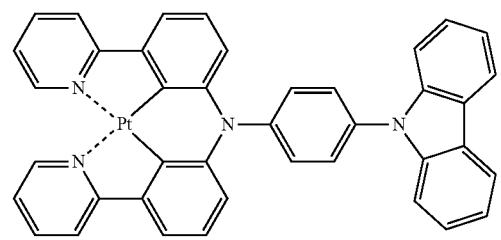
PD53 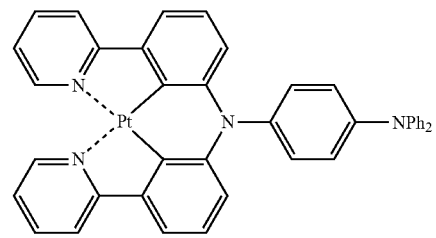

PD54
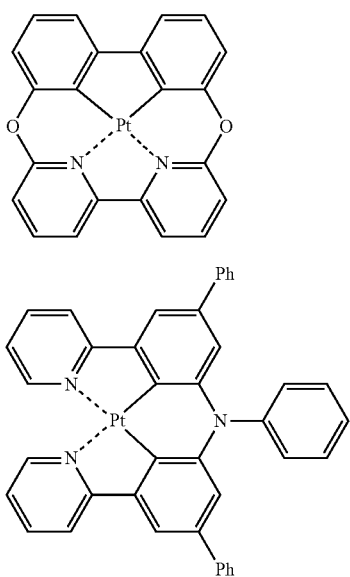
PD55
PD56
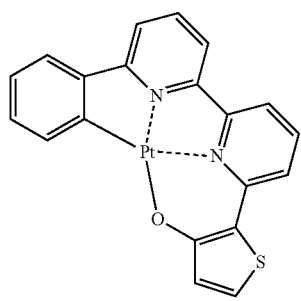
PD57
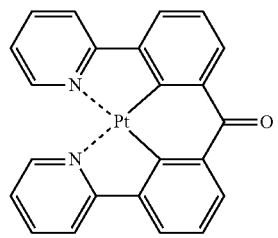
PD58
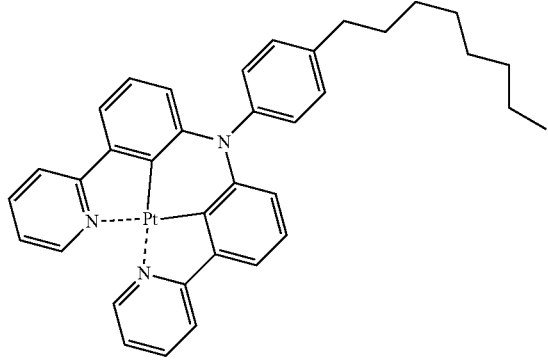
PD59
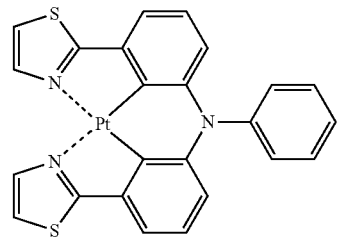
PD60
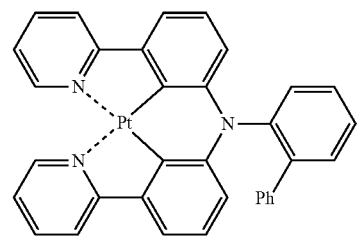
PD61
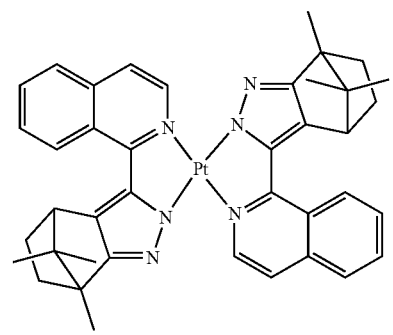
PD62
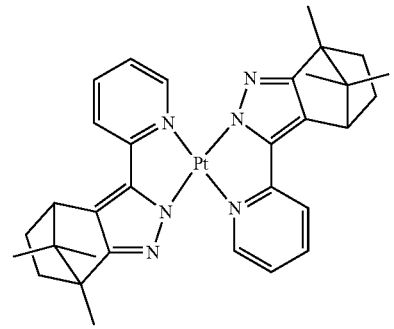
PD63
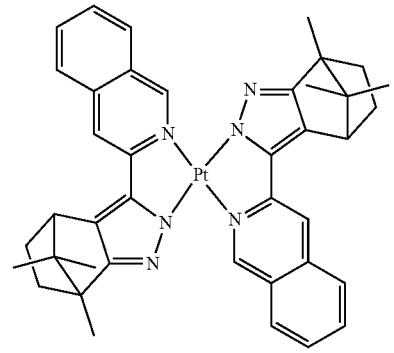

-continued
PD64
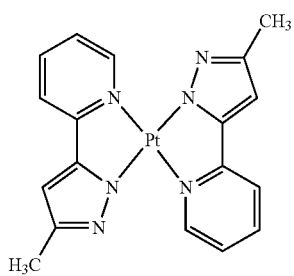
PD65
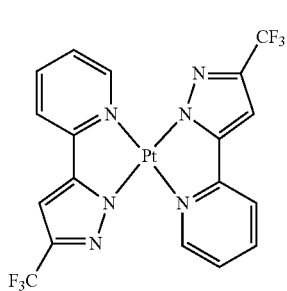
PD66
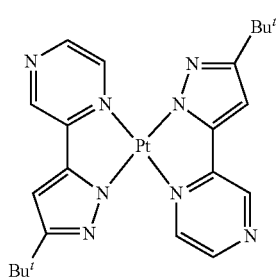
PD67
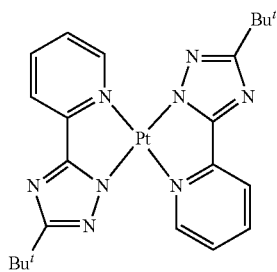
PD68
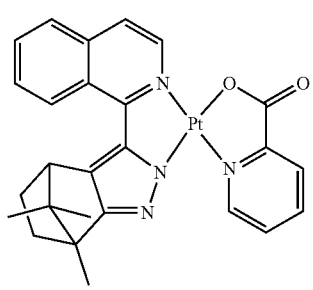
-continued
PD69
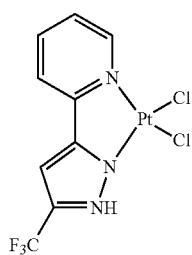
PD70
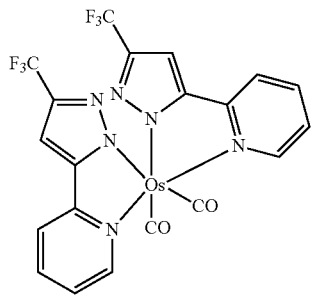
PD71
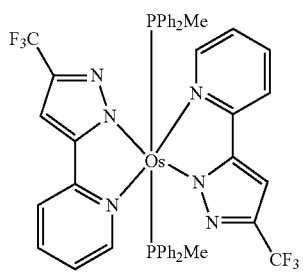
PD72
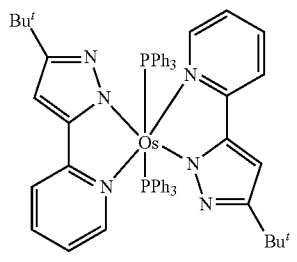
PD73
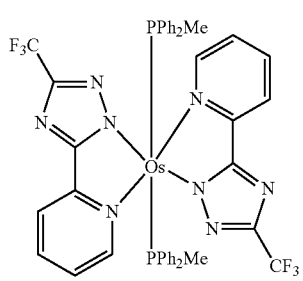
PD74

PD75

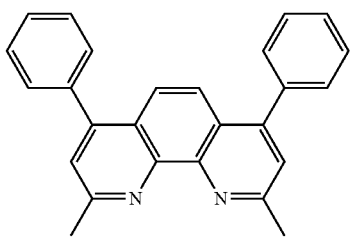

BCP

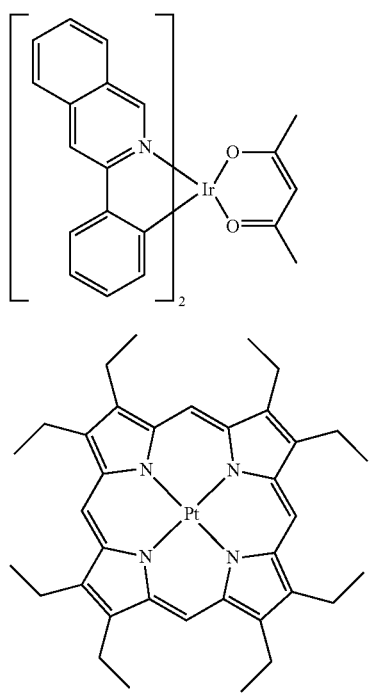

PD76

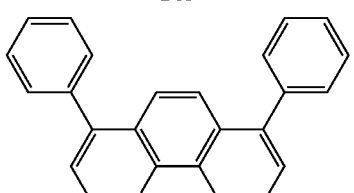

Bphen

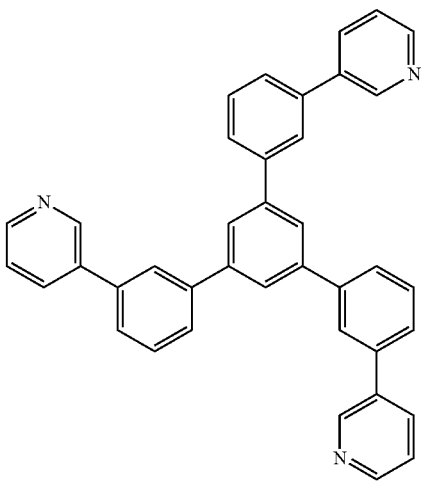

TmPyPB

In an implementation, an amount of the dopant included in the emission layer may be, e.g., about 0.01 to about 15 parts by weight, based on 100 parts by weight of the host.

A thickness of the emission layer may be about 100 Å to about 1,000 Å, e.g., 200 Å to about 600 Å. When the thickness of the emission layer is within these ranges, excellent emission characteristics may be obtained without a substantial increase in driving voltage.

The electron transport region may include at least one of an HBL, an ETL, and an EBL.

For example, the electron transport region may have a structure of ETL/EIL or a structure of HBL/ETL/EIL, each of which layers are sequentially stacked in the stated order from the emission layer.

The electron transport region may include an HBL. When the emission layer includes a phosphorescent dopant, the HBL may be formed to help prevent diffusion of triplet excitons or holes into an ETL.

When the electron transport region includes an HBL, the HBL may be formed on the emission layer by using various methods, e.g., vacuum deposition, spin coating, casting, LB deposition, ink-jet printing, laser-printing, or LITI. When the HBL is formed by vacuum deposition and spin coating, deposition and coating conditions for forming the HBL may be determined by referring to the deposition and coating conditions for forming the HIL.

The HBL may include, e.g., at least one of bathocuproine (BCP), 4,7-diphenyl-1,10-phenanthroline (Bphen), and 3,3'-[5'-[3-(3-pyridinyl)phenyl][1,1':3',1''-terphenyl]-3,3''-diyl]bispyridine (TmPyPB) below, but is not limited thereto.

A thickness of the HBL may be in a range of about 20 Å to about 1,000 Å, e.g., about 30 Å to about 300 Å. When the thickness of the HBL is within these ranges, excellent hole blocking characteristics may be obtained without a substantial increase in driving voltage.

The electron transport region may include an ETL. The ETL may be formed on the emission layer or on the HBL by using various methods, e.g., vacuum deposition, spin coating, casting, LB deposition, ink-jet printing, laser-printing, or LITI. When the ETL is formed by vacuum deposition and spin coating, deposition and coating conditions for forming the ETL may be determined by referring to the deposition and coating conditions for forming the HIL.

The electron transport layer may further include at least one of, e.g., BCP, Bphen above, and Alq$_3$, bis(2-methyl-8-quinolinolato)(4-phenylphenolato)aluminum (III) (Balq), 3-(4-biphenylyl)-4-phenyl-5-(4-tert-butylphenyl)-1,2,4-triazole (TAZ), and 4-(naphthalen-1-yl)-3,5-diphenyl-4H-1,2,4-triazole (NTAZ) below.

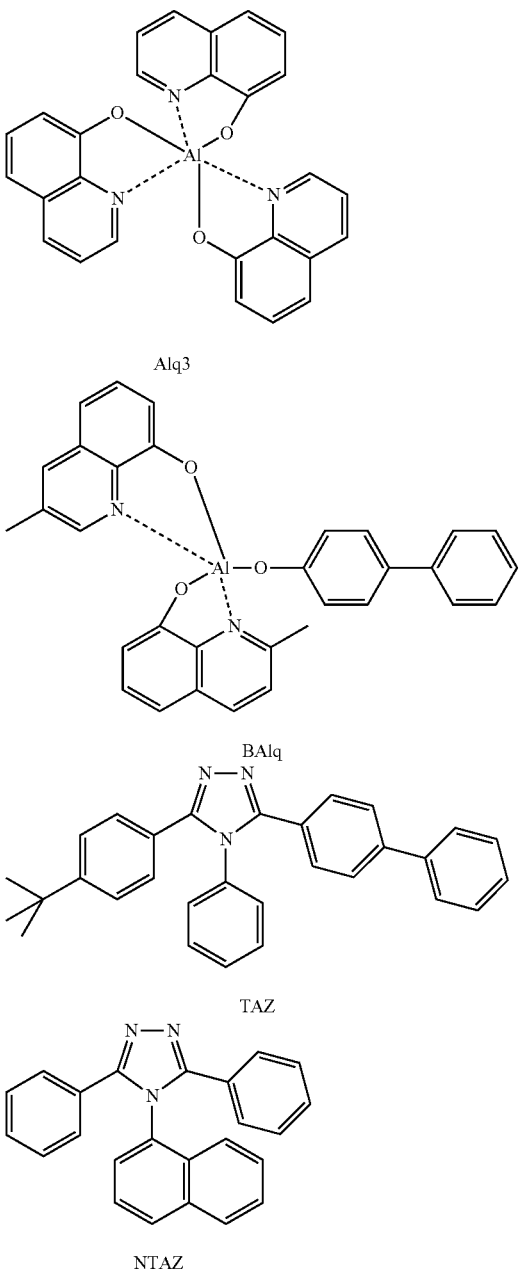

Alq3

BAlq

TAZ

NTAZ

In an implementation, the ETL may include at least one of compounds represented by Formula 601 below:

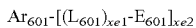 <Formula 601>

In Formula 601, $Ar_{601}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a $C_2$-$C_{60}$ monovalent non-aromatic condensed polycyclic group, and —Si($Q_{301}$)($Q_{302}$)($Q_{303}$), in which $Q_{301}$ to $Q_{303}$ may each independently be selected from a hydrogen atom, a $C_1$-$C_{60}$ alkyl group, a $C_2$-$C_{60}$ alkenyl group, a $C_6$-$C_{60}$ aryl group, and a $C_2$-$C_{60}$ heteroaryl group;

$L_{601}$ may be understood by referring to the description provided in connection with $L_{201}$;

$E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a triazolyl group, an isothiazolyl group, an oxazolyl group, an isoxazolyl group, a pyridyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 may be selected from 0, 1, 2, and 3; and
xe2 may be selected from 1, 2, 3, and 4.

In an implementation, the ETL may include at least one of compounds represented by Formula 602 below.

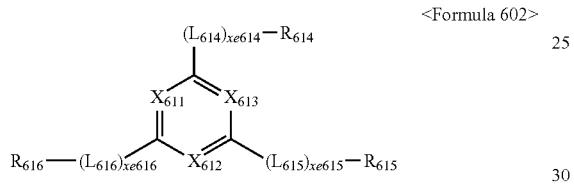

<Formula 602>

In Formula 602,
$X_{611}$ may be N or $C-(L_{611})_{xe611}-R_{611}$, $X_{612}$ may be N or $C-(L_{612})_{xe612}-R_{612}$, and
$X_{613}$ may be N or $C-(L_{613})_{xe613}-R_{613}$, and at least one of $X_{611}$ to $X_{613}$ may be N;
$L_{611}$ to $L_{616}$ may each independently be understood by referring to the description provided in connection with $L_{201}$;
$R_{611}$ to $R_{616}$ may each independently be selected from:
a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and
a phenyl group, a naphthyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium atom, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthryl group, a pyrenyl group, a chrysenyl group, a pyridyl group, a pyrazinyl group, a pyrimidinyl group, a pyridazinyl group, a quinolinyl group, an isoqui-nolinyl group, a quinoxalinyl group, a quinazolinyl group, a carbazolyl group and a triazinyl group; and xe611 to xe616 may each independently be selected from 0, 1, 2, and 3.

The compound represented by Formula 601 and the compound represented by Formula 602 may include at least one of Compounds ET1 to ET15 below.

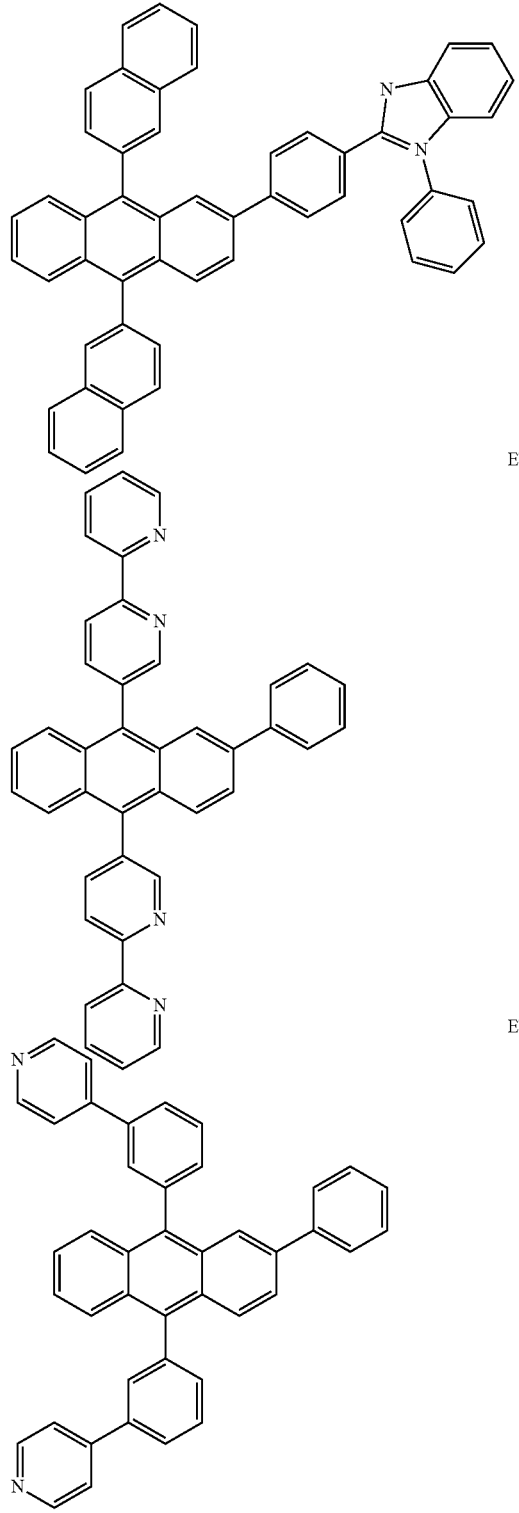

ET4
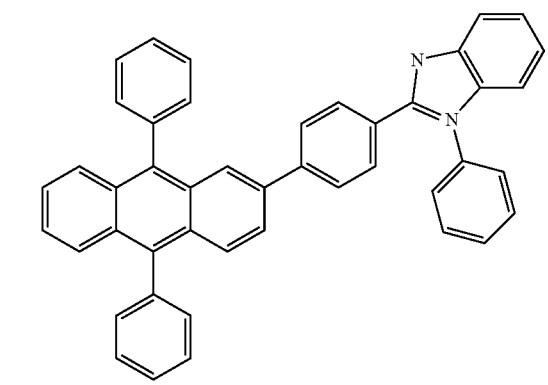
ET5
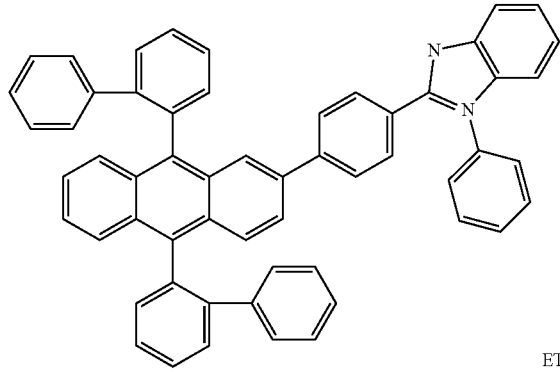
ET6
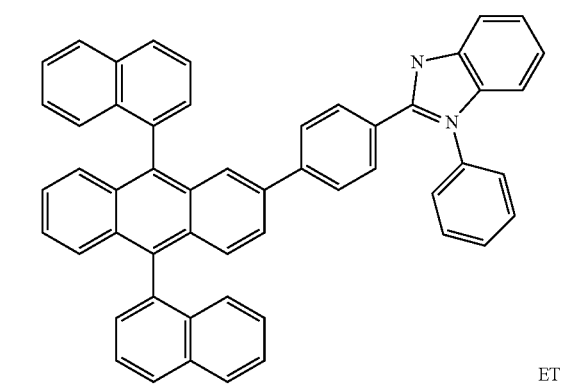
ET7
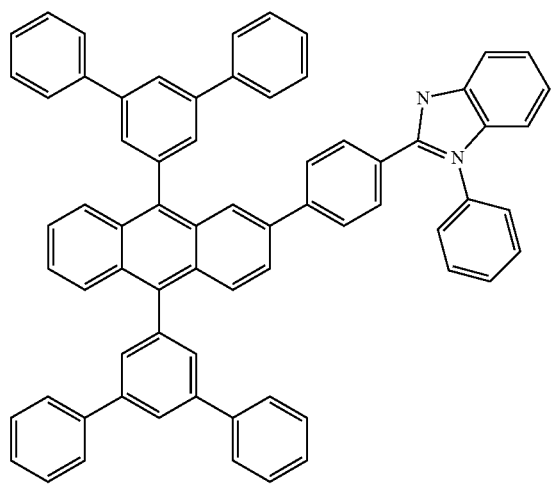
ET8
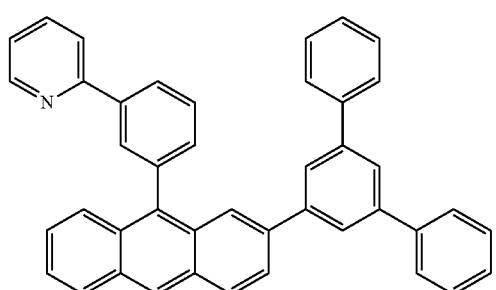
ET9
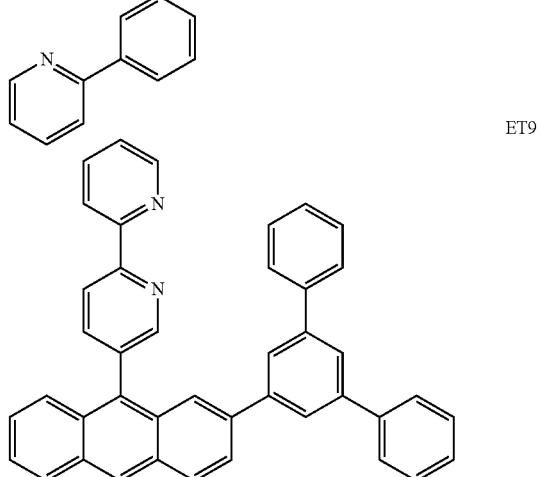
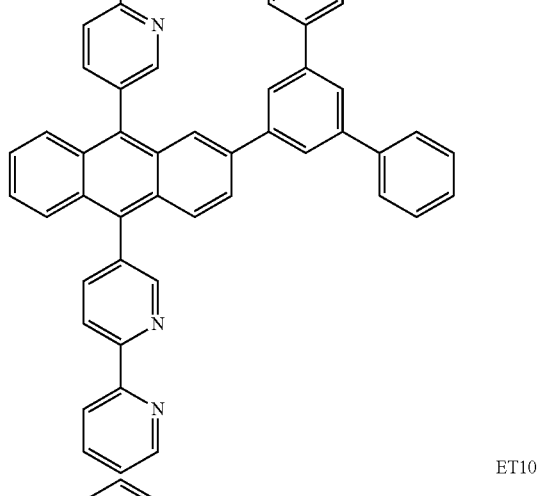
ET10
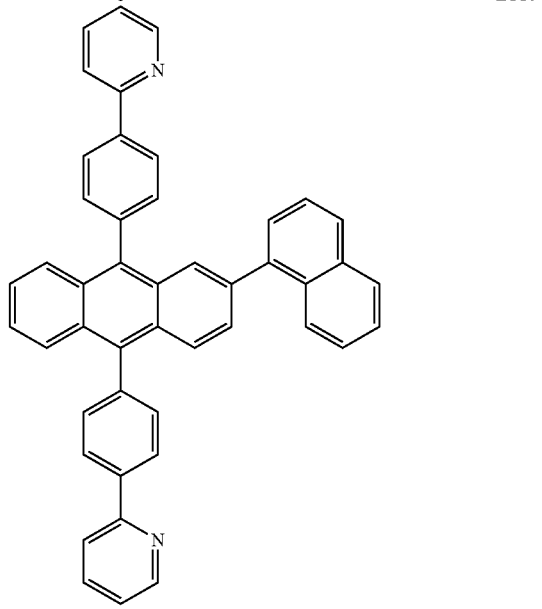

ET11

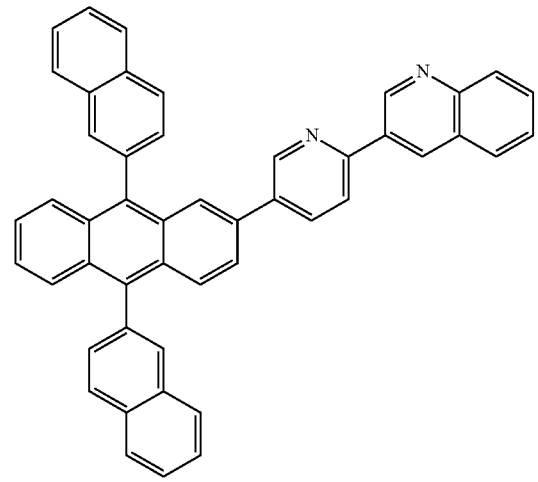

ET12

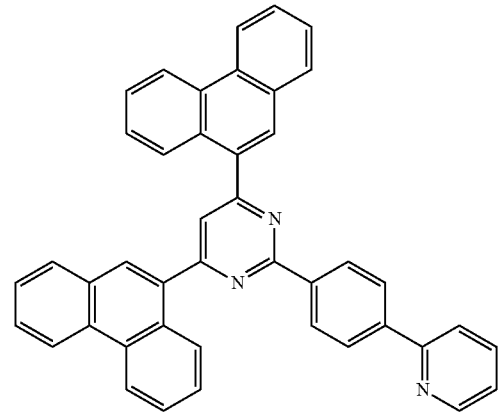

ET13

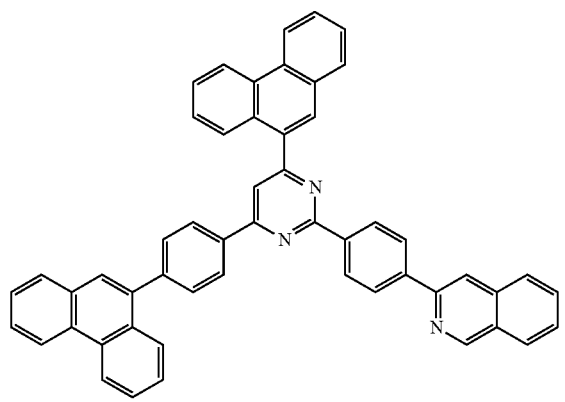

ET14

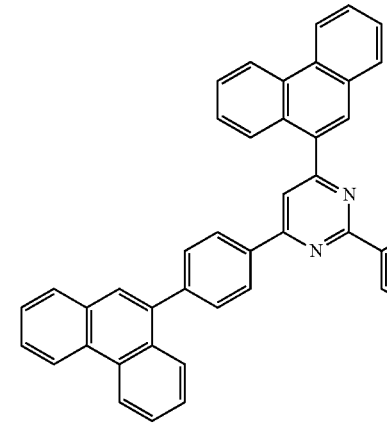

ET15

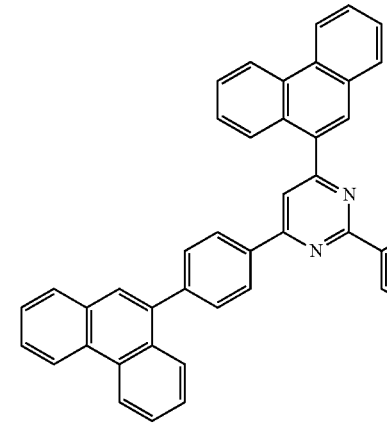

A thickness of the ETL may be in a range of about 100 Å to about 1,000 Å, e.g., about 150 Å to about 500 Å. When the thickness of the ETL is within these ranges, satisfactory electron transporting characteristics may be obtained without a substantial increase in driving voltage.

In an implementation, the ETL may further include a metal-containing material, in addition to the electron-transporting organic compounds described above.

The metal-containing material may include a Li complex. The Li complex may include, e.g., lithium quinolate (LiQ) or lithium[2-(2-hydroxyphenyl)benzothiazole] (LiBTz) below.

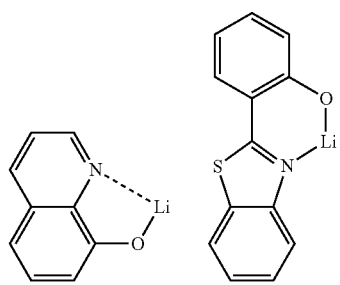

LiQ    LiBTz

In an implementation, the electron transport region may include an EIL that facilitates electron injection from the second electrode 190.

The EIL may include, e.g., at least one selected from LiF, NaCl, CsF, Li$_2$O, and BaO.

A thickness of the EIL may be in a range of about 1 Å to about 100 Å, e.g., about 3 Å to about 90 Å. When the thickness of the EIL is within these ranges, satisfactory electron injecting characteristics may be obtained without a substantial increase in driving voltage.

Layers or regions included in the organic layer 150 may be formed by using various methods, e.g., vacuum deposition, spin coating, casting, LB deposition, ink-jet printing, laser-printing, or LITI.

The second electrode 190 may be disposed on the organic layer 150. The second electrode 190 may be a cathode, and in this regard, a material for forming the second electrode 190 may be a material having a low work function, such as a metal, an alloy, an electrically conductive compound, or a mixture thereof. Examples of the material for forming the second electrode 190 may include lithium (Li), magnesium (Mg), aluminum (Al), aluminum-lithium (Al—Li), calcium (Ca), magnesium-indium (Mg—In), and magnesium-silver (Mg—Ag). In an implementation, to manufacture a top emission type light-emitting device, the material for forming the second electrode 190 may be ITO or IZO, and in this regard, the second electrode 190 may be a transmissive electrode or the like Herein, the organic light-emitting device 10 is referred to the description provided in connection with FIG. 1.

A $C_1$-$C_{60}$ alkyl group used herein refers to a linear or branched aliphatic hydrocarbon monovalent group having 1 to 60 carbon atoms, and detailed examples thereof are a methyl group, an ethyl group, an n-propyl group, an iso-propyl group, an n-butyl group, an iso-butyl group, a sec-butyl group, a tert-butyl group, a pentyl group, an iso-amyl group, and a hexyl group. A $C_1$-$C_{60}$ alkylene group used herein refers to a divalent group having the same structure as the $C_1$-$C_{60}$ alkyl group.

A $C_1$-$C_{60}$ alkoxy group used herein refers to a monovalent group represented by —OA$_{101}$ (herein A$_{101}$ is the $C_1$-$C_{60}$ alkyl group), and detailed examples thereof are a methoxy group, an ethoxy group, and an isopropyloxy group.

A $C_2$-$C_{60}$ alkenyl group used herein refers to a hydrocarbon group formed by substituting at least one carbon double bond in the middle or terminal of the $C_2$-$C_{60}$ alkyl group, and detailed examples thereof are an ethenyl group, a prophenyl group, and a butenyl group. A $C_2$-$C_{60}$ alkenylene group used herein refers to a divalent group having the same structure as the $C_2$-$C_{60}$ alkenyl group.

A $C_2$-$C_{60}$ alkynyl group used herein refers to a hydrocarbon group formed by substituting at least one carbon triple bond in the middle or terminal of the $C_2$-$C_{60}$ alkyl group, and detailed examples thereof are an ethynyl group and a propynyl group. A $C_2$-$C_{60}$ alkynylene group used herein refers to a divalent group having the same structure as the $C_2$-$C_{60}$ alkynyl group.

A $C_3$-$C_{10}$ cycloalkyl group used herein refers a monovalent hydrocarbon monocyclic group having 3 to 10 carbon atoms, and detailed examples thereof are a cyclopropyl group, a cyclobutyl group, a cyclopentyl group, a cyclohexyl group, and a cycloheptyl group. A $C_3$-$C_{10}$ cycloalkylene group used herein refers to a divalent group having the same structure as the $C_3$-$C_{10}$ cycloalkyl group.

A $C_1$-$C_{10}$ heterocycloalkyl group used herein refers to a monovalent monocyclic group having at least one heteroatom selected from N, O, P, and S as a ring-forming atom and 1 to 10 carbon atoms, and detailed examples thereof are a tetrahydrofuranyl group and a tetrahydrothiophenyl group.

A $C_1$-$C_{10}$ heterocycloalkylene group used herein refers to a divalent group having the same structure as the $C_1$-$C_{10}$ heterocycloalkyl group.

A $C_3$-$C_{10}$ cycloalkenyl group used herein refers to a monovalent monocyclic group that has 3 to 10 carbon atoms and at least one double bond in the ring thereof and does not have aromaticity, and detailed examples thereof are a cyclopentenyl group, a cyclohexenyl group, and a cycloheptenyl group. A $C_3$-$C_{10}$ cycloalkenylene group used herein refers to a divalent group having the same structure as the $C_3$-$C_{10}$ cycloalkenyl group.

A $C_1$-$C_{10}$ heterocycloalkenyl group used herein refers to a monovalent monocyclic group that has at least one heteroatom selected from N, O, P, and S as a ring-forming atom, 1 to 10 carbon atoms, and at least one double bond in its ring. Detailed examples of the $C_1$-$C_{10}$ heterocycloalkenyl group are a 2,3-hydrofuranyl group and a 2,3-hydrothiophenyl group. A $C_1$-$C_{20}$ heterocycloalkenylene group used herein refers to a divalent group having the same structure as the $C_1$-$C_{10}$ heterocycloalkenyl group.

A $C_6$-$C_{60}$ aryl group used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Detailed examples of the $C_6$-$C_{60}$ aryl group are a phenyl group, a naphthyl group, an anthryl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_1$-$C_{60}$ heteroaryl group used herein refers to a monovalent group having a carbocyclic aromatic system that has at least one heteroatom selected from N, O, P, and S as a ring-forming atom, and 1 to 60 carbon atoms. A $C_1$-$C_{60}$ heteroarylene group used herein refers to a divalent group having a carbocyclic aromatic system that has at least one heteroatom selected from N, O, P, and S as a ring-forming atom, and 1 to 60 carbon atoms. Detailed examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

A $C_6$-$C_{60}$ aryloxy group used herein indicates —OA$_{102}$ (wherein A$_{102}$ is the $C_6$-$C_{60}$ aryl group), and a $C_6$-$C_{60}$ arylthio group used herein indicates —SA$_{103}$ (wherein A$_{103}$ is the $C_6$-$C_{60}$ aryl group).

A monovalent non-aromatic condensed polycyclic group used herein refers to a monovalent group that has two or more rings condensed to each other, has carbon atoms only as a ring-forming atom, and has non-aromacity in the entire molecular structure. A detailed example of the monovalent non-aromatic condensed polycyclic group is a fluorenyl group. A divalent non-aromatic condensed polycyclic group used herein refers to a divalent group having the same structure as the monovalent non-aromatic condensed polycyclic group.

A monovalent non-aromatic condensed heteropolycyclic group used herein refers to a monovalent group that has two or more rings condensed to each other, has heteroatoms as a ring-forming atom selected from N, O, P, and S, in addition to C, and has non-aromacity in the entire molecular structure. A detailed example of the monovalent non-aromatic condensed heteropolycyclic group is a carbazolyl group. A divalent non-aromatic condensed heteropolycyclic group used herein refers to a divalent group having the same structure as the monovalent non-aromatic condensed heteropolycyclic group.

Q groups, where not otherwise described, may be understood by referring to descriptions of other Q groups.

Hereinafter, an organic light-emitting device according to embodiments is described in detail with reference to Examples, (Compounds below are those used in organic light-emitting devices prepared according to Examples).

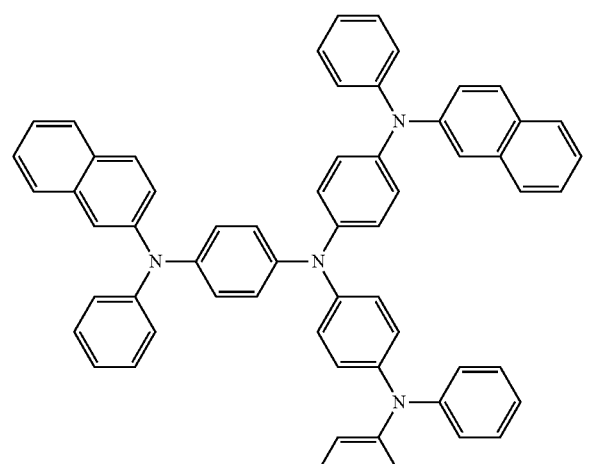

2-TNATA

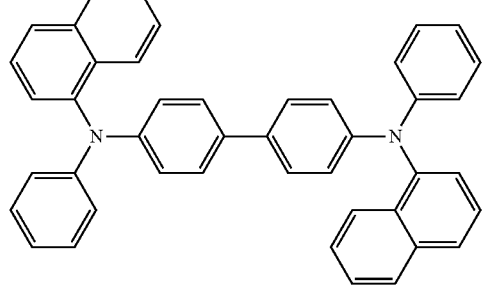

NPB

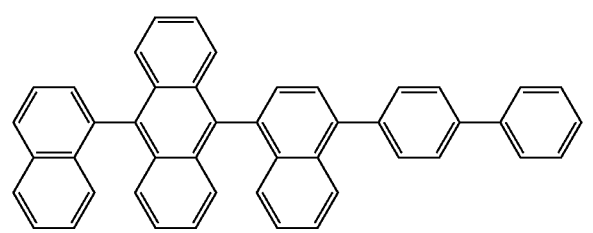

1-5

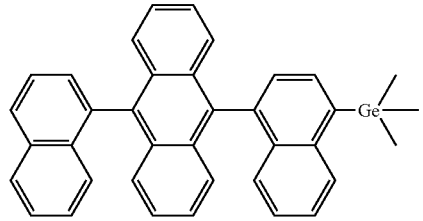

1-22

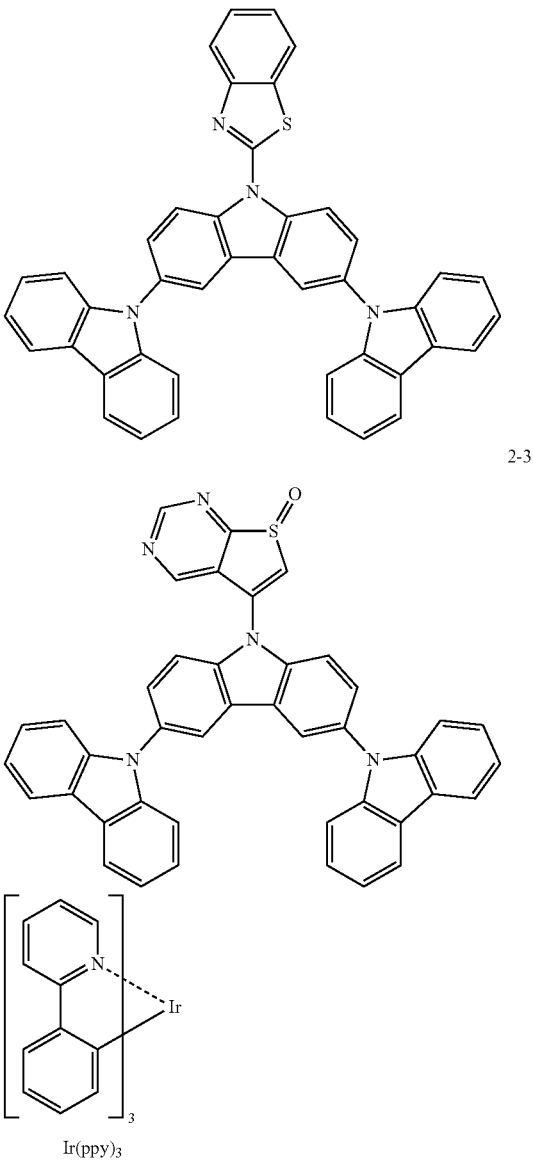

Alq3

The following Examples and Comparative Examples are provided in order to highlight characteristics of one or more embodiments, but it will be understood that the Examples and Comparative Examples are not to be construed as limiting the scope of the embodiments. Further, it will be understood that the embodiments are not limited to the particular details described in the Examples and Comparative Examples.

Example 1

A glass substrate to which an ITO anode was formed (available by Corning company) having a surface resistance of 15Ω/□ (500 Å) was prepared, sonicated by using isopropyl alcohol and pure water each for 10 minutes, and cleansed by the exposure to UV ozone for 10 minutes. Then, 2-TNATA was vacuum deposited on the ITO anode of the glass substrate to form a hole injection layer having a thickness of 600 Å. NPB was vacuum deposited on the HIL to form an HTL having a thickness of 300 Å.

Compound 1-5, Compound 2-1, and Ir(ppy)$_3$ were co-deposited on the HTL at a weight ratio of 75:15:10 to form an emission layer having a thickness of 400 Å. Alq$_3$ was deposited on the emission layer to form an ETL having a thickness of 300 Å. Alq$_3$ was vacuum deposited on the ETL to form a cathode having a thickness of 1,200 Å, thereby manufacturing an organic light-emitting device.

Example 2

An organic light-emitting device was manufactured in the same manner as in Example 1, except that in forming the emission layer, the weight ratio of Compound 1-5, Compound 2-1, and Ir(ppy)$_3$ was 65:25:10 instead of 75:15:10.

Example 3

An organic light-emitting device was manufactured in the same manner as in Example 1, except that in forming the emission layer, a weight ratio of Compound 1-5, Compound 2-3, and Ir(ppy)$_3$ was 70:20:10.

Example 4

An organic light-emitting device was manufactured in the same manner as in Example 3, except that in forming the emission layer, the weight ratio of the Compound 1-5, Compound 2-3, and Ir(ppy)$_3$ was 60:30:10 instead of 70:20:10.

Example 5

An organic light-emitting device was manufactured in the same manner as in

Example 1, except that in forming the emission layer, a weight ratio of Compound 1-22, Compound 2-1, and Ir(ppy)$_3$ was 30:60:10.

Example 6

An organic light-emitting device was manufactured in the same manner as in Example 5, except that in forming the emission layer, the weight ratio of Compound 1-22, Compound 2-1, and Ir(ppy)$_3$ was 20:70:10 instead of 30:60:10.

Example 7

An organic light-emitting device was manufactured in the same manner as in Example 1, except that in forming the emission layer, a weight ratio of Compound 1-22, Compound 2-3, and Ir(ppy)$_3$ was 30:60:10.

Example 8

An organic light-emitting device was manufactured in the same manner as in Example 7, except that in forming the emission layer, the weight ratio of Compound 1-22, Compound 2-3, and Ir(ppy)$_3$ was 20:70:10 instead of 30:60:10.

Comparative Example 1

An organic light-emitting device was manufactured in the same manner as in Example 1, except that in forming the emission layer, a weight ratio of Compound 1-5 and Ir(ppy)$_3$ was 90:10.

Comparative Example 2

An organic light-emitting device was manufactured in the same manner as in Example 1, except that in forming the emission layer, a weight ratio of Compound 1-22 and Ir(ppy)$_3$ was 90:10.

Comparative Example 3

An organic light-emitting device was manufactured in the same manner as in Example 1, except that in forming the emission layer, a weight ratio of Compound 2-1 and Ir(ppy)$_3$ was 90:10.

Comparative Example 4

An organic light-emitting device was manufactured in the same manner as in Example 1, except that in forming the emission layer, a weight ratio of Compound 2-3 and Ir(ppy)$_3$ was 90:10.

Measurement Data

The organic light-emitting devices prepared according to Examples 1 to 8 and Comparative Examples 1 to 4 were evaluated in terms of current density, current efficiency, and lifespan ($T_{90}$) characteristics, and obtained data were analyzed by an IVL measuring device (PhotoResearch PR650, Keithley 238). The lifespan $T_{90}$ data were obtained upon operation, when luminance of the organic light-emitting device reached 90% with respect to initial luminance 100% (at 9,000 nit).

TABLE 1

|  | First compound | Second compound | Dopant | Ratio | Current density [mA/cm$^2$] | Current efficiency [cd/A] | Lifespan [h] |
| --- | --- | --- | --- | --- | --- | --- | --- |
| Example 1 | 1-5 | 2-1 | Ir(ppy)$_3$ | 75:15:10 | 8 | 41.3 | 121 |
| Example 2 | 1-5 | 2-1 | Ir(ppy)$_3$ | 65:25:10 | 8 | 43.2 | 115 |
| Example 3 | 1-5 | 2-3 | Ir(ppy)$_3$ | 70:20:10 | 8 | 39.3 | 128 |
| Example 4 | 1-5 | 2-3 | Ir(ppy)$_3$ | 60:30:10 | 8 | 34.9 | 112 |
| Example 5 | 1-22 | 2-1 | Ir(ppy)$_3$ | 30:60:10 | 8 | 39.3 | 89 |

TABLE 1-continued

| | First compound | Second compound | Dopant | Ratio | Current density [mA/cm$^2$] | Current efficiency [cd/A] | Lifespan [h] |
|---|---|---|---|---|---|---|---|
| Example 6 | 1-22 | 2-1 | Ir(ppy)$_3$ | 20:70:10 | 8 | 41.3 | 103 |
| Example 7 | 1-22 | 2-3 | Ir(ppy)$_3$ | 30:60:10 | 8 | 31.2 | 67 |
| Example 8 | 1-22 | 2-3 | Ir(ppy)$_3$ | 20:70:10 | 8 | 30.4 | 88 |
| Comparative Example 1 | 1-5 | — | Ir(ppy)$_3$ | 90:10 | 8 | 16.9 | 13 |
| Comparative Example 2 | 1-22 | — | Ir(ppy)$_3$ | 90:10 | 8 | 9.8 | 6 |
| Comparative Example 3 | — | 2-1 | Ir(ppy)$_3$ | 90:10 | 8 | 13.5 | 10 |
| Comparative Example 4 | — | 2-3 | Ir(ppy)$_3$ | 90:10 | 8 | 6.7 | 23 |

Referring to the data of Table 1 above, in comparison with the organic light-emitting devices of Comparative Examples 1 to 4 (including the first compound or the second compound), it may be that the organic light-emitting devices of Examples 1 to 8 (including the first compound and the second compound at the same time) had longer lifespan characteristics.

For example, the simultaneous use of the first compound and the second compound, as a host, may overcome drawbacks of each of these compounds (e.g., individually) while creating a synergy effects therebetween. Thus, the simultaneous use of the first compound and the second compound, as a host included in the emission layer, may relieve electron-induced stress in the emission layer and accordingly, may help improve a lifespan of the organic light-emitting device and a balance between the electrons and the holes, resulting in the achievement of a high efficiency of the organic light-emitting device.

As described above, according to the one or more of the above exemplary embodiments, use of a first compound represented by Formula 1 and a second compound represented by Formula 2 (e.g., as a host along with a dopant) in an emission layer may provide an organic light-emitting device having improved efficiency and lifespan characteristics.

The embodiments may provide an organic light-emitting device having improved efficiency and lifespan characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic light-emitting device, comprising:
a first electrode;
a second electrode facing the first electrode; and
an organic layer between the first electrode and the second electrode, the organic layer including an emission layer, wherein the organic layer includes:
a first compound represented by Formula 1, below, and
a second compound represented by Formula 2, below, <Formula 1>

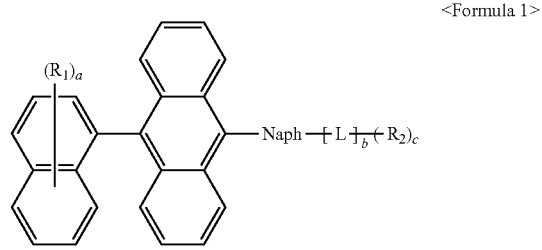

<Formula 2>

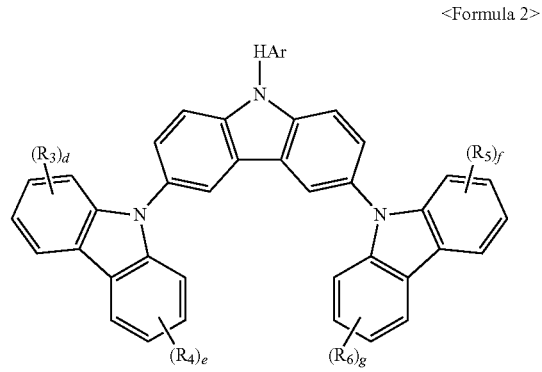

wherein, in Formulae 1 and 2,
Naph is a naphthylene group,
L is a C$_6$-C$_{40}$ arylene group or a C$_1$-C$_{40}$ heteroarylene group,
HAr is a group represented by one of Formulae 3 and 4 below, <Formula 3>

<Formula 4>

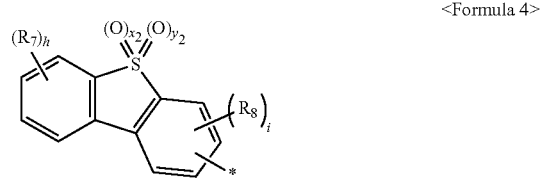

wherein, $X_1$ and $X_2$ are each independently N or C—*, and at least one of $X_1$ and $X_2$ is C—*, $X_3$ and $X_4$ are each independently N or CH, $x_1$ and $y_1$ are each independently 0 or 1, $x_2$ and $y_2$ are each independently 0 or 1, $R_1$ to $R_8$ are each independently selected from a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{40}$ aryl group, a substituted or unsubstituted $C_1$-$C_{40}$ heteroaryl group, a substituted or unsubstituted $C_5$-$C_{40}$ aryloxy group, a substituted or unsubstituted $C_5$-$C_{40}$ arylthio group, a substituted or unsubstituted $C_6$-$C_{40}$ monovalent non-aromatic condensed polycyclic group, a substituted or unsubstituted $C_6$-$C_{40}$ monovalent non-aromatic heterocondensed polycyclic group, —N($Q_1$)($Q_2$), —P(=O)($Q_3$)($Q_4$), —Si($Q_5$)($Q_6$)($Q_7$), and —Ge($Q_5$)($Q_6$)($Q_7$), in which $Q_1$ to $Q_4$ are each independently a hydrogen atom or a $C_6$-$C_{40}$ aryl group, and $Q_5$, $Q_6$, and $Q_7$ are each independently a hydrogen atom, a $C_1$-$C_{20}$ alkyl group, or a $C_6$-$C_{40}$ aryl group;

at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{40}$ aryl group, the substituted $C_1$-$C_{40}$ heteroaryl group, the substituted $C_5$-$C_{40}$ aryloxy group, the substituted $C_5$-$C_{40}$ arylthio group, the substituted $C_6$-$C_{40}$ monovalent non-aromatic condensed polycyclic group, and the substituted $C_6$-$C_{40}$ monovalent non-aromatic heterocondensed polycyclic group is selected from:

a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{40}$ aryl group, a $C_1$-$C_{40}$ heteroaryl group, a $C_5$-$C_{40}$ aryloxy group, a $C_5$-$C_{40}$ arylthio group, a monovalent $C_6$-$C_{40}$ non-aromatic condensed polycyclic group, a monovalent $C_6$-$C_{40}$ non-aromatic heterocondensed polycyclic group, and —Si($Q_{11}$)($Q_{12}$)($Q_{13}$), in which $Q_{11}$ to $Q_{13}$ are each independently a hydrogen atom, a $C_1$-$C_{20}$ alkyl group, or a $C_6$-$C_{40}$ aryl group, a is an integer of 0 to 7, b is an integer of 0 to 2, c is an integer of 1 to 3, d to h are each independently an integer of 0 to 4, i is an integer of 0 to 3, and

* represents a binding site to a neighboring atom.

2. The organic light-emitting device as claimed in claim 1, wherein L in Formula 1 is selected from:

a phenylene group, a naphthylene group, a phenanthrenylene group, and an anthrylene group; and a phenylene group, a naphthyl group, a phenanthrenyl group, and an anthryl group, each substituted with at least one of a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, $C_1$-$C_{10}$ alkoxy group, a phenyl group, a naphthyl group, a phenanthrenyl group, an anthryl group, and —Si($Q_{21}$)($Q_{22}$)($Q_{23}$), in which $Q_{21}$ to $Q_{23}$ are each independently a hydrogen atom, a $C_1$-$C_{20}$ alkyl group, or a $C_6$-$C_{40}$ aryl group.

3. The organic light-emitting device as claimed in claim 1, wherein L in Formula 1 is a group represented by Formula 4 Å below:

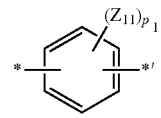

4A wherein, in Formula 4A,

* and *' represent binding sites to neighboring atoms, $p_1$ is an integer of 0 to 4, and $Z_{11}$ is at least one selected from:

a deuterium atom, a halogen atom, a methyl group, an ethyl group, a propyl group, a phenyl group, a naphthyl group, a phenanthrenyl group, an anthryl group, and —Si($Q_{21}$)($Q_{22}$)($Q_{23}$), in which $Q_{21}$ to $Q_{23}$ are each independently a hydrogen atom, a $C_1$-$C_{20}$ alkyl group, or a $C_6$-$C_{40}$ aryl group; and a methyl group, an ethyl group, a propyl group, a phenyl group, a naphthyl group, a phenanthrenyl group, an anthryl group, and —Si($Q_{21}$)($Q_{22}$)($Q_{23}$), each substituted with at least one of a deuterium atom and a halogen atom.

4. The organic light-emitting device as claimed in claim 1, wherein L in Formula 1 is a group represented by any one of Formulae 5A to 5E below, in which * and *' represent binding sites to neighboring atoms:

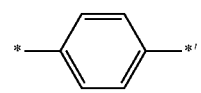

5A

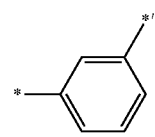

5B

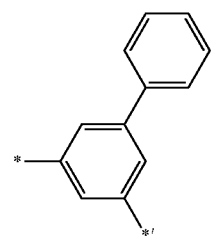

5C

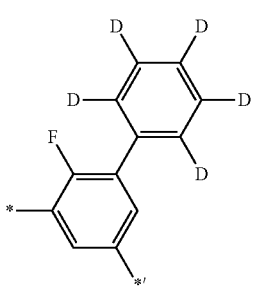

5D

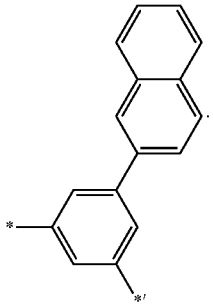

5E

5. The organic light-emitting device as claimed in claim 1, wherein HAr in Formula 2 is a group represented by any one of Formulae 6A to 6E below:

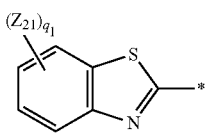
6A

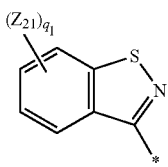
6B

6C

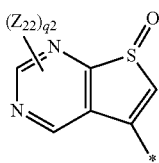
6D

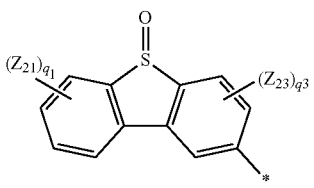
6E wherein, in Formulae 6A to 6E, $Z_{21}$ to $Z_{23}$ are each independently selected from a deuterium atom, a halogen atom, a $C_1$-$C_4$ alkyl group, a $C_6$-$C_{20}$ aryl group, a $C_1$-$C_{20}$ heteroaryl group, and —Si($Q_{31}$)($Q_{32}$)($Q_{33}$), in which $Q_{31}$ to $Q_{33}$ are each independently a hydrogen atom, a $C_1$-$C_{20}$ alkyl group, or a $C_6$-$C_{20}$ aryl group, q1 is an integer of 0 to 4, q2 is an integer of 1 or 2, q3 is an integer of 0 to 3, and

* represents a binding site to a neighboring atom.

6. The organic light-emitting device as claimed in claim 1, wherein HAr in Formula 2 is a group represented by any one of Formulae 7A to 7E below, in which * represents a binding site to a neighboring atom:

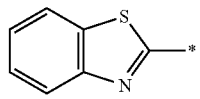
7A

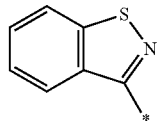
7B

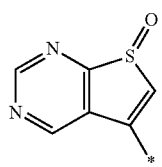
7C

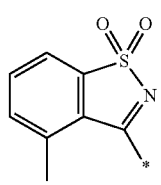
7D

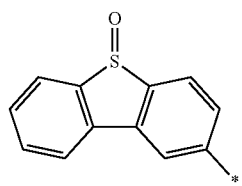
7E

7. The organic light-emitting device as claimed in claim 1, wherein $R_1$ to $R_8$ are each independently selected from:

a deuterium atom, a halogen atom, a hydroxyl group, a cyano group, a carboxylic acid or a salt thereof, a sulfonic acid or a salt thereof, a phosphoric acid or a salt thereof, a methyl group, an ethyl group, a propyl group, a butyl group, a pentyl group, a hexyl group, a heptyl group, an octyl group, a nonyl group, a decyl group, a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, —N($Q_1$)($Q_2$), —P(=O)($Q_3$)($Q_4$), —Si($Q_5$)($Q_6$)($Q_7$), and —Ge ($Q_5$)($Q_6$)($Q_7$), in which $Q_1$ to $Q_4$ are each independently a hydrogen atom or a $C_6$-$C_{40}$ aryl group, and $Q_5$, $Q_6$, and $Q_7$ are each independently a hydrogen atom, a $C_1$-$C_{20}$ alkyl group, or a $C_6$-$C_{40}$ aryl group;

a methyl group, an ethyl group, a propyl group, a butyl group, a pentyl group, a hexyl group, a heptyl group, an octyl group, a nonyl group, and a decyl group, each substituted with at least one of a deuterium atom, a halogen atom, a hydroxyl group, a cyano group, a carboxylic acid or a salt thereof, a sulfonic acid or a salt thereof, a phosphoric acid or a salt thereof, —Si($Q_{11}$)($Q_{12}$)($Q_{13}$), and —Ge($Q_{11}$)($Q_{12}$)($Q_{13}$), in which $Q_{11}$ to $Q_{13}$ are each independently a hydrogen atom, a $C_1$-$C_{20}$ alkyl group, or a $C_6$-$C_{40}$ aryl group; and a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, and a hexacenyl group, each substituted with at least one of a deuterium atom, a halogen atom, a hydroxyl group, a cyano group, a carboxylic acid or a salt thereof, a sulfonic acid or a salt thereof, a phosphoric acid or a salt thereof, a $C_1$-$C_{10}$ alkyl group, a $C_2$-$C_{10}$ alkenyl group, a $C_2$-$C_{10}$ alkynyl group, a $C_1$-$C_{10}$ alkoxy group, —Si($Q_{11}$)($Q_{12}$)($Q_{13}$), and —Ge($Q_{11}$)($Q_{12}$)($Q_{13}$), in which $Q_{11}$ to $Q_{13}$ are each independently a hydrogen atom, a $C_1$-$C_{10}$ alkyl group, or a $C_6$-$C_{20}$ aryl group.

8. The organic light-emitting device as claimed in claim 1, wherein:
$R_1$ to $R_8$ are each independently selected from a deuterium atom, a halogen atom, —Si($Q_5$)($Q_6$)($Q_7$), and —Ge($Q_5$)($Q_6$)($Q_7$), in which $Q_1$ to $Q_7$ are each independently a hydrogen atom, a $C_1$-$C_4$ alkyl group, or a $C_6$-$C_{10}$ aryl group, or
$R_1$ to $R_8$ are each independently a group represented by any one of Formulae 8A to 8C below:

8A

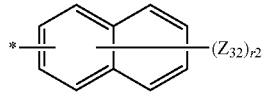

8B

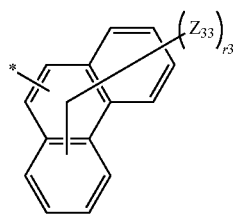

8C wherein, in Formulae 8A to 8C,
$Z_{31}$ to $Z_{33}$ are each independently selected from:
a deuterium atom, a halogen atom, a $C_1$-$C_{20}$ alkyl group, a $C_6$-$C_{40}$ aryl group, a $C_6$-$C_{40}$ monovalent non-aromatic condensed polycyclic group, —Si($Q_5$)($Q_6$)($Q_7$), and —Ge($Q_5$)($Q_6$)($Q_7$);
a $C_1$-$C_{20}$ alkyl group substituted with at least one of a deuterium atom and a halogen atom; and
a $C_6$-$C_{40}$ aryl group and a $C_6$-$C_{40}$ monovalent non-aromatic condensed polycyclic group, each substituted with at least one of a deuterium atom, a halogen atom, a $C_1$-$C_{20}$ alkyl group, and a $C_6$-$C_{20}$ aryl group;
r1 is an integer of 0 to 5,
r2 is an integer of 0 to 7,
r3 is an integer of 0 to 10, and
* represents a binding site to a neighboring atom.

9. The organic light-emitting device as claimed in claim 1, wherein:
$R_1$ to $R_8$ are each independently selected from a deuterium atom and a halogen atom, or
$R_1$ to $R_8$ are each independently a group represented by any one of Formulae 9A to 9J below:

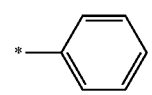

9A

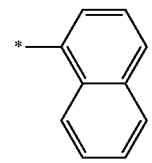

9B

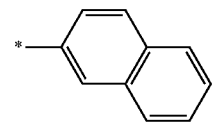

9C

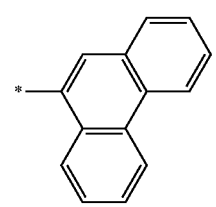

9D

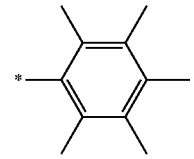

9E

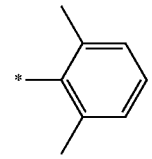

9F

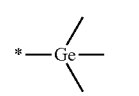

9G

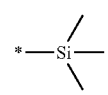

9H

-continued

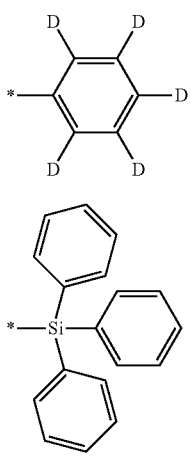

9I

9J wherein, in Formulae 9A to 9J, * represents a binding site to a neighboring atom.

10. The organic light-emitting device as claimed in claim 1, wherein:
   c is 1,
   a and b are each independently 0 or 1, and
   d, e, f, g, h, and i are each 0.

11. The organic light-emitting device as claimed in claim 1, wherein:
   $R_1$ and $R_2$ are each independently selected from:
      a deuterium atom, a halogen atom, a methyl group, a phenyl group, a naphthyl group, a phenanthrenyl group, —Si($Q_5$)($Q_6$)($Q_7$), and —Ge($Q_5$)($Q_6$)($Q_7$), in which $Q_1$ to $Q_4$ are each independently a hydrogen atom, a methyl group, or a phenyl group; and
      a phenyl group, a naphthyl group, and a pentalenyl group, each substituted with at least one of a deuterium atom, a halogen atom, and a methyl group;
   d, e, f, g, h, and i are each 0,
   L is selected from:
      a phenylene group; or
      a phenylene group and a naphthylene group, each substituted with at least one selected from a deuterium atom, a halogen atom, and a phenyl group.

12. The organic light-emitting device as claimed in claim 11, wherein HAr is a group represented by Formula 3.

13. The organic light-emitting device as claimed in claim 11, wherein:
   HAr is a group represented by Formula 4,
   $x_2$ is 1,
   and $y_2$ is 0.

14. The organic light-emitting device as claimed in claim 1, wherein the first compound represented by Formula 1 is one of Compounds 1-1 to 1-36 below:

1-1

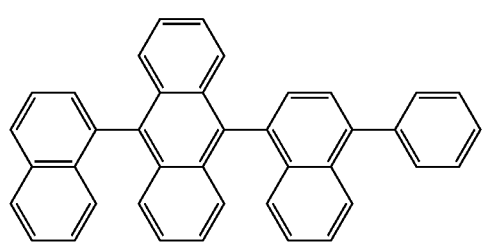

-continued 1-2

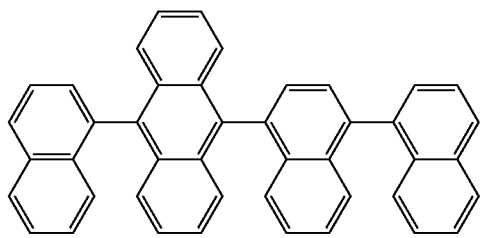

1-3

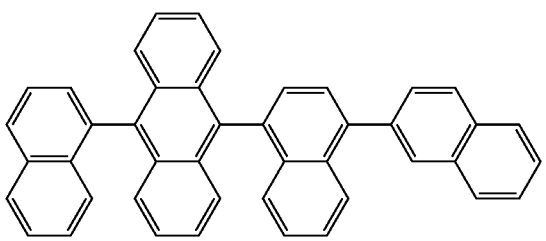

1-4

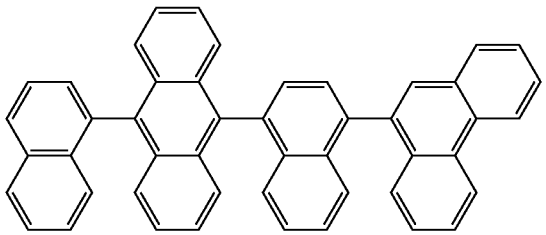

1-5

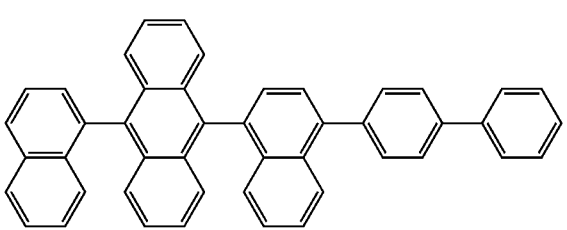

1-6

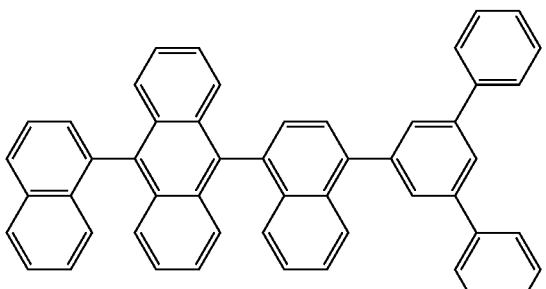

1-7

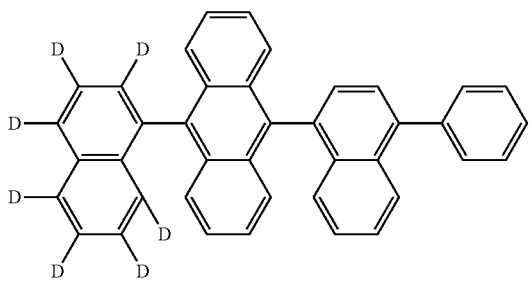

| 1-8 | 1-13 |
| 1-9 | 1-14 |
| 1-10 | 1-15 |
| 1-11 | 1-16 |
| 1-12 | 1-17 |

-continued
1-18
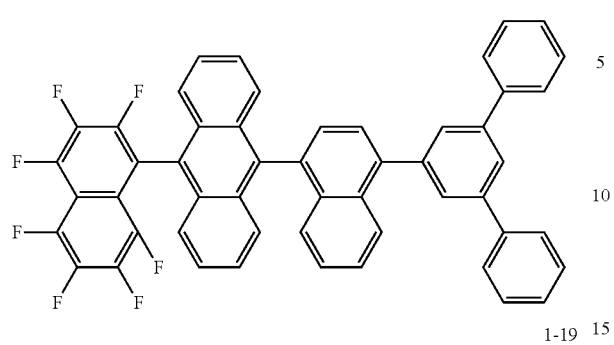
1-19
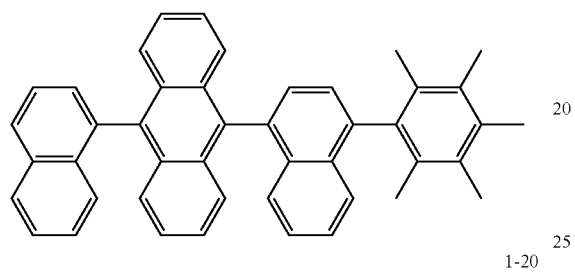
1-20
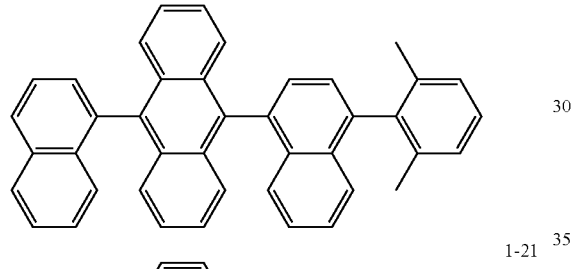
1-21
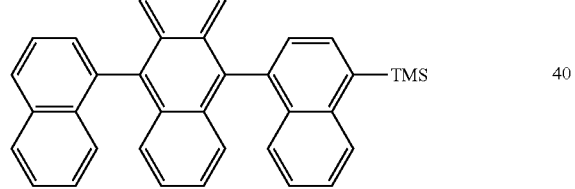
1-22
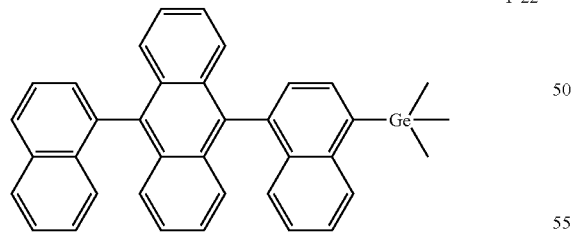
1-23
-continued
1-24
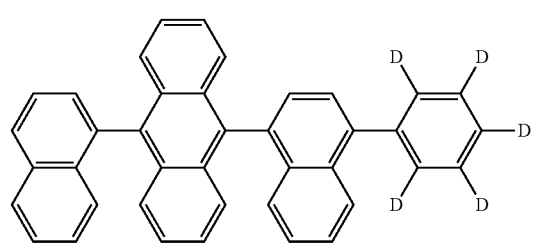
1-25
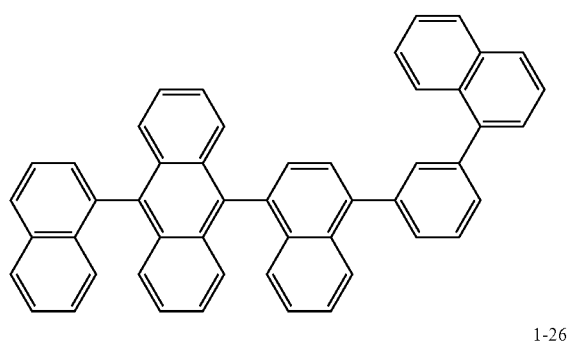
1-26
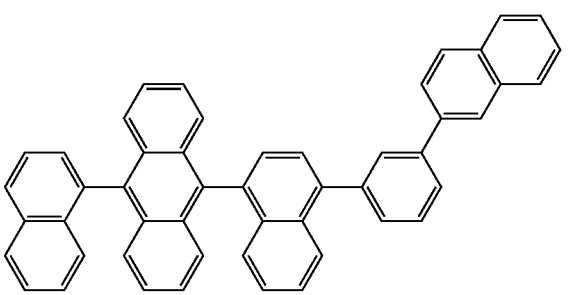
1-27
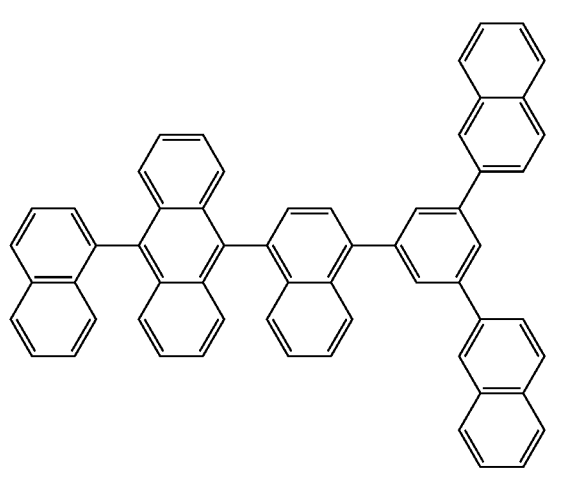
1-28
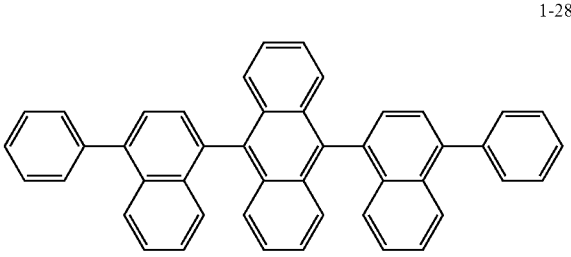

1-29
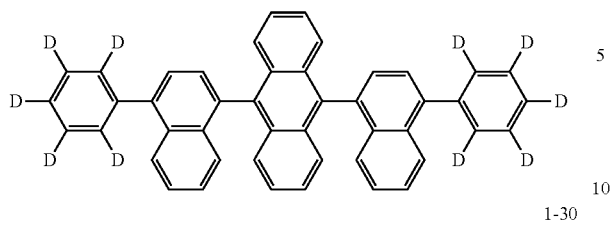
1-30
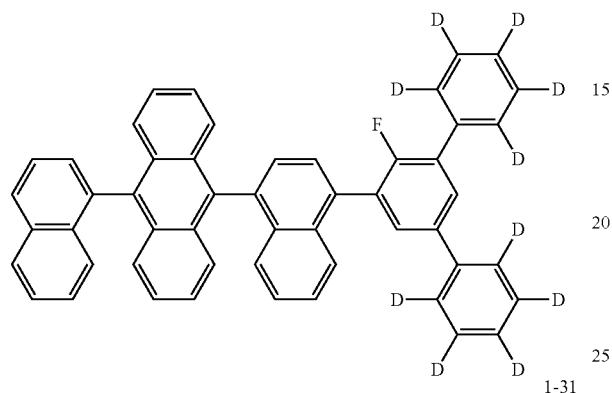
1-31
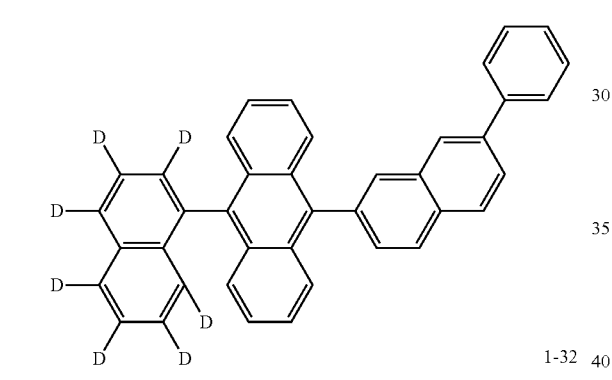
1-32
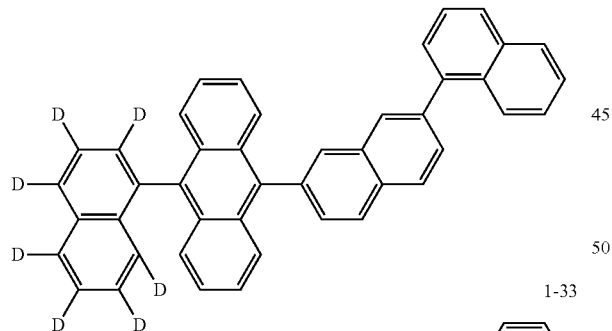
1-33
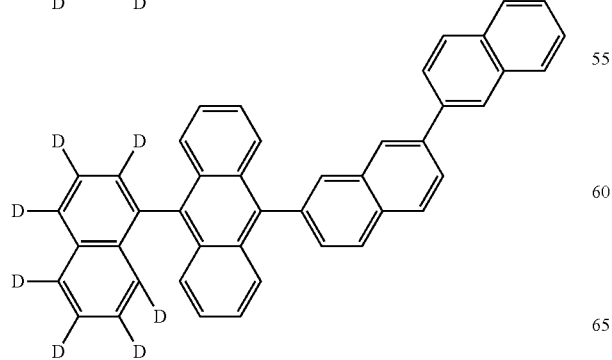
1-34
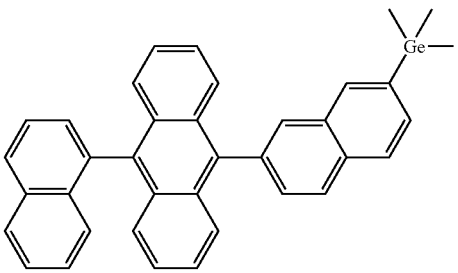
1-35
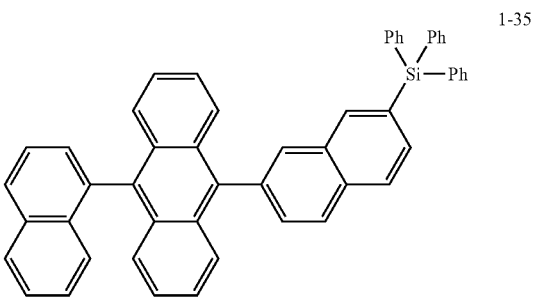
1-36
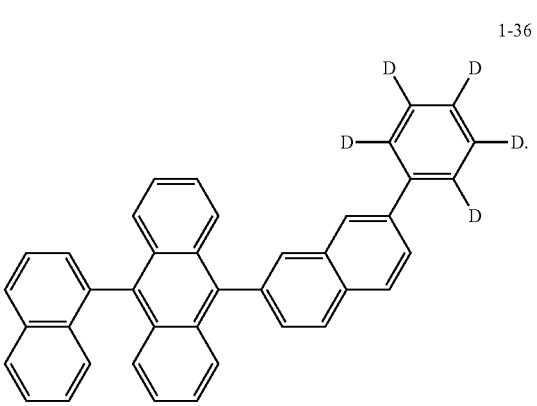
15. The organic light-emitting device as claimed in claim 1, wherein the second compound represented by Formula 2 is one of Compounds 2-1 to 2-5 below:
2-1
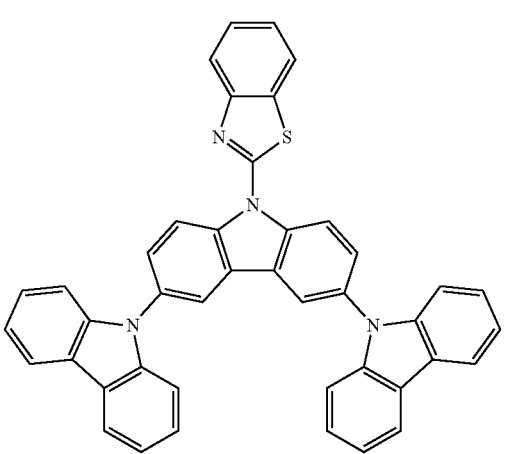

103
-continued

104
-continued

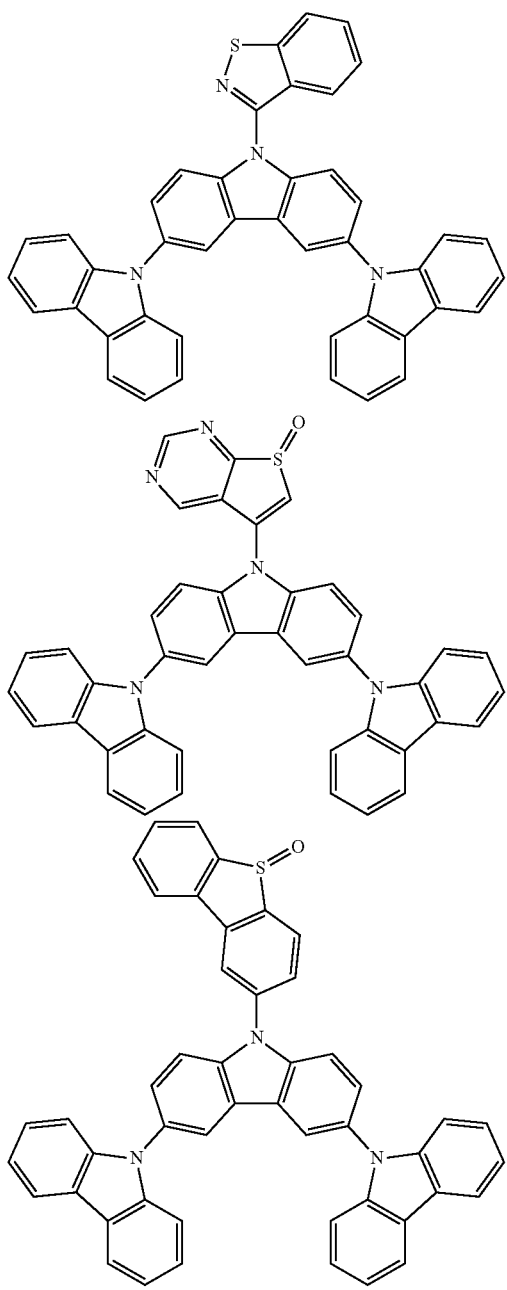

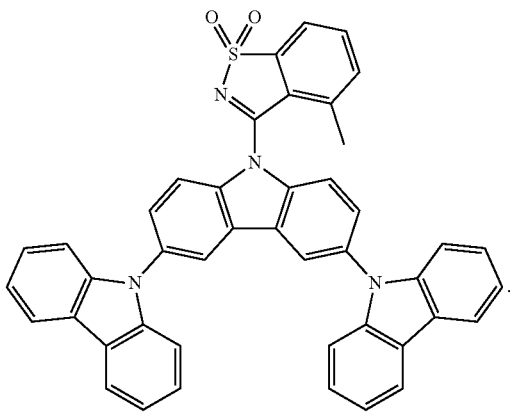

16. The organic light-emitting device as claimed in claim 1, wherein the first compound and the second compound are included in the emission layer.

17. The organic light-emitting device as claimed in claim 1, wherein a weight ratio of the first compound to the second compound is about 20:80 to about 80:20.

18. The organic light-emitting device as claimed in claim 17, wherein the emission layer further includes a dopant, the dopant including an organometallic compound that includes iridium (Ir), platinum (Pt), osmium (Os), titanium (Ti), zirconium (Zr), hafnium (Hf), europium (Eu), terbium (Tb), thulium (Tm), rhodium (Rh), or copper (Cu).

19. The organic light-emitting device as claimed in claim 1, further comprising a hole transport region between the first electrode and the emission layer.

20. The organic light-emitting device as claimed in claim 1, further comprising an electron transport region between the second electrode and the emission layer.

* * * * *